(12) United States Patent
Mueller

(10) Patent No.: US 7,728,579 B2
(45) Date of Patent: Jun. 1, 2010

(54) TEST HEAD POSITIONING SYSTEM AND METHOD

(75) Inventor: Christian Mueller, Rosenheim (DE)

(73) Assignee: inTEST Corporation, Cherry Hill, NJ (US)

( * ) Notice: Subject to any disclaimer, the term of this patent is extended or adjusted under 35 U.S.C. 154(b) by 213 days.

(21) Appl. No.: 11/749,988

(22) Filed: May 17, 2007

(65) Prior Publication Data
US 2008/0122432 A1    May 29, 2008

Related U.S. Application Data

(62) Division of application No. 10/813,362, filed on Mar. 30, 2004, now Pat. No. 7,235,964.

(60) Provisional application No. 60/459,019, filed on Mar. 31, 2003.

(51) Int. Cl.
G01R 31/00 (2006.01)
(52) U.S. Cl. .................................. 324/158.1
(58) Field of Classification Search ........................ None
See application file for complete search history.

(56) References Cited

U.S. PATENT DOCUMENTS

| 5,275,521 A | 1/1994 | Wada | |
| 5,440,943 A * | 8/1995 | Holt et al. | 74/89.23 |
| 5,791,632 A | 8/1998 | Brenes | |
| 5,931,048 A * | 8/1999 | Slocum et al. | 74/490.07 |
| 6,586,925 B2 | 7/2003 | Ramesh et al. | |
| 6,646,431 B1 * | 11/2003 | Parvez et al. | 324/158.1 |
| 6,722,215 B2 | 4/2004 | Caradonna et al. | |
| 6,828,774 B2 | 12/2004 | Bosy et al. | |
| 6,838,868 B1 * | 1/2005 | Bosy | 324/158.1 |
| 6,897,645 B2 | 5/2005 | bin Mohamed Hassan | |
| 2002/0063566 A1 | 5/2002 | Bruno et al. | |
| 2003/0077932 A1 | 4/2003 | Lewinnek | |
| 2003/0230155 A1 | 12/2003 | Caradonna et al. | |
| 2004/0051517 A1 * | 3/2004 | Holt et al. | 324/158.1 |
| 2006/0177298 A1 * | 8/2006 | Mueller | 414/791.2 |

FOREIGN PATENT DOCUMENTS

| DE | 2943864 A | 5/1980 |
| JP | 2001-266087 A | 9/2001 |
| WO | WO 02/25292 | 3/2002 |
| WO | WO 03/005045 | 1/2003 |

OTHER PUBLICATIONS

International Search Report corresponding to Application No. PCT/US2004/009774 dated Oct. 4, 2004.

* cited by examiner

*Primary Examiner*—Paresh Patel
(74) *Attorney, Agent, or Firm*—RatnerPrestia

(57) ABSTRACT

An apparatus for supporting a load includes pneumatic units and couplers coupled to opposite sides of the load. The couplers move the load parallel to a first axis responsive to actuation of the pneumatic units. At least one of the couplers rotate the load about a second axis orthogonal to the first axis. The load is compliant along the first axis and about the second axis At least one of the pneumatic units provides compliance along the first axis and about the second axis.

33 Claims, 45 Drawing Sheets

TEST HEAD POSITIONING SYSTEM AND METHOD

RELATED APPLICATIONS

This application is a Divisional of application Ser. No. 10/813,362, filed Mar. 30, 2004, which claims the benefit of 60/459,019, filed Mar. 31, 2003, all of which are incorporated by reference.

FIELD OF THE INVENTION

The present invention relates to systems for positioning and manipulating loads, and more particularly, to systems for positioning and manipulating test heads.

BACKGROUND OF THE INVENTION

In the manufacture of integrated circuits (ICs) and other electronic devices, testing with automatic test equipment (ATE) is performed at one or more stages of the overall process. Special handling apparatus is used which places the device to be tested into position for testing. In some cases, the special handling apparatus may also bring the device to be tested to the proper temperature and/or maintain it at the proper temperature as it is being tested. The special handling apparatus is of various types including "probers" for testing unpackaged devices on a wafer and "device handlers" for testing packaged parts; herein, "handling apparatus" or peripheral will be used to refer to all types of such peripheral apparatus. The electronic testing itself is provided by a large and expensive ATE system which includes a test head which is required to connect to and dock with the handling apparatus. The Device Under Test (DUT) requires precision, high-speed signals for effective testing; accordingly, the "test electronics" within the ATE which are used to test the DUT are typically located in the test head which must be positioned as close as possible to the DUT. The test head is extremely heavy, and as DUTs become increasingly complex with increasing numbers of electrical connections, the size and weight of test heads have grown from a few hundred pounds to presently as much as two or three thousand pounds. The test head is typically connected to the ATE's stationary mainframe by means of a cable, which provides conductive paths for signals, grounds, and electrical power. In addition, the test head may require coolant to be supplied to it by way of flexible tubing, which is often bundled within the cable.

In testing complex devices, hundreds or thousands of electrical connections have to be established between the test head and the DUT. These connections are accomplished with delicate, densely spaced contacts. In testing unpackaged devices on a wafer, the actual connection to the DUT is typically achieved with needle-like probes mounted on a probe card. In testing packaged devices, it is typical to use a test socket mounted on a "DUT board." In either case, the probe card or DUT board is usually fixed appropriately to the handling apparatus, which brings each of a number of DUTs in turn into position for testing. In either case the probe card or DUT board also provides connection points with which the test head can make corresponding electrical connections. The test head is typically equipped with an interface unit that includes contact elements to achieve the connections with the probe card or DUT board. Typically, the contact elements are spring loaded "pogo pins." Overall, the contacts are very fragile and delicate, and they must be protected from damage.

Test head manipulators may be used to maneuver the test head with respect to the handling apparatus. Such maneuvering may be over relatively substantial distances on the order of one meter or more. The goal is to be able to quickly change from one handling apparatus to another or to move the test head away from the present handling apparatus for service and/or for changing interface components. When the test head is held in a position with respect to the handling apparatus such that all of the connections between the test head and probe card or DUT board have been achieved, the test head is said to be "docked" to the handling apparatus. In order for successful docking to occur, the test head must be precisely positioned in six degrees of freedom with respect to a Cartesian coordinate system. Most often, a test head manipulator is used to maneuver the test head into a first position of coarse alignment within approximately a few centimeters of the docked position, and a "docking apparatus" is then used to achieve the final precise positioning. Typically, a portion of the docking apparatus is disposed on the test head and the rest of it is disposed on the handling apparatus. Because one test head may serve a number of handling apparatuses, it is usually preferred to put the more expensive portions of the docking apparatus on the test head. The docking apparatus may include an actuator mechanism which draws the two segments of the dock together, thus docking the test head; this is referred to as "actuator driven" docking. The docking apparatus, or "dock" has numerous important functions, including: (1) alignment of the test head with the handling apparatus, (2) pulling together, and later separating, the test head and the handling apparatus, (3) providing pre-alignment protection for electrical contacts, and (4) latching or holding the test head and the handling apparatus together.

According to the inTEST Handbook ($5^{th}$ Edition© 1996, inTEST Corporation), "Test head positioning" refers to the easy movement of a test head to a handling apparatus combined with the precise alignment to the handling apparatus required for successful docking and undocking. A test head manipulator may also be referred to as a test head positioner. A test head manipulator combined with an appropriate docking means performs test head positioning. This technology is described, for example, in the aforementioned inTEST Handbook. This technology is also described, for example, in U.S. Pat. Nos. 5,608,334, 5,450,766, 5,030,869, 4,893,074, 4,715, 574, and 4,589,815, which are all incorporated by reference for their teachings in the field of test head positioning systems. The foregoing patents relate primarily to actuator driven docking. Test head positioning systems are also known where a single apparatus provides both relatively large distance maneuvering of the test head and final precise docking. For example, U.S. Pat. No. 6,057,695, Holt et al., and U.S. Pat. Nos. 5,900,737 and 5,600,258, Graham et al., which are all incorporated by reference, describe a positioning system where docking is "manipulator driven" rather than actuator driven. However, actuator driven systems are the most widely used, and the present invention is directed towards them.

In the typical actuator driven positioning system, an operator controls the movement of the manipulator to maneuver the test head from one location to another. This may be accomplished manually by the operator exerting force directly on the test head in systems where the test head is fully balanced in its motion axes, or it may be accomplished through the use of actuators directly controlled by the operator. In several contemporary systems, the test head is maneuvered by a combination of direct manual force in some axes and by actuators in other axes.

In order to dock the test head with the handling apparatus, the operator must first maneuver the test head to a "ready to dock" position, which is close to and in approximate alignment with its final docked position. The test head is further maneuvered until it is in a "ready to actuate" position where the docking actuator can take over control of the test head's motion. The actuator can then draw the test head into its final, fully docked position. In doing so, various alignment features provide final alignment of the test head. A dock may use two or more sets of alignment features of different types to provide different stages of alignment, from initial to final. It is generally preferred that the test head be aligned in five degrees of freedom before the fragile electrical contacts make mechanical contact. The test head may then be urged along a straight line, which corresponds to the sixth degree of freedom, that is normal to the plane of the interface (typically the plane of the probe card or DUT board); and the contacts will make connection without any sideways scrubbing or forces which can be damaging to them.

As the docking actuator is operating, the test head is typically free to move compliantly in several if not all of its axes to allow final alignment and positioning. For manipulator axes which are appropriately balanced and not actuator driven, this is not a problem. However, actuator driven axes generally require that compliance mechanisms be built into them. Some typical examples are described in U.S. Pat. Nos. 5,931,048 to Slocum et al and 5,949,002 to Alden. Often compliance mechanisms, particularly for non-horizontal unbalanced axes, involve spring-like mechanisms, which in addition to compliance add a certain amount of resilience or "bounce back." Further, the cable connecting the test head with the ATE mainframe is also resilient. As the operator is attempting to maneuver the test head into approximate alignment and into a position where it can be captured by the docking mechanism, he or she must overcome the resilience of the system, which can often be difficult in the case of very large and heavy test heads. Also, if the operator releases the force applied to the test head before the docking mechanism is appropriately engaged, the resilience of the compliance mechanisms may cause the test head to move away from the dock. This is sometimes referred to as a bounce back effect.

U.S. Pat. No. 4,589,815, to Smith, discloses a prior art docking mechanism. The docking mechanism illustrated in FIGS. 5A, 5B, and 5C of the '815 patent uses two guide pin and hole combinations to provide final alignment and two circular cams. When the cams are rotated by handles attached to them, the two halves of the dock are pulled together with the guide pins becoming fully inserted into their mating holes. A wire cable links the two cams so that they rotate in synchronism. The cable arrangement enables the dock to be operated by applying force to just one or the other of the two handles. The handles are accordingly the docking actuator in this case.

The basic idea of the '815 dock has evolved as test heads have become larger into docks having three or four sets of guide pins and circular cams interconnected by cables. FIGS. 37a, 37b, 37c, and 37d of the present application illustrate a prior art dock having four guide-pin and hole combinations and four circular cams, which is described in more detail later. Although such four point docks have been constructed having an actuator handle attached to each of the four cams, the dock shown incorporates a single actuator handle that operates a cable driver. When the cable driver is rotated by the handle, the cable is moved so that the four cams rotate in a synchronized fashion. This arrangement places a single actuator handle in a convenient location for the operator. Also, greater mechanical advantage can be achieved by appropriately adjusting the ratio of the diameters of the cams to the diameter of the cable driver.

The docks described in U.S. Pat. Nos. 5,654,631 and 5,744,974 utilize guide pins and holes to align the two halves. However, the docks are actuated by vacuum devices, which urge the two halves together when vacuum is applied. The two halves remain locked together so long as the vacuum is maintained. However, the amount of force that can be generated by a vacuum device is limited to the atmospheric air pressure multiplied by the effective area. Thus, such docks are limited in their application.

Selected details of the construction and operation of the prior art dock illustrated in FIGS. 37a through 37d are herein described. This description includes aspects from an earlier docking apparatus described in U.S. Pat. No. 4,589,815, which is incorporated by reference.

FIG. 37a shows in perspective a test head 2100 held in a cradle 2190, which is in turn supported by a test head manipulator (not shown). Also shown is a cut away segment of a peripheral apparatus 2108 to which the test head 2100 may be docked. FIG. 37b shows peripheral handler 108 in somewhat larger scale and greater detail. (In this particular example the handler apparatus is a packaged device handler, and the test head is docked to it from below.) Briefly looking ahead to the sectional view in FIG. 37c, it is seen that the test head 2100 has electrical interface 2126, and the handler apparatus 2108 has a corresponding electrical interface 2128. Electrical interfaces 2126 and 2128 typically have hundreds or thousands of tiny, fragile electrical contacts (not shown) that must be precisely engaged in a manner to provide reliable corresponding individual electrical connections when the test head is finally docked. As is shown in this exemplary case, the lower surface of handler apparatus 2108 contains the handler electrical interface 2128, and the test head 2100 is docked with a generally upward motion from below. Other orientations are possible and known including, but not limited to: docking to a top surface with a downward motion, to a vertical plane surface with horizontal motion, and to a plane that is at an angle to both the horizontal and vertical.

Returning to FIGS. 37a and 37b, the complete four point docking apparatus is shown; portions of it are attached either to the handler apparatus 2108 or to the test head 2100. Attached to test head 2100 is faceplate 2106. Four guide pins 2112 are attached to and located near the four corners of faceplate 106. Face plate 106 has a central opening and is attached to test head 100 so that the test head electrical interface 2126 (not shown in FIGS. 37a and 37b) projects through the opening and guide pins 2112 define an approximate rectangle that has an approximate common center with electrical interface 2126.

Gusset plate 2114 is attached to the lower surface of the handler apparatus 2108. Gusset plate 2114 has a central opening and is attached to handler apparatus 2108 so that the handler electrical interface 2128 projects through the opening. Four gussets 2116 are attached to gusset plate 2114, one located near each of its four corners. Each gusset 2116 has a guide pin hole or receptacle 2112a bored in it. Each guide pin hole 2112a corresponds to a respective guide pin 2112. These are arranged so that when the test head is fully docked, each guide pin 2112 will be fully inserted into its respective guide pin hole 2112a. The fit of each guide pin 2112 in its corresponding hole 2112a is a close fit. Thus, the guide pins 2112 and guide pin holes 2112a provide alignment between the test head 2100 and the handler apparatus 2108.

Four docking cams 2110 are rotatably attached to the face plate 2106. Cams 2110 are circular and are similar to those described in the '815 patent. In particular each has a side helical groove 2129 around its circumference with an upper cutout 2125 on the upper face. Each docking cam 2110 is located in proximity to a respective guide pin 2112 such that it is generally centered on a line extending approximately from the center of the test head electrical interface 2126 through the respective guide pin 2112 such that guide pin 2112 lies between cam 2110 and the test head electrical interface 2126. The gussets 2116 and the corners of the gusset plate 2114 have circular cutouts such that when the guide pins 2112 are fully inserted into guide pin holes 2112*a* in the gussets, the circumference of each cam 2110 is adjacent to and concentric with the circular cutout in its respective gusset 2116. This arrangement provides an initial course alignment between the docking components as the test head 2100 is first maneuvered into position for docking with handler apparatus 2108. Initial coarse alignment may also be provided by the tapered ends of guide pins 2112 entering their respective receptacles 2112*a*. The gussets 2116, cams 2110, and guide pins 2112 are arranged so that handler electrical interface 2128 is kept separated from test head electrical interface 2126 (not shown in FIGS. 37A and 37B) until the guide pins 2112 are actually received in their respective guide pin holes 2112*a*. Thus, pre-alignment protection is provided to the electrical contacts.

Thus, two sets of alignment features are provided, namely: (1) the fit of gussets 2116 with respect to cams 2110, and (2) the guide pin 2112 and receptacle 2112*a* combinations.

A circular cable driver 2132 with an attached docking handle 2135 is also rotatably attached to face plate 2106. Docking cable 2115 is attached to each of the cams 2110, and to cable driver 2132. Pulleys 2137 appropriately direct the path of the cable to and from cable driver 2132. Cable driver 132 can be rotated by means of applying force to handle 2135. As cable driver 2132 rotates it transfers force to cable 2115 which in turn causes cams 2110 to rotate in synchronism.

Extending from the circular cutout of each gusset 2116 is a cam follower 2110*a*. Cam follower 2110*a* fits into the upper cutout on the upper face of its respective cam 2110. FIG. 37*c* shows in cross section one stage in the process of docking test head 2100 with handler apparatus 2108. Here guide pins 2112 are partially inserted into guide pin holes 2112*a* in gussets 2116. It is noted that in this exemplary case, guide pins 2112 are tapered near their distal ends and are of constant diameter nearer to their point of attachment to face plate 2106. In FIG. 37*c* guide pins 2112 have been inserted into guide pin holes 2112*a* to a point where the region of constant diameter is just entering the guide pin holes 2112*a*. Also in FIG. 37*c*, each cam follower 2110*a* has been inserted into the upper cutout 2125 on the upper face of its respective cam 2110 to a depth where it is at the uppermost end of the helical cam groove 2129. In this configuration, the dock is ready to be actuated by applying force to the handle 2135 (not shown in FIG. 37*c*) and rotating the cams 2110. Accordingly, this configuration may be referred to as the "ready to actuate" position. It is important to note that in this position, alignment in five degrees of freedom has been achieved. In particular, if the plane of the handler apparatus electrical interface 2126 is the X-Y plane of three dimensional interface, guide pins 2112 having their full diameter inserted into receptacles has established X, Y, and theta Z alignment. Furthermore, the insertion of cam followers 2110*a* fully into all cut outs 2125 has established planarization between the handler apparatus electrical interface 2126 and the test head electrical interface 2128.

FIG. 37*d* shows in cross section the result of fully rotating cams 2110. The test head 2100 is now "fully docked" with handler apparatus 2108. It is seen that cams 2110 have been rotated and have caused cam followers 2110*a* to follow the helical grooves 2129 to a point in closer proximity to faceplate 2106. In addition, guide pins 2112 are fully inserted into their respective guide pin holes 2112*a*. It is observed that the closeness of the fit between the constant diameter region of guide pins 2112 and the sides of the respective guide pin holes 2112*a* determines the final alignment between the handler electrical interface 2128 and the test head electrical interface 2126. Accordingly, a close fit is generally required to provide repeatability of docked position within three to seven thousandths of an inch. Furthermore, the guide pins 2112 must be precisely placed on face plate 2106 with respect to the gussets once gusset plate 2114 has been attached to handler apparatus 2108. To facilitate this, the guide pins 2112 may be attached in a manner that allows their position to be adjusted. A manner of doing this which is widely practiced is described in the '815 patent.

In light of the foregoing discussion, it is now appropriate to more fully discuss the docking process and define certain terms. The purpose of docking is to precisely mate the test head electrical interface 2126 with the handler apparatus electrical interface 2128. Each electrical interface 2126 and 2128 defines a plane, which is typically, but not necessarily, nominally parallel with the distal ends of the electrical contacts. When docked these two planes must be parallel with one another. In order to prevent damage to the electrical contacts, it is preferred to first align the two interfaces 2126 and 2128 in five degrees of freedom prior to allowing the electrical contacts to come into mechanical contact with one another. If in the docked position the defined planes of the interfaces are parallel with the X-Y plane of a three dimensional Cartesian coordinate system, alignment must occur in the X and Y axes and rotation about the Z axis (Theta Z), which is perpendicular to the X-Y plane, in order for the respective contacts to line up with one another. Additionally, the two planes are made parallel by rotational motions about the X and Y axes. The process of making the two electrical interface planes parallel with one another is called "planarization" of the interfaces; and when it has been accomplished, the interfaces are said to be "planarized" or "co-planar." Once planarized and aligned in X, Y and Theta Z, docking proceeds by causing motion in the Z direction perpendicular to the plane of the handler electrical interface 2128. In the process of docking, test head 2100 is first maneuvered into proximity of the handler 2108. Further maneuvering brings the circular cutouts of the gussets 2116 into a first alignment with the cams 2110. This position, or one just prior to it, may be considered to be a "ready to dock" position. More generally, "ready to dock" refers to a position where some first coarse alignment means is approximately in position to be engaged. At this stage and depending upon design details, the distal end of the guide pins are ready to enter their respective guide receptacles. Still further maneuvering will bring the test head to a "ready to actuate position," which was defined previously in terms of FIGS. 37A through 37D. More generally, "ready to actuate" refers to a position where a test head has achieved a position where a docking apparatus may be actuated. At the ready to actuate position, approximate planarization and alignment in X, Y and Theta Z have been achieved. As the dock is actuated and the guide pins 2112 become more fully inserted into their respective guide-pin holes 2112*a*, alignment and planarization become more precise. It is noted that in manipulator driven docking, as described in the '258 and '737 patents, sensors detect the equivalent of a ready to actuate position in order to change from a coarse positioning mode to a fine positioning mode. Thus, to one of ordinary skill in the art, sensing a ready to actuate position in an actuator driven dock would be a natural extension (intuitive and obvious) of what is taught and disclosed by the '258 and '737 patents.

Docks of the type described above have been used successfully with test heads weighing up to and over one thousand pounds. However, as test heads have become even larger and as the number of contacts has increased, a number of problems have become apparent. First, the force required to engage the contacts increases as the number of contacts increases. Typically a few ounces per contact is required; thus docking a test head having 1000 or more contacts requires in excess of 50 or 100 kilograms for this purpose. With test heads occupying a volume of a cubic yard or more it becomes increasingly difficult for the operators to observe all of the gussets and cams to determine when the test head is in a ready to dock and the ready to actuate positions. Also due to the resiliency of the compliance mechanisms and cable in the test head manipulator, the bounce back effect has made it difficult to maintain the test head in the ready to actuate position while simultaneously initiating the actuation. A further difficulty that arises from the increased amount of force to be overcome by the actuation mechanism is that the cam motion can become unsynchronized due to the stretching of the cable. A similar problem of mechanism distortion is known in docks using solid links and bell cranks.

Docking apparatus such as described above may be characterized by the number of guide pins and receptacles used. The apparatus described in the '815 patent is characterized as a two-point dock, and the apparatus shown in FIGS. 37A through 37D is known as a four point dock. Three point docks following the same general principles are also known and in common use, and the present invention will be described in terms of a three-point configuration. However, this does not limit its application to other configurations.

SUMMARY OF THE INVENTION

An apparatus for supporting a load includes pneumatic units and couplers coupled to opposite sides of the load. The couplers move the load parallel to a first axis responsive to actuation of the pneumatic units. At least one of the couplers rotates the load about a second axis orthogonal to the first axis. The load is compliant along the first axis and about the second axis At least one of the pneumatic units provides compliance along the first axis and about the second axis.

BRIEF DESCRIPTION OF THE DRAWINGS

FIG. 14b is a schematic diagram illustrating a pressure regulation system used with the pneumatic cylinders of FIGS. 13 and 14a.

DETAILED DESCRIPTION OF THE INVENTION

Figure 1:
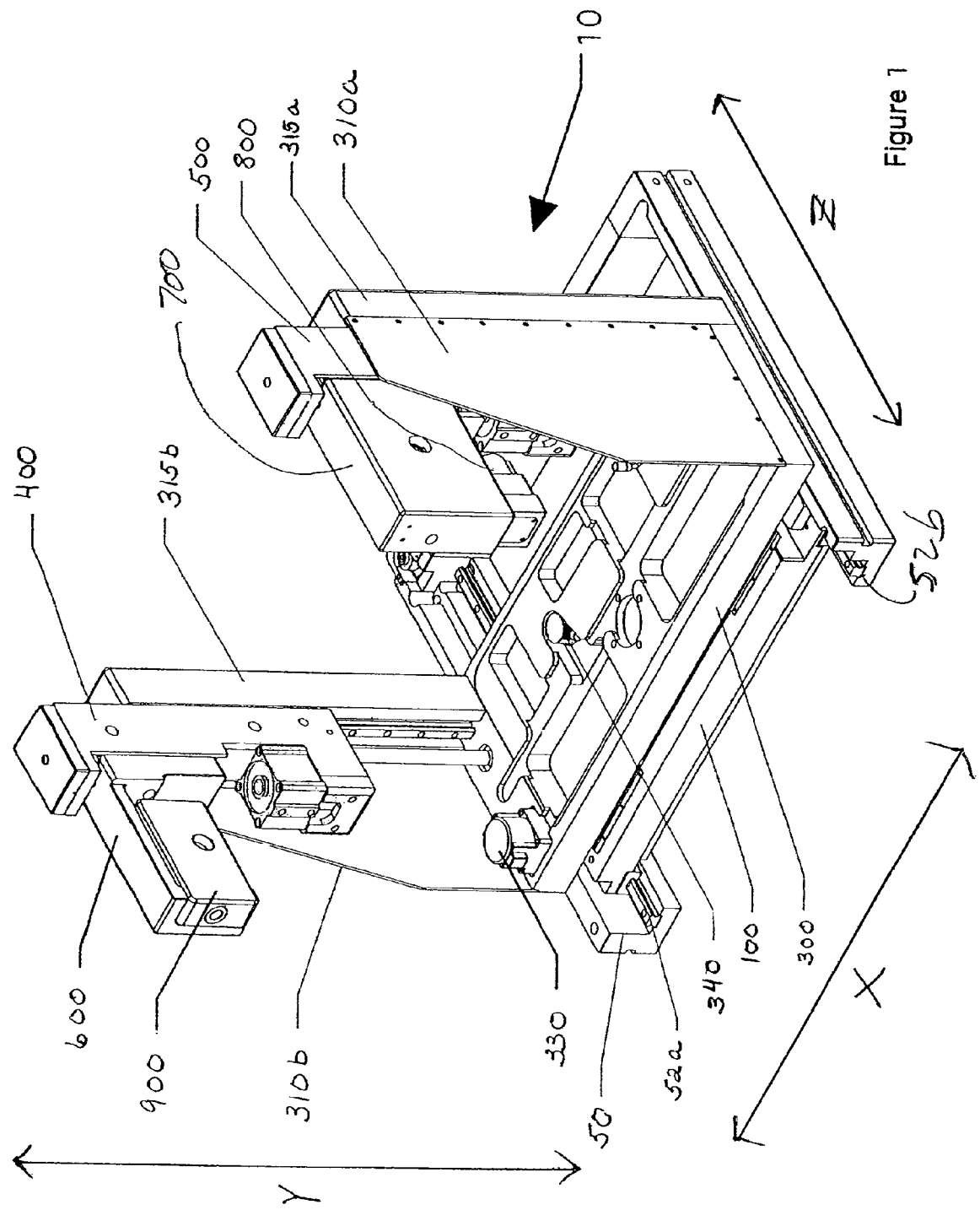
FIG. 1 is a perspective view which shows a positioner system according to an exemplary embodiment of the present invention.
Figure 2:
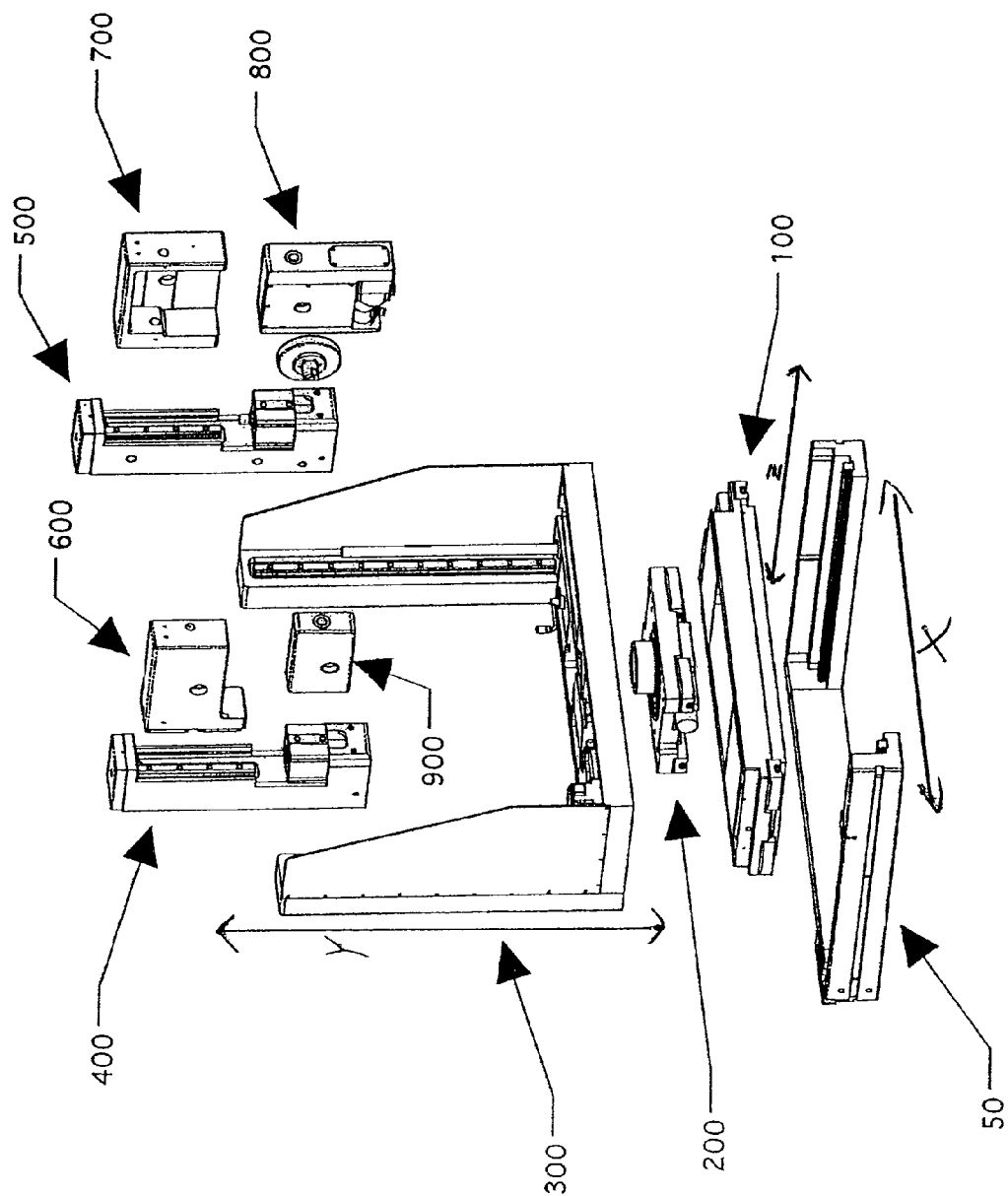
FIG. 2 is an exploded view of the positioner system shown in FIG. 1.

FIG. 1 is a perspective drawing of a positioner system 10 according to an exemplary embodiment of the present invention. A positioner system 10 is used for holding and moving a heavy load such as a test head which is more fully described in U.S. Pat. No. 4,527,942, which is incorporated by reference. As shown in that patent, FIG. 6, six degrees of motion freedom are defined. The positioner system 10 in accordance with an exemplary embodiment of the present invention accomplishes these six degrees of motion freedom. FIG. 2 is an exploded view of the positioner system shown in FIG. 1. As shown, at the bottom of FIG. 2, base 50 is included. In-out unit 100 rides on base 50, which rests upon the floor. As is implied by its name, in-out unit 100 is capable of sliding, parallel with the floor along the Z axis, in an in direction (i.e. away from the rear face of in-out unit 100 and towards its opening), and in an out direction (i.e., towards the rear face of in-out unit 100). The in direction is usually taken to be the direction towards a docked position with a peripheral, and the out direction as away from the peripheral.

Side-to-side unit 200 slides along the X axis on in-out unit 100, also parallel with the floor. The motion of side-to-side unit 200 is orthogonal to that of in-out unit 100.

Swing unit 300 is situated on side-to-side unit 200. Swing unit 300 pivots about a Y axis which is mutually orthogonal to the axes along which side-to-side unit 200 moves and in-out unit 100 moves. This is also referred to as twisting, swing, or yaw motion. Main arm units 400, 500 slide along a Y axis upward and downward along linear rails which are vertically disposed in swing unit 300. To provide vernier Y motion, vernier arm 600 is able to move upward and downward along a linear guide rail vertically disposed in main arm 400. Furthermore, vernier arm 700 moves upward and downward along a linear rail vertically disposed with relationship to main arm 500. Vernier Y motion is a relatively small amount of motion (e.g. one or two inches) which is provided for final fine-tuning of the Y position. This motion may be a floating motion which is accomplished by air pressure. Tumble pivot unit 900 is coupled to vernier arm 600. Tumble drive unit 800 is coupled to vernier arm 700. The test head rotates (i.e. with tumbling or pitch motion) about an X axis which extends through tumble drive unit 800 and tumble pivot unit 900. This axis may be arranged so that it passes through the center of gravity of the load in order to allow the test head to pivot with a minimal amount of applied force.

Figure 3:
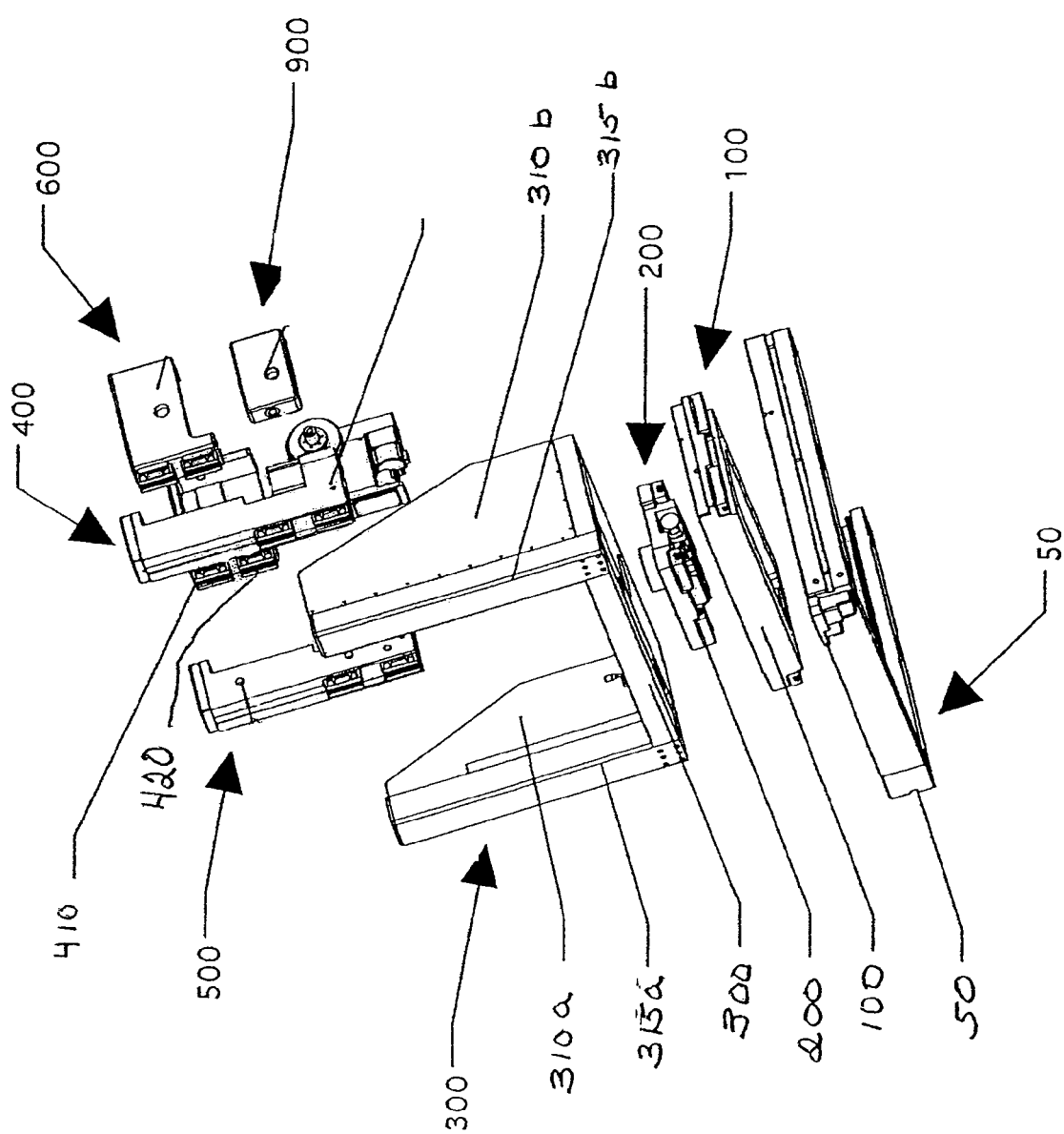
FIG. 3 is a further exploded view of the positioner system shown in FIG. 1.

FIG. 3 is a further perspective view of the various components which comprise positioner system 10.

Figure 4:
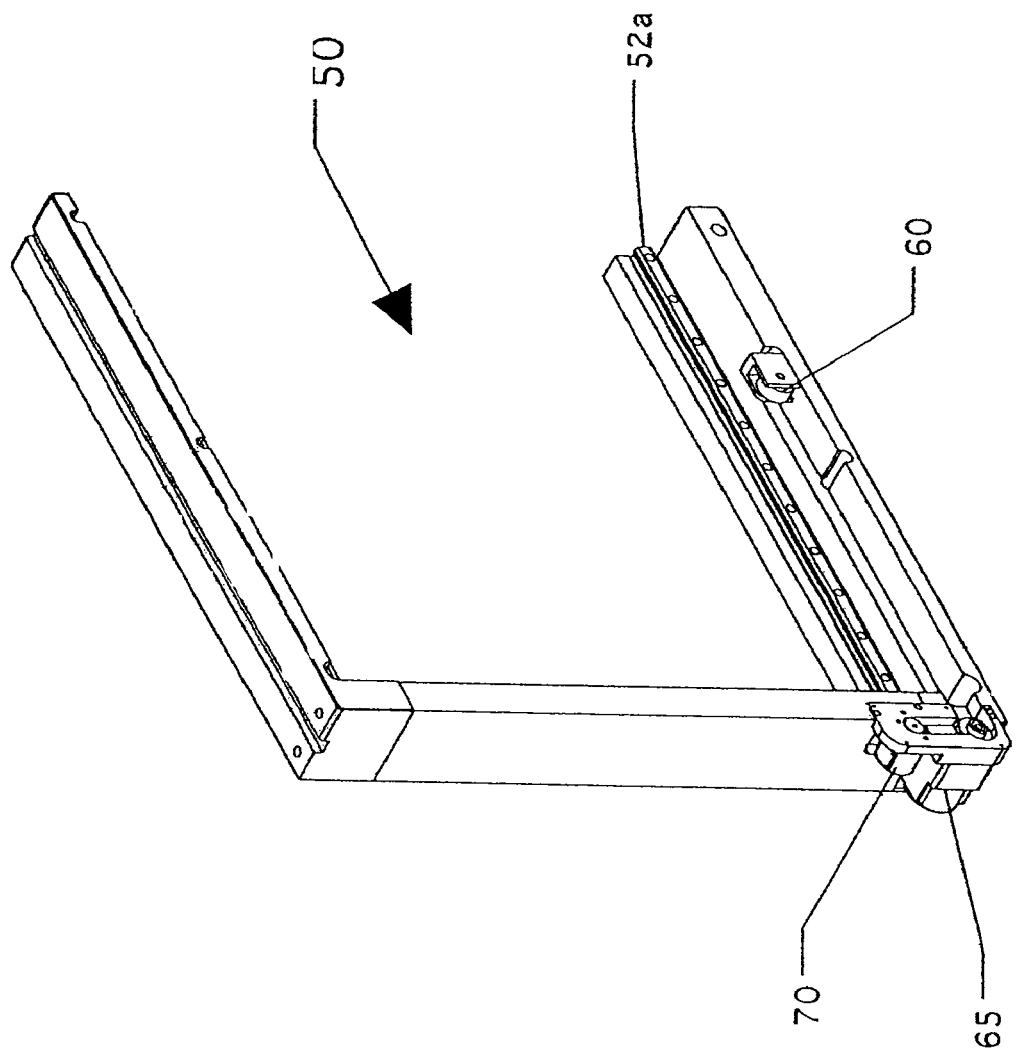
FIG. 4 is a perspective view of the base of the positioner system shown in FIG. 1.
Figure 5:
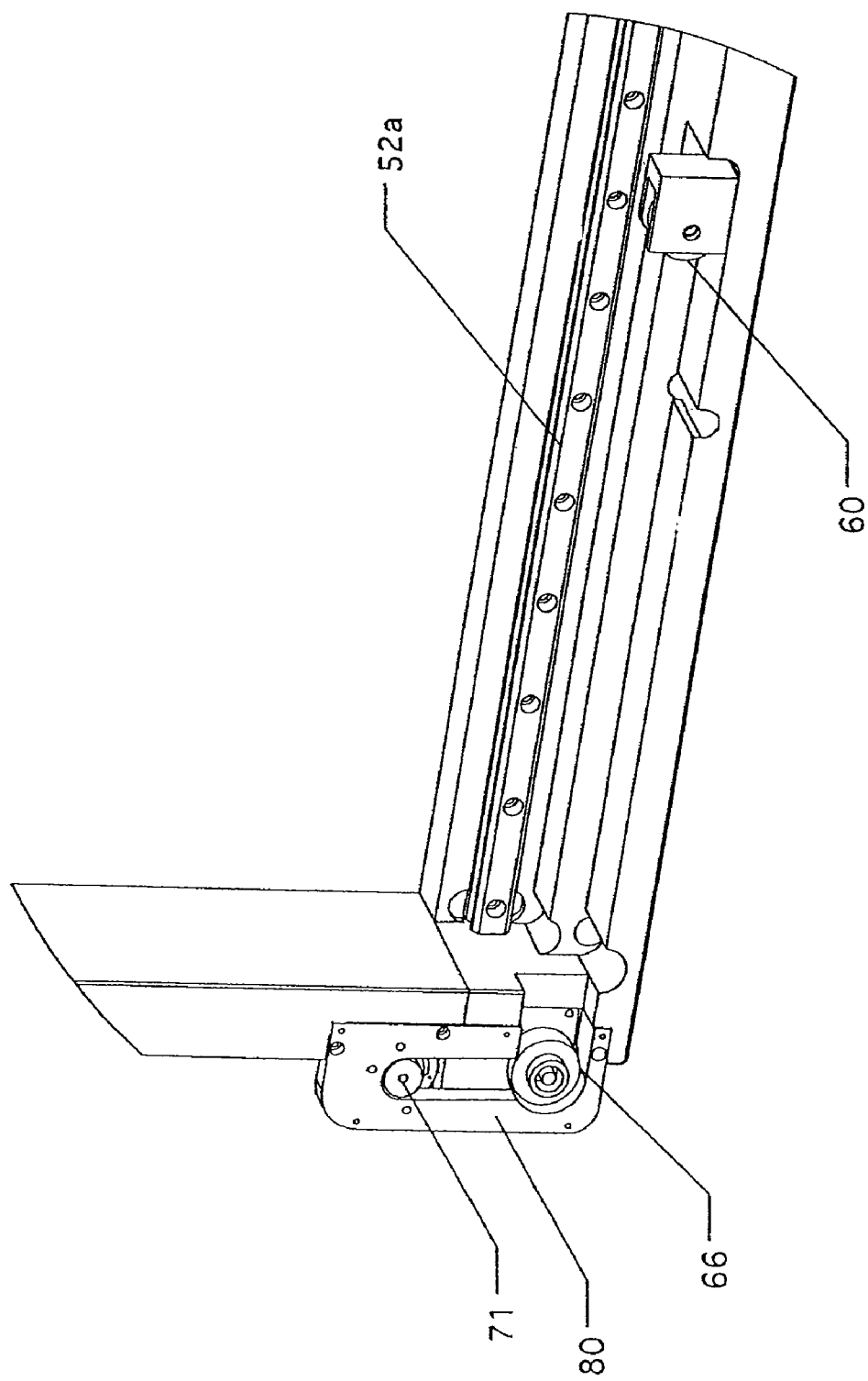
FIG. 5 is a further perspective view showing an enlarged portion of the base illustrated in FIG. 4.

Base 50 is more clearly described with reference to FIG. 4. As shown, base 50 includes linear guide rail 52a and linear guide rail 52b (not visible in FIG. 4). In-out drive motor 65 and in-out position encoder 70 are included in the base assembly. Motor 65 may include appropriate speed reduction gears. Motor 65 may also include a brake unit to lock it in a stopped position when desired. As is more clearly shown by FIG. 5, motor pulleys 66 are attached to the shaft of in-out motor 65 in a conventional manner. Position encoder 70 (not visible in FIG. 5) is coupled to bracket 80 which in turn is coupled to base 50. Encoder pulley 71 is attached to the shaft of encoder 70 in a conventional manner.

Two timing belts (not shown) are also included. The first belt couples one of motor pulleys 66 to pulley 60 so that pulley 60 rotates as the motor rotates. This first belt is disposed generally parallel to linear guide rails 52a,b. The second belt couples the other of the motor pulleys 66 to encoder pulley 71 so that the encoder rotates as the motor rotates.

Figure 6:
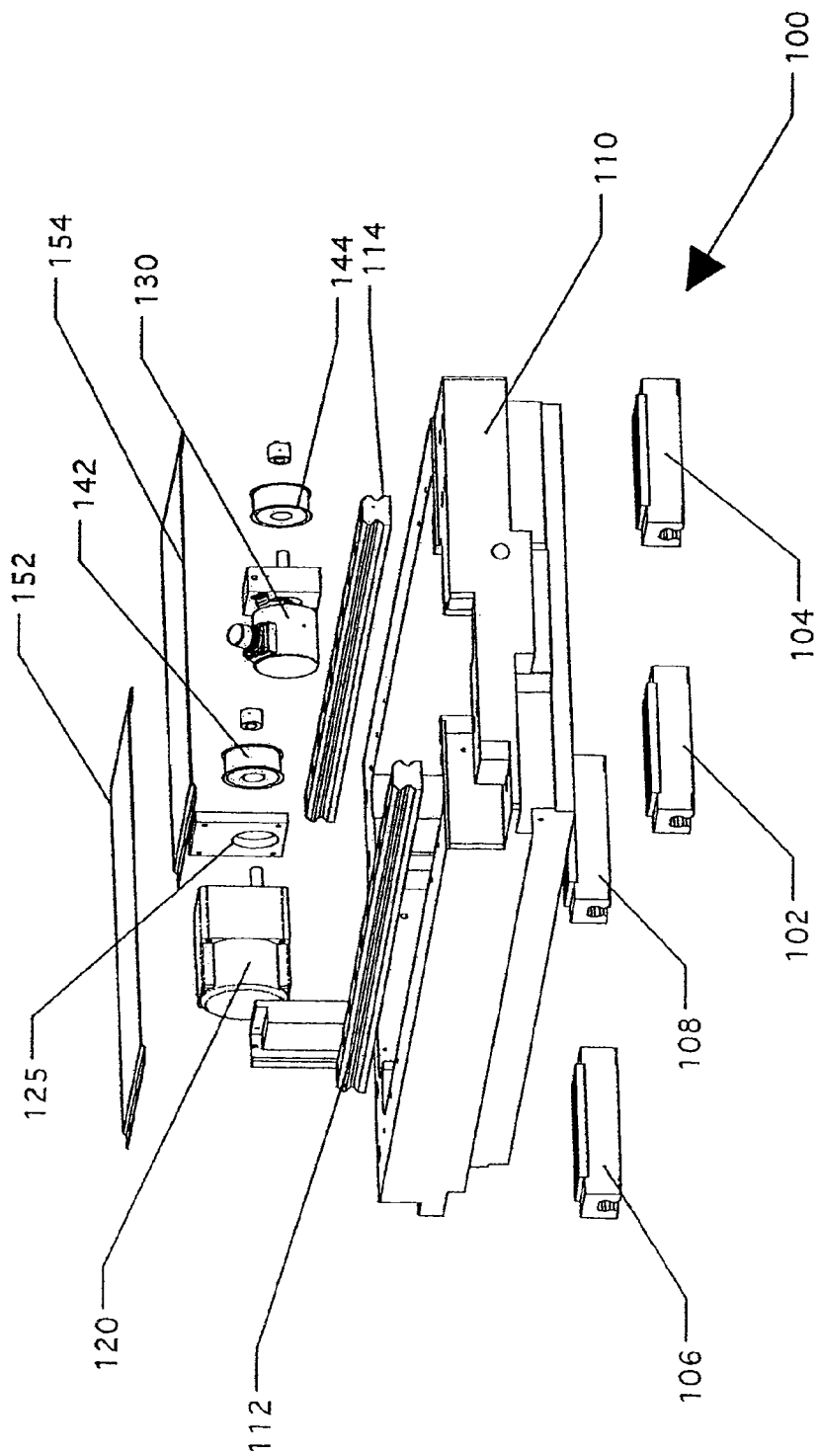
FIG. 6 is an exploded view of the in-out unit of the exemplary positioner system.
Figure 7:
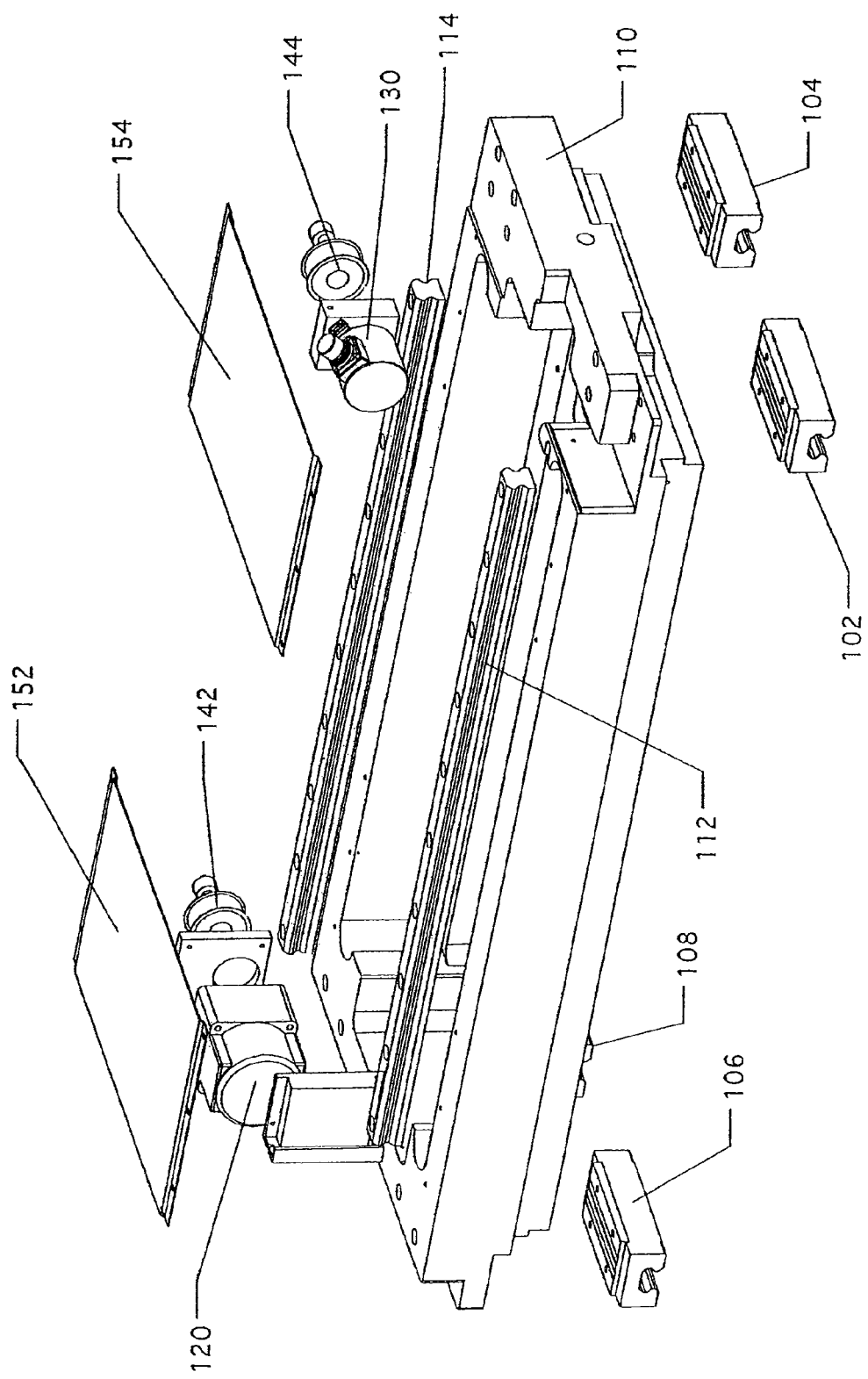
FIG. 7 is a further exploded view of the in-out unit shown in FIG. 6.

The details of in-out unit 100 are more clearly shown with reference to FIGS. 6 and 7. Linear guide bearings 102, 104, 106 and 108 are attached to the underside of in-out substrate 110. Linear guide bearings 102, 104 move along linear guide rail 52a. Furthermore, linear guide bearings 106, 108 slide along linear guide rail 52b.

In-out unit 100 is able to move in an in-and-out direction when motor 65 is actuated. More specifically, when motor 65 is actuated, the belts (not shown in FIG. 4 or in FIG. 5) start to move. The belt coupling motor pulley 66 to pulley 60 is attached to in-out unit 100 at a convenient point. Thus, as the belt moves, in-out unit 100 is driven in an inwards or outwards direction according to the direction of rotation of motor 65. Should motor 65 include a brake unit, it may be used to lock the in-out unit in a fixed position relative to base 50 when desired.

Also as shown in FIGS. 6 and 7, linear guide rails 112, 114 are affixed to the top of in-out substrate 110 so as to be orthogonal to linear guide rails 52a,b attached to base 50. Side-to-side drive motor 120 is also included. Adjacent to motor 120 is motor bracket 125, and pulley 142. Motor 120 may include appropriate speed reduction gears. Motor 120 may also include a brake unit to lock it in a stopped position when desired. Side-to-side position encoder 130 is also included. Pulley 144 is affixed to position encoder 130. A belt (not shown) couples pulley 142 to pulley 144. The belt is generally disposed parallel to rails 112 and 114. Thus, encoder 130 will be rotated as motor 120 rotates. Covers 152 and 154 are also included.

Figure 8:
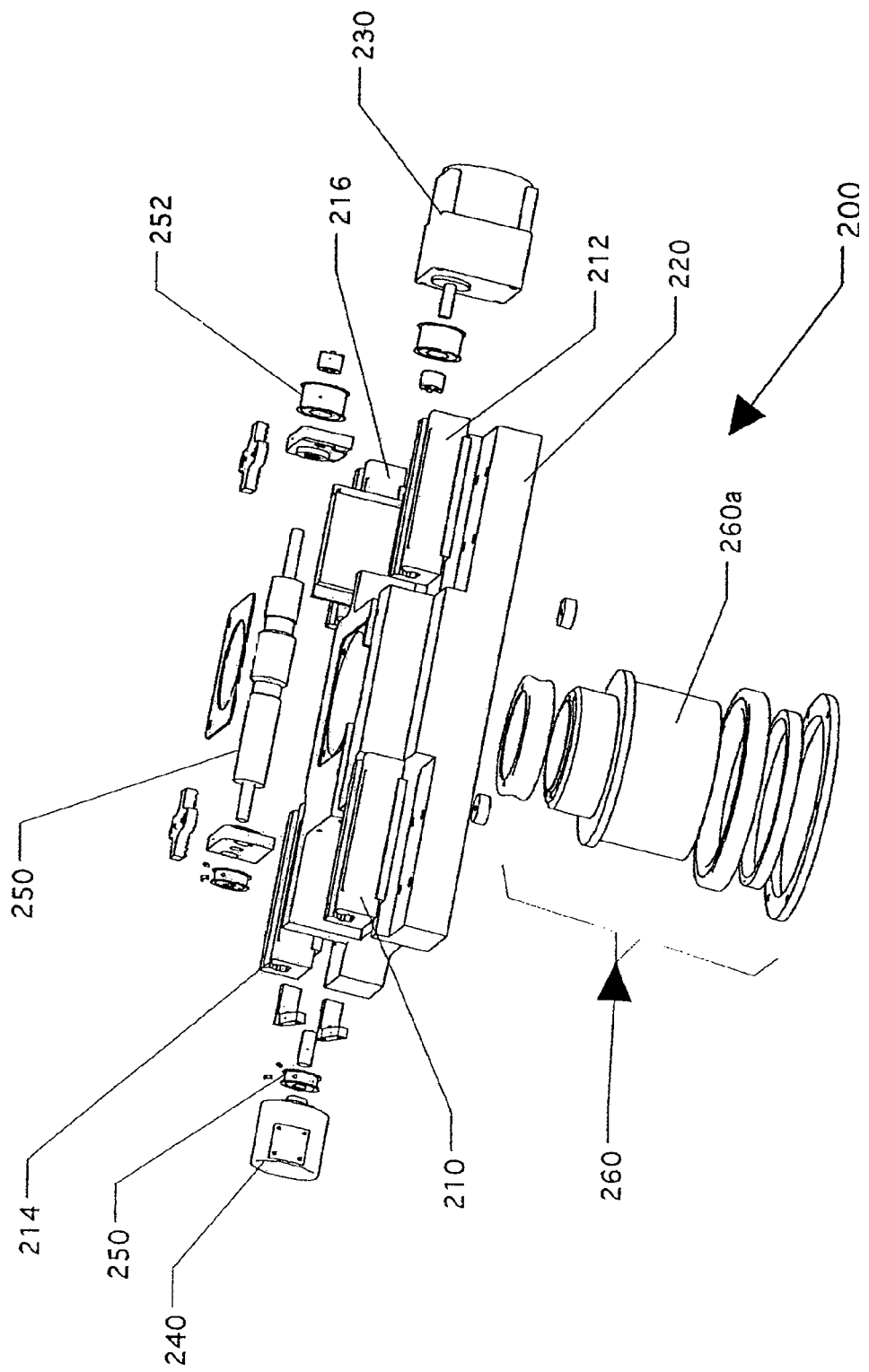
FIG. 8 is an exploded view of the side-to-side unit of the exemplary positioner system.
Figure 9:
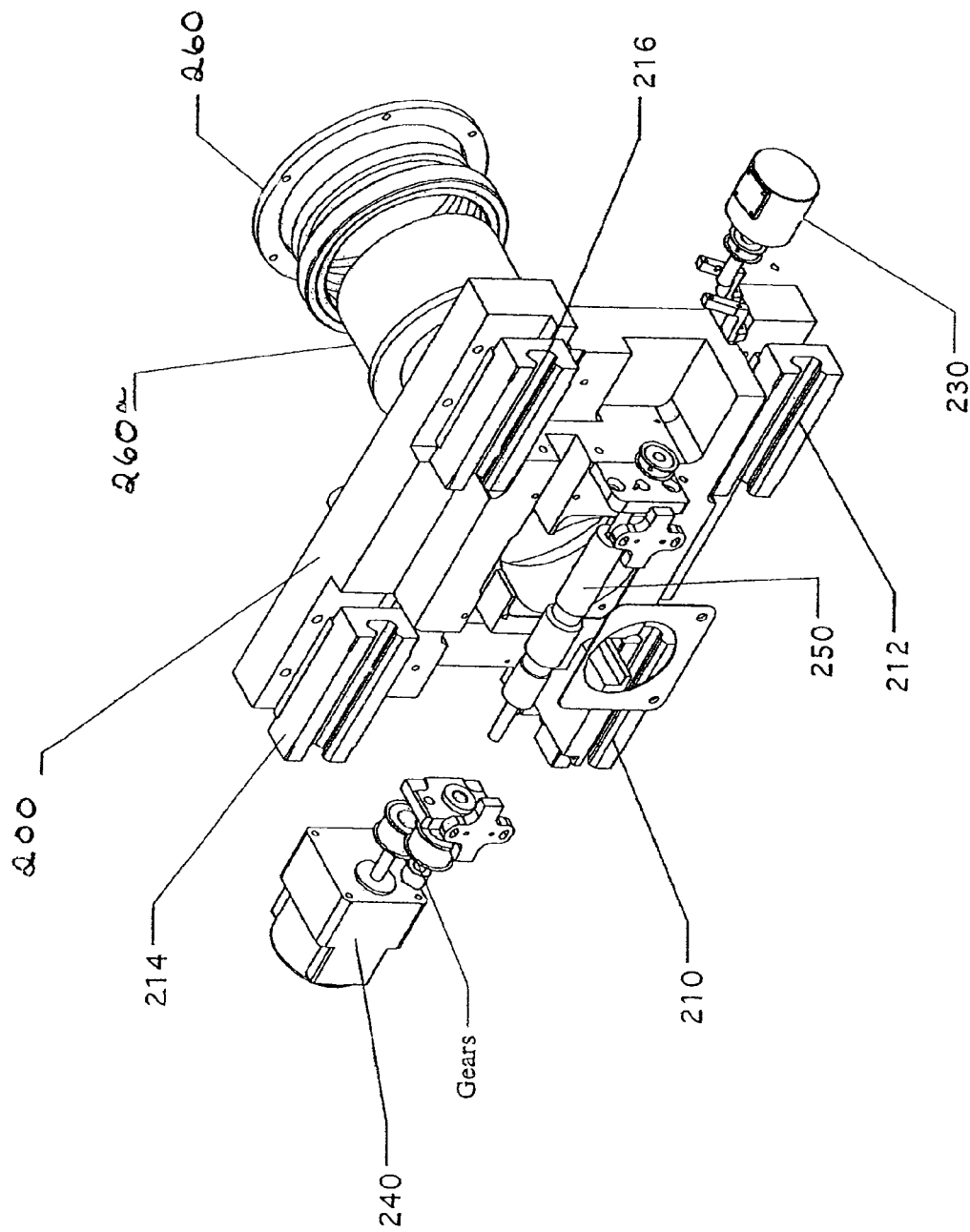
FIG. 9 is a partially exploded view of the side-to-side unit shown in FIG. 8, but from a different perspective than that shown in FIG. 8.
Figure 10:
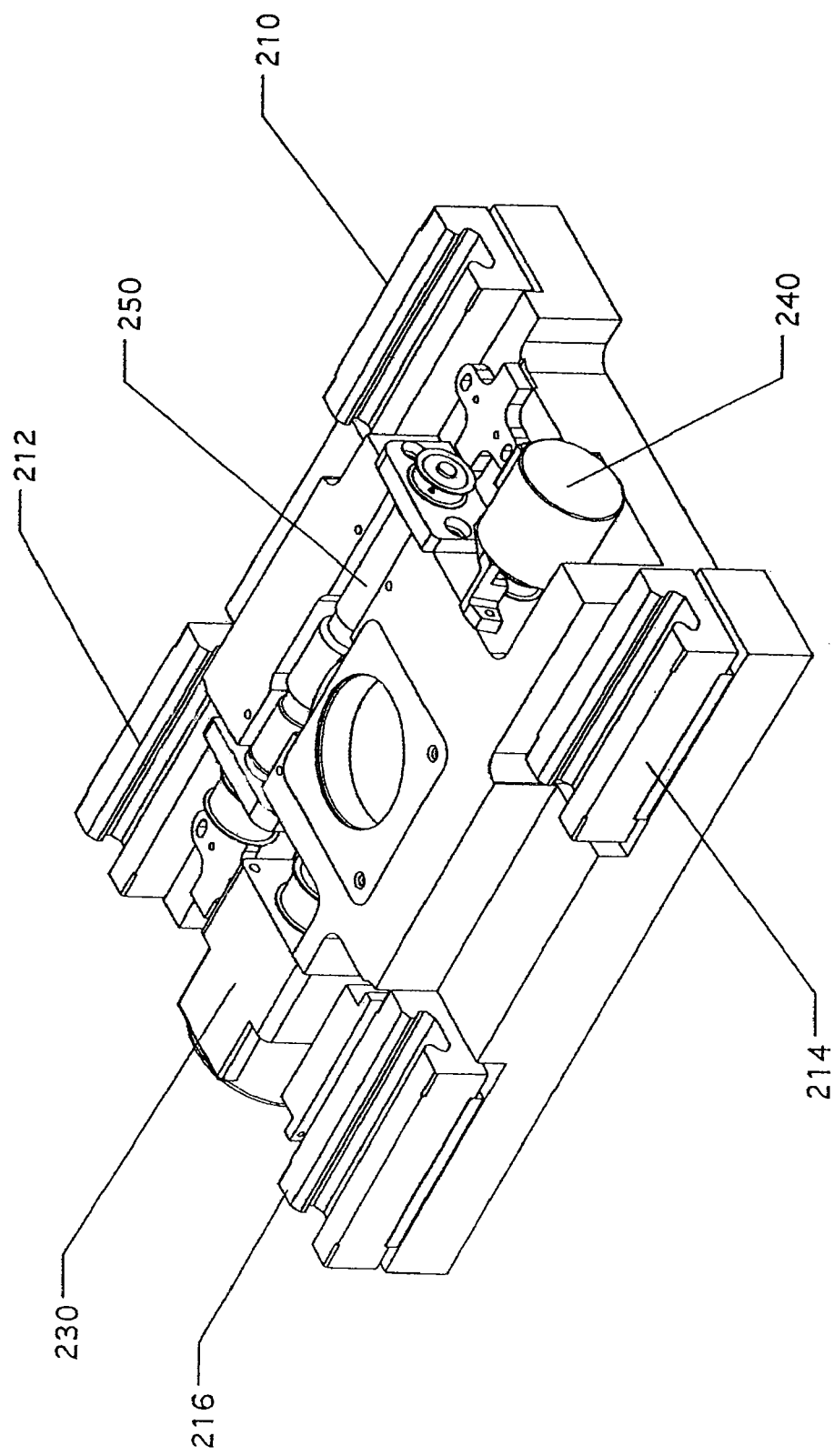
FIG. 10 is a further perspective view of the side-to-side unit.

Turning now to FIGS. 8, 9 and 10, the features of side-to-side unit 200 will now be described. As is more clearly shown in FIG. 10, which shows its underside, side-to-side unit includes linear guide bearings 210, 212, 214 and 216. Linear guide bearings 214, 216 slide along linear guide rail 114 while linear guide bearings 210, 212 slide along linear rail 112. Recall that guide rails 112 and 114 are respectively attached to in-out substrate 110. Side-to-side substrate 220 includes an opening through which swing plate mounting assembly 260 is situated. Swing plate mounting assembly 260 includes a drive link 260a along with a plurality of seals and rings. Swing drive motor 230 is included, which may include appropriate speed reduction gears. Motor 230 may also include a brake unit to lock it in a stopped position when desired. Drive shaft 250 is coupled to pulley 254. Pulley 254 is coupled to pulley 256 by means of a belt (not shown). Pulley 256 is attached to position encoder 240. As an alternative position encoder 240 could be coupled to drive shaft 250 by means of gears.

The rotation axis of drive shaft 250 is generally horizontal and at right angles to the generally vertical rotation axis of swing plate mounting assembly 260. The two are engaged with one another through appropriate gearing, such as a spiral gear drive or a worm gear drive, so that as shaft 250 is rotated, mounting assembly 260 is caused to rotate at right angles to it. Compliance may be achieved by a slight separation between drive shaft 250 and swing plate mounting assembly 260.

Movement of side-to-side unit 200 relative to base 100 is now described. The belt, which couples pulleys 142 and 144 (FIG. 6), may be attached to side-to-side substrate 220 at a convenient point. Thus as side-to-side drive motor 120 is operated the belt coupling pulleys 142 and 144 moves, causing side-to-side unit 200 to accordingly move. If motor 120 is equipped with a brake unit, then the brake unit may be used to lock the side-to-side unit 200 in position relative to in-out unit 100 when desired.

Figure 11A:
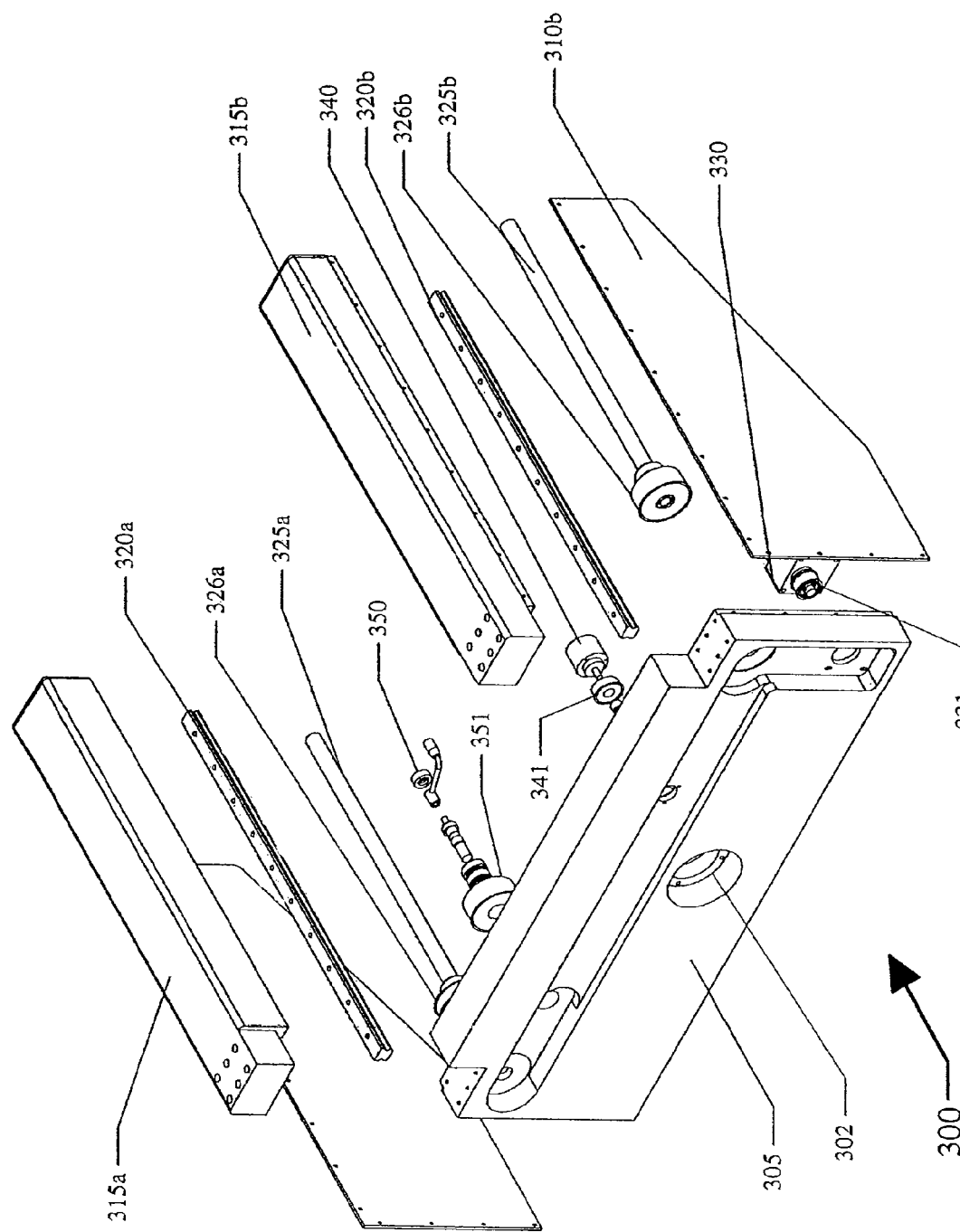
FIG. 11a is an exploded view of the swing unit of the exemplary positioner system.
Figure 11B:
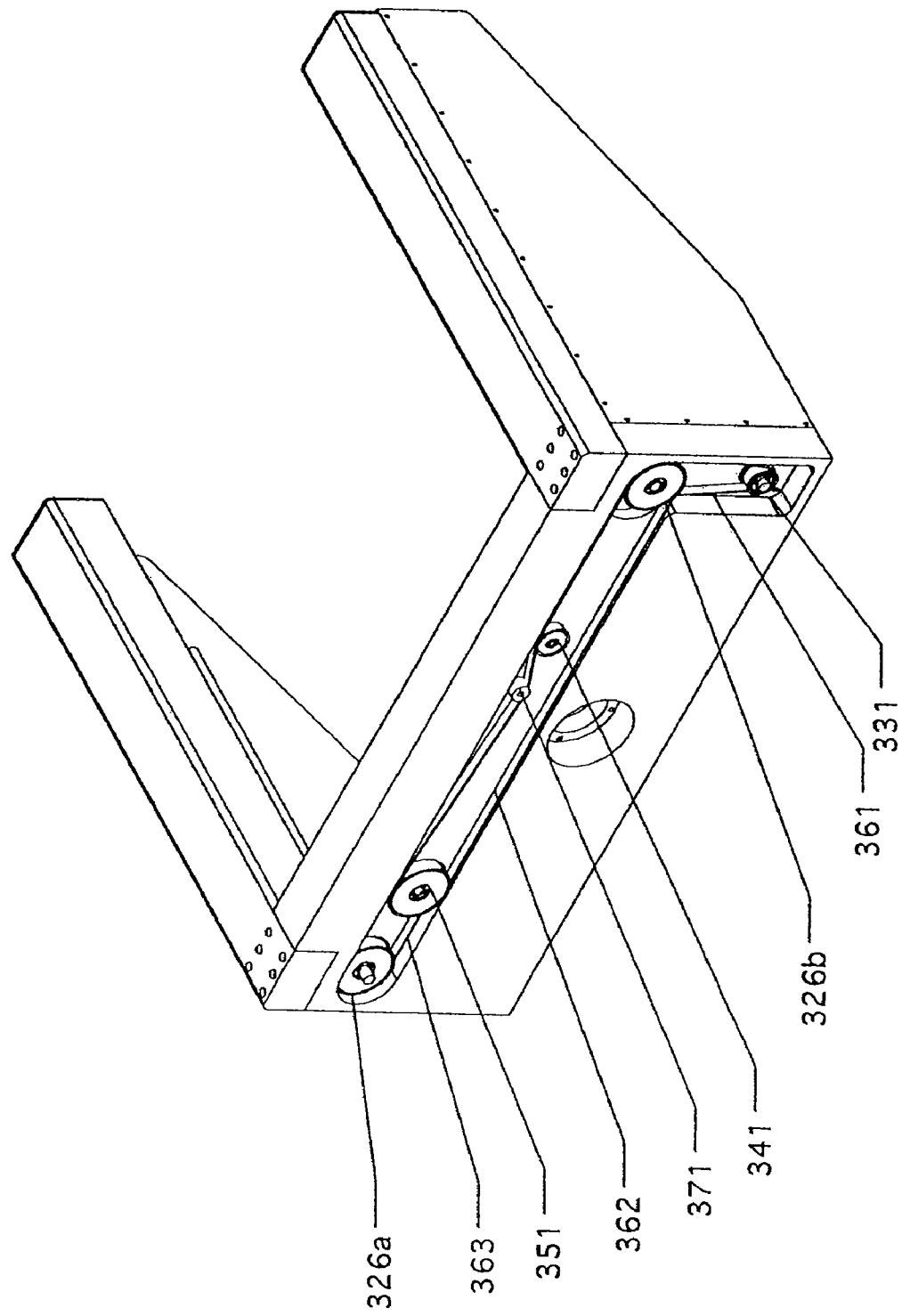
FIG. 11b is a perspective view of the swing unit with belts shown.
Figure 12:
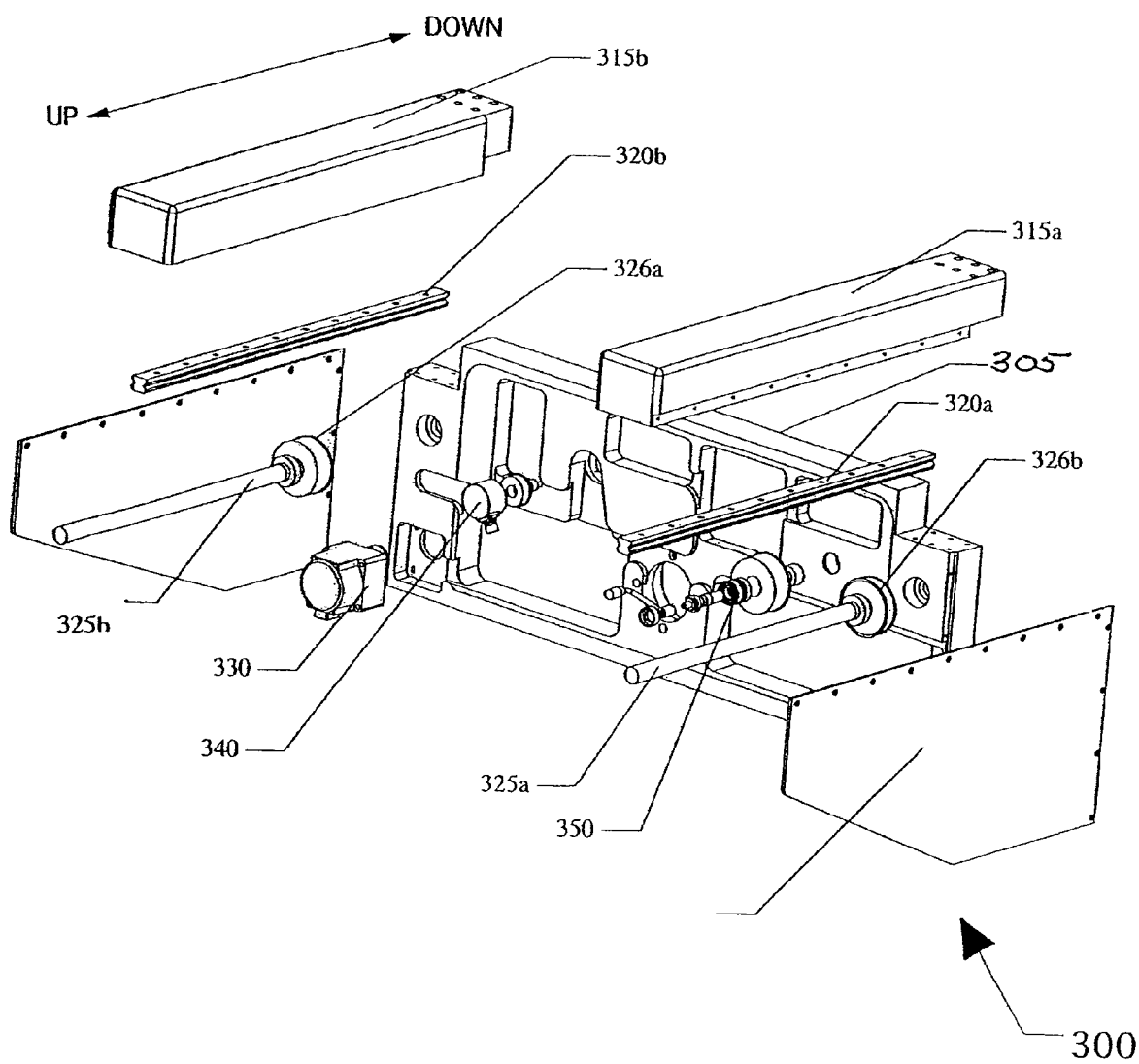
FIG. 12 is a partially exploded view of the swing unit shown in FIG. 11a, but from a different perspective.

Swing unit 300 is shown in FIGS. 11*a*, 11*b*, and 12. Swing unit opening 302 engages swing plate mounting assembly 260 shown in FIGS. 8, 9 and 10. Thus, as swing plate mounting assembly 260 rotates, swing unit 300 rotates in conjunction therewith. More specifically, as motor 230 spins, drive shaft 250 also spins. Swing plate mounting assembly 260 rotates because it is turned by drive shaft 250, as previously described. Thus, as swing plate mounting assembly rotates, swing unit 300 also rotates. If motor 230 is equipped with a brake unit, then the brake unit may be used to lock the swing unit 300 in position relative to side-to-side unit 200 when desired.

Referring to FIGS. 11*a*, 11*b*, and 12, swing unit 300 includes swing unit substrate 305. Columns 315*a,b* and side panels 310*a,b* are attached to swing unit substrate 305. Linear guide rails 320*a,b* are attached to columns 315*a,b* respectively and are essentially parallel, defining a vertical plane. Lead screws 325*a,b* are mounted to swing unit substrate 305 in the positions shown in front of columns 315*a,b* respectively. Pulleys 326*a* and 326*b* are attached to the ends of screws 325*a* and 325*b* respectively. Pulleys 326*a,b* are located underneath substrate 305 and screws 325*a,b* extend upwards through holes in substrate 305. Appropriate bearings are used in a conventional fashion to secure screws 325*a,b* to substrate 305 in a secure manner which allows them to freely rotate. Screws 325*a,b* may be ball screws. However, as will be discussed, screws 325*a,b* ultimately support the heavy load, and the thread style and pitch must be selected to prevent back-driving in case drive power is lost.

Also included are vertical drive motor 330, which may include appropriate speed reduction gears, and vertical position encoder 340. Motor 330 may also be equipped with a brake to prevent rotation when it is not in operation. Motor pulley 331 is attached to the shaft of motor 330, and encoder pulley 341 is attached to encoder 340. A hand crank 350 is also included which is attached to crank pulley 351. Pulleys 331, 341, and 351 are located underneath substrate 305. Idler pulley 371 is attached on the underside of substrate 305.

A set of three belts 361, 362, 363 interconnect pulleys 326*a,b*, 331, 341, 351, 371. First belt 361 couples motor pulley 331 to lead screw pulley 326*b*. Second belt 362 couples screw pulley 326*b* with encoder pulley 341 and crank pulley 351. Idler 371 tensions and guides second belt 362. Finally, third belt 363 couples lead screw pulley 326*a* with crank pulley 351. Thusly, in operation, rotation of motor 330 shaft causes the two lead screws 326*a,b* and encoder 340 to rotate. Hand crank 350 rotates as well. For manual operation, hand crank 350 may be used to turn the two lead screws 325*a,b*. The two screws 325*a,b* are identical in thread type and pitch; they are driven in synchronism by either motor 330 or hand crank 350.

As shown in FIG. 2, main arms 400, 500 ride along linear guide rails 320*b,a* respectively. While there are two main arms, namely main arm 400 and main arm 500, the following description will relate to main arm 400. The description of main arm 500 is identical to that of main arm 400 expect for its position, and the linear guide rail and screw which it engages.

Figure 13:
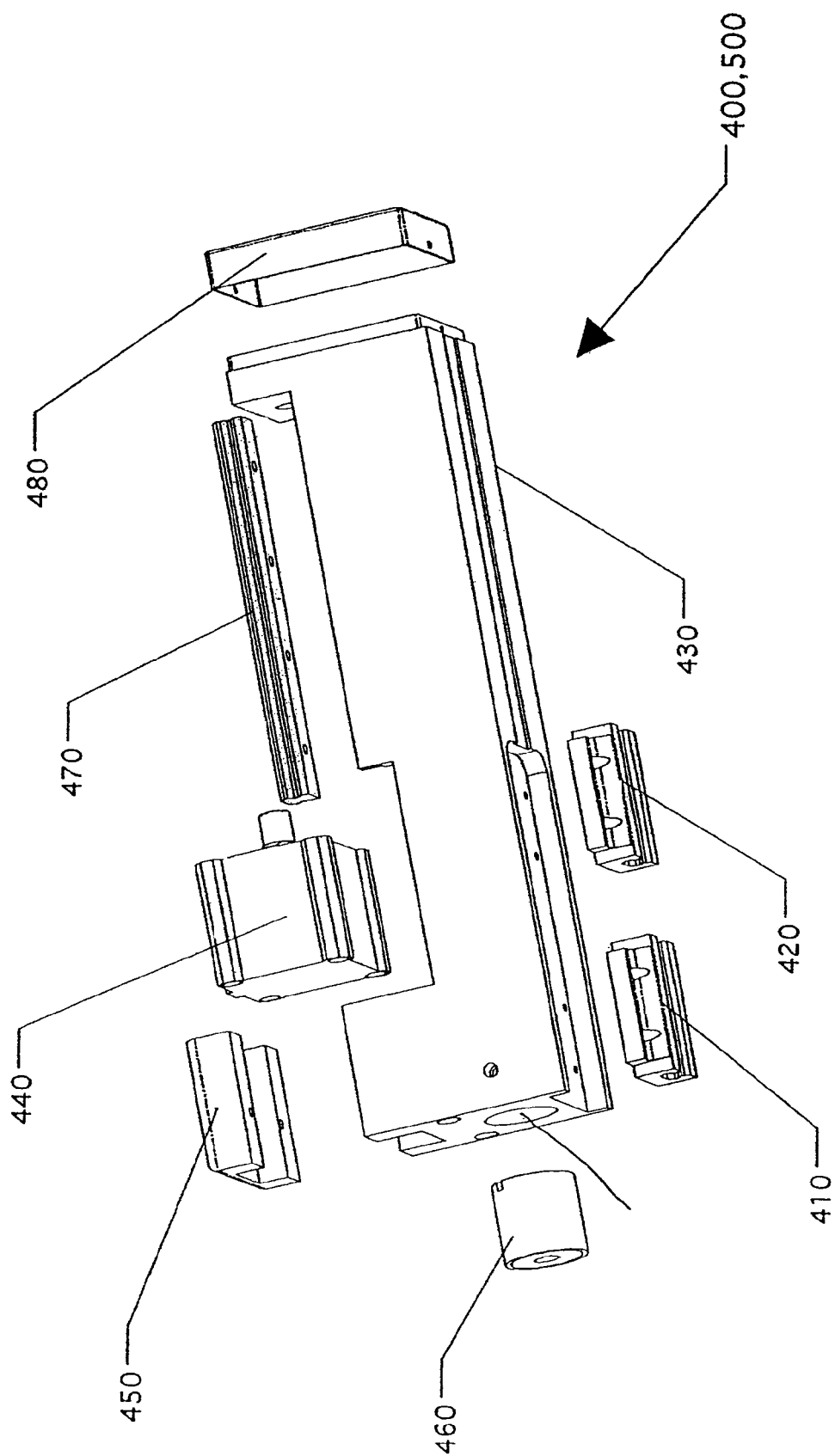
FIG. 13 is an exploded view of a main arm of the exemplary positioner system.
Figure 14A:
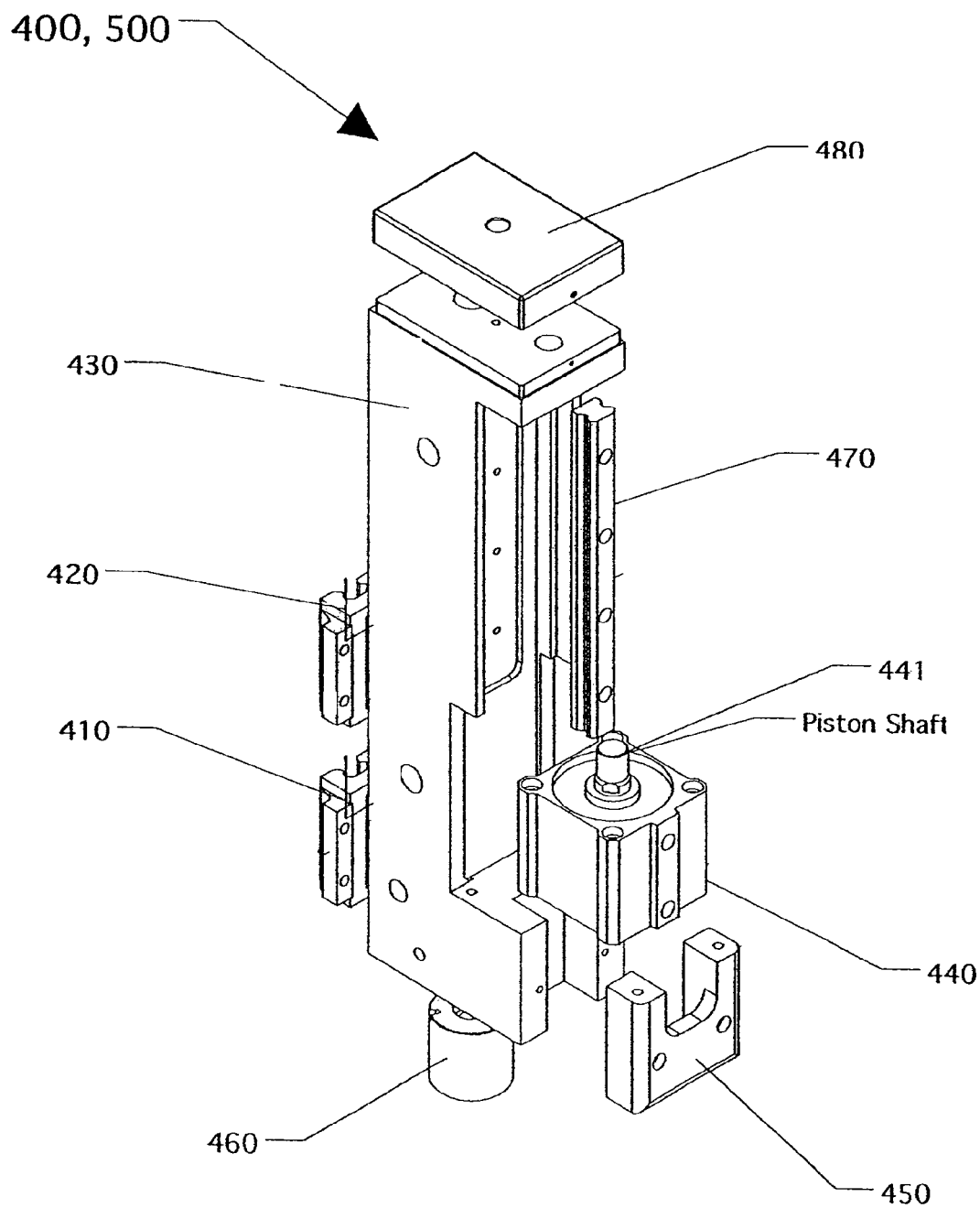
FIG. 14a is a partially exploded view of the main arm unit, but from a different perspective than that shown in FIG. 13.

As shown in FIGS. 13 and 14*a*, main arm 400 includes linear guide bearings 410, 420. Linear guide bearings 410, 420 ride along linear guide rail 320*b* (shown in FIG. 12). A longitudinal bore 462, having a diameter slightly greater than that of screws 325*a,b*, extends the length of main arm 400. The entrance area of bore 462 is appropriately enlarged and shaped to receive nut 460, which is rigidly attached to main arm 400. Nut 460 is threaded so that it can receive screw 325*b*. Thus, screw 325*b* is threaded through nut 460 and extends into bore 462.

Thus, as screw 325*b* rotates, nut 460 rides up and down along screw 325*b*. In this way, main arm 400 is able to move upwards and downwards. Main arm 400 includes pneumatic cylinder 440, linear guide rail 470, retaining member 450 to hold pneumatic cylinder in place and top 480.

Because screws 325*a,b* are rotated in synchronism and have the same thread, the two main arms 400, 500 move up and down in synchronism. As the main arms 400, 500 are accordingly raised and lowered, vertical position encoder 340 records their vertical position. Should motor 330 be equipped with a brake, it may be used to lock the screws 325*a,b* and prevent them from turning. Even if this is the case, it is still preferable that screws 325*a,b* be non-backdrivable by the heavy load for safety reasons.

Figure 15:
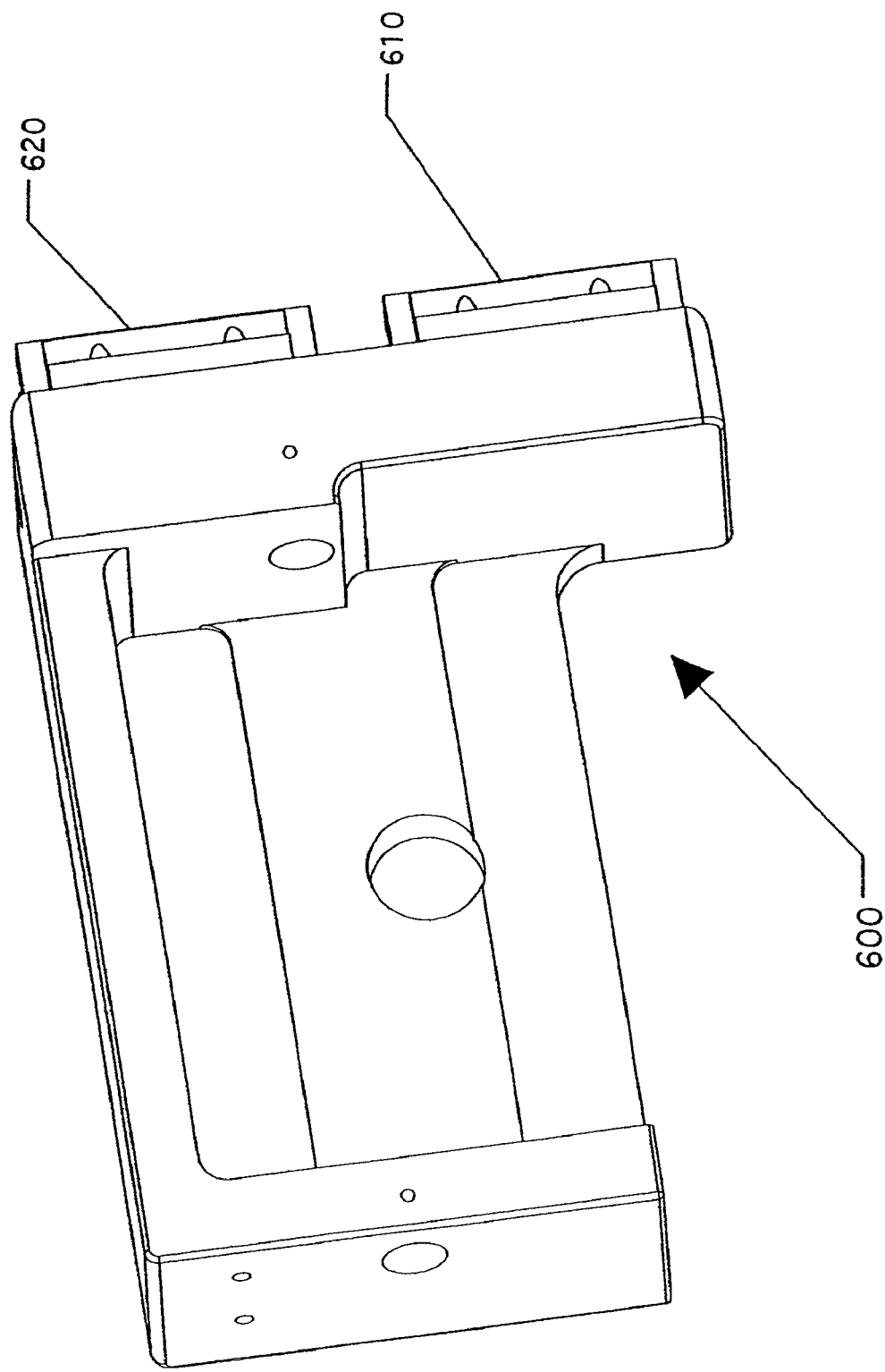
FIG. 15 is a perspective view of a vernier arm of the exemplary positioner system.
Figure 16:
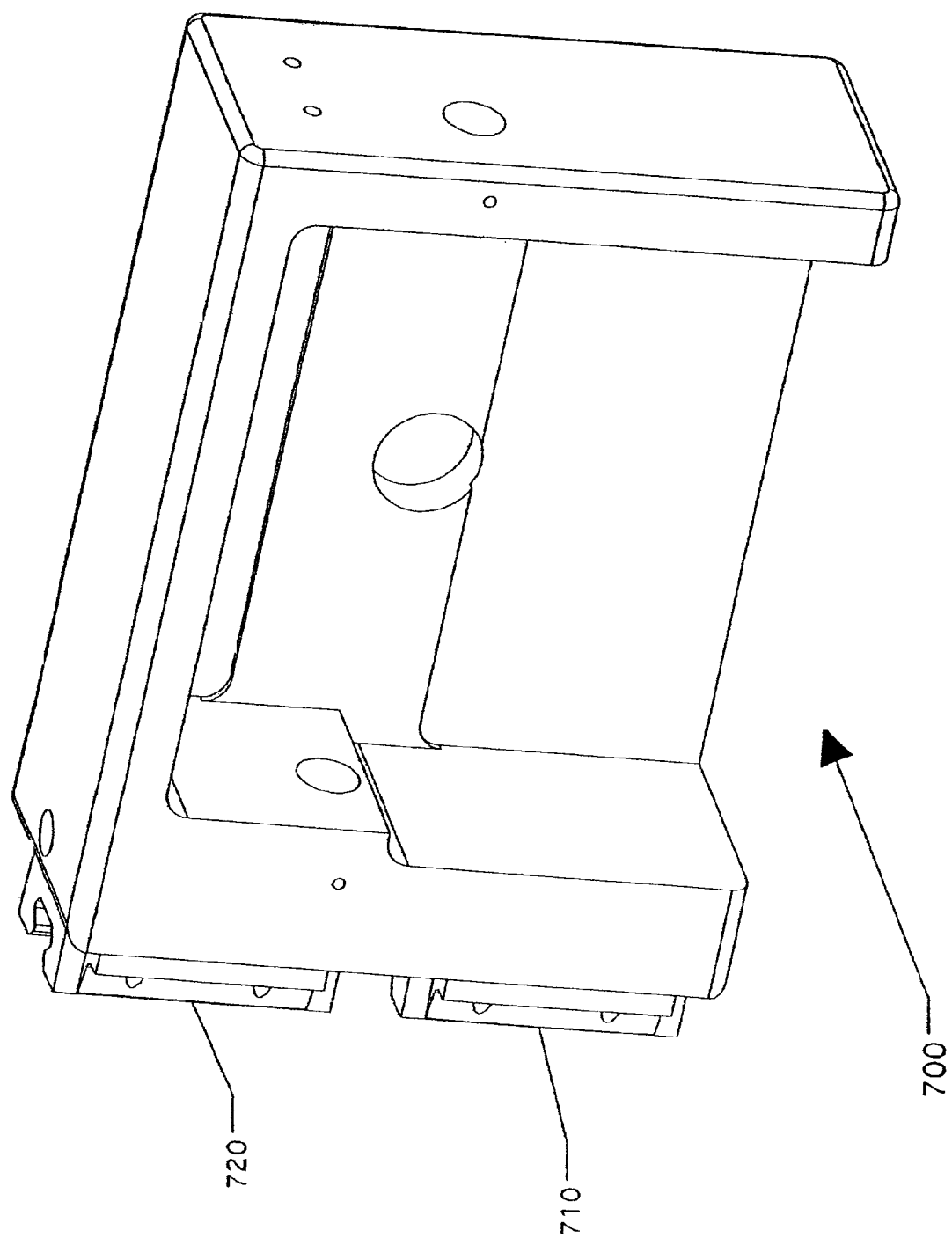
FIG. 16 is a perspective view of a further vernier arm of the exemplary positioner system.

Vernier arms 600 & 700 are similar in operation. Vernier arm 600, shown in FIG. 15, moves along linear guide rail 470. For this purpose, vernier arm 600 includes linear guide bearings 610, 620. Furthermore, vernier arm 700 is shown in FIG. 16. Vernier arm 700 moves along linear guide rail 570. For this purpose, linear guide bearings 710, 720 are included. Vernier arms 600, 700 are supported by pneumatic cylinders 440, 540 respectively. Pneumatic piston shafts 441, 541 directly engage the bottoms of vernier arms 600, 700. As seen in FIGS. 1 and 2 (and to be described in more detail later) tumble pivot unit 900 is attached to and supported by vernier arm 600, and tumble drive unit 800 is attached to and supported by vernier arm 700. A horizontal "tumble" axis is defined between pivot unit 900 and drive unit 800. The test head load is rotatably mounted to pivot unit 900 and drive unit 800 at essentially the two points where the tumble axis passes through them. The tumble axis is preferably parallel to the plane defined by the two parallel rails 320*a,b*.

Thus the test head load is supported by tumble pivot unit 900 and tumble drive unit 800, which are in turn respectively supported by pneumatic cylinders 440 and 540. Pneumatic cylinders 440 and 540 being respectively coupled to main arms 400 and 500. The vertical range of motion of either vernier vertical arm 600, 700 is approximately ±25 mm with respect to its associated main arm 400, 500.

A purpose of the vertical vernier arms 600, 700 is to provide compliant motion, in two degrees of freedom, of the test head during docking. Each pneumatic cylinder 440, 540 is provided with a regulated supply of air. That is, two regulators are provided: one for cylinder 440 and the second for cylinder 540. A common high pressure air supply may be provided to both regulators. The pressure in each cylinder 440, 540 may thus be independently regulated. By adjusting the air pressure in the cylinders 440,540 the test head may be moved upwards or downwards with respect to main arms 400,500. In this manner, the test head may be approximately centered within its range of vertical vernier motion. The position of the test head within the vertical vernier range may be maintained in the absence of any external forces by maintaining a constant pressures within the cylinders 440, 540 sufficient to offset the downwards force exerted on the respective piston shafts 441, 541 by the test head load. Because each cylinder is independently regulated, the pressures in the two cylinders need not be equal. This permits the load to have a center of gravity which, typically, is not necessarily centered between the two columns. If an external force pushes downwards on the test head, the pressure in cylinders 440, 540 tries to increase. The regulators accordingly bleed off some air to maintain a constant pressure. The test head accordingly moves down. Similarly, if an upwards force is applied, the cylinder pressures try to decrease, the regulators supply more air to maintain a constant pressure, and the test head moves up. Thus, the test head is maintained in a substantially weightless or floating condition. Furthermore, if an external torque is exerted on the test head attempting, for example, to move one side up and the other side down, the pneumatic cylinders facilitate this motion as the regulators supply more air to one cylinder while bleeding air from the other cylinder. Thus, this arrangement facilitates compliant motion of the test head in two degrees of freedom: vertical (along a Y axis) and rotational (theta-Z) motion about an axis which is perpendicular to the plane defined by linear rails 320*a,b* and, consequently, parallel with a Z axis. Furthermore, the rotational compliance may be about an axis which does not necessarily pass through the center of gravity of the load; the substantially weightless or floating condition with respect to this motion does not depend upon the location of the axis of rotation as it does in prior art systems.

Figure 14B:
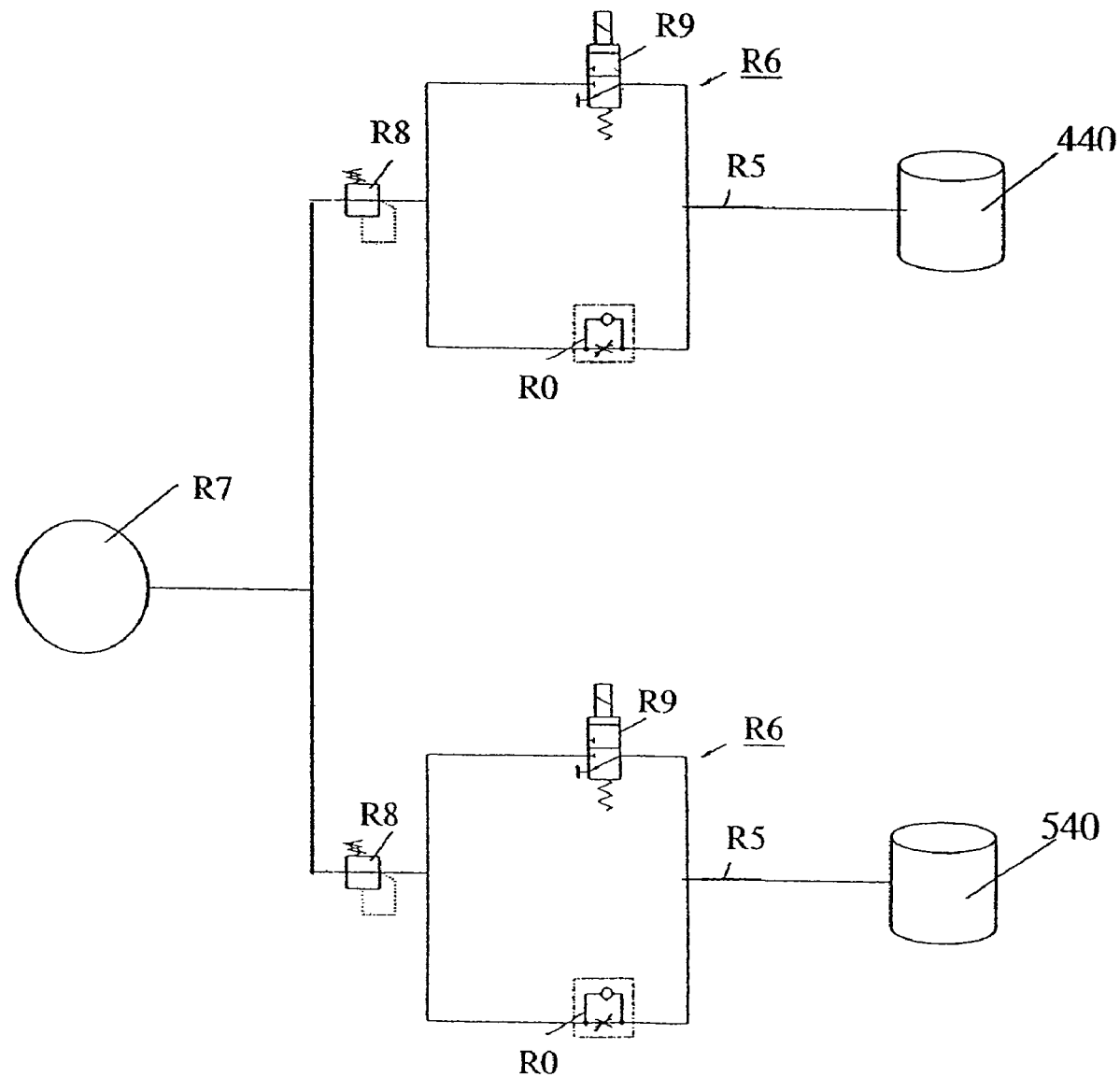

In order to carry out the vertical and rotational compliant motions provided by pneumatic cylinders 440 and 540 a pressure regulation apparatus is provided, which is shown schematically in FIG. 14*b*. Although the present description and embodiment uses air as the working fluid, other working fluids may be substituted within the spirit of the invention. Two, identical pressure regulation systems R6 are provided, one for each pneumatic cylinder 440, 540, so that the pressure within each cylinder may be independently controlled. Pressurized air is input to both regulation systems R6 from a common source R7 as is commonly available in most testing or other industrial facilities.

Each pressure regulation system R6 includes a pressure regulator R8, which may be adjusted to provide sufficient pressure to support the load on the corresponding cylinder 440. The pressure provided by regulator R8 first flows through electromagnetically controlled valve R9, which is switched to allow flow through to cylinder 440 in the activated state. Valve R9 has a spring return so that in the event of a power failure, valve R9 is returned to a position in which the return flow from cylinder 440 is blocked, thus preventing sudden pressure loss at the load.

Regulator system R6 seeks to maintain constant pressure at its output by allowing more air to flow from source R7 in the event of a pressure drop at the load, and by releasing air in the event of a pressure rise at the load. Regulator R8 provides such steady state control. Provided parallel to valve R9 is one-way restrictor R0, which facilitates adequate transient response in flow to small movements imposed on the load by external forces for positioning purposes. The two lines from valve R9 and restrictor R0 are brought together to form fluid line 25 which feeds into cylinder 440.

If one side of the load should now be manually raised with respect to its corresponding cylinder 440, then the pressure in cylinder 440 is reduced in accordance with the lifting force. Pressure regulation system R6 recognizes the drop in pressure and increases the fluid pressure by feeding additional fluid into cylinder 440 until the original target pressure is reached. Alternatively, if one side of the load is pressed downwards with respect to its cylinder 440, the pressure in cylinder 440 increases. Pressure regulation system R6 recognizes this pressure increase and diverts fluid out of cylinder 440 until the original target pressure is reached again.

Theta-Z (or roll) motion may be accomplished by an appropriate amount of flexibility where the test head (or its cradle) is coupled to the positioner system. For example, loose fitting balls and sockets or an appropriate sliding or flexing arrangement may be used for this coupling.

Turning now to consideration of tumble motion, tumble drive unit 800 is coupled to vernier arm 700. Thus, as vernier arm 700 moves upwards and downwards along linear guide rail 320*a*, tumble drive unit also moves with vernier arm unit 700.

Tumble drive unit 800 is shown with reference to FIGS. 17, 18, 19, 20 and 21. Tumble drive unit 800 includes tumble drive motor 810 and tumble position encoder 820. Motor 810 may include speed reduction gears. Motor 810 may also include a brake unit if desired. Motor 810 is coupled to pulley 876. Drive shaft 830 is coupled to pulley 875. Pulleys 875 and 876 are coupled with a belt (not shown). Thus, as the shaft of motor 810 rotates, drive shaft 830 also rotates. As an alternative implementation, gears could be used in place of the pulleys 875, 876 and belt. Drive shaft 830 includes worm drive (or the like) gear teeth 889 (not shown) which engage drive gear 880 (not shown in FIGS. 17, 18 and 19, described below). Drive shaft 830 is coupled to position encoder 820 via pulleys 872, 871 and a belt (not shown). Thus, as drive shaft 830 rotates, the shaft of position encoder 820 also rotates. As an alternative implementation, gears could be used in place of the pulleys 871, 872 and belt.

Figure 17:
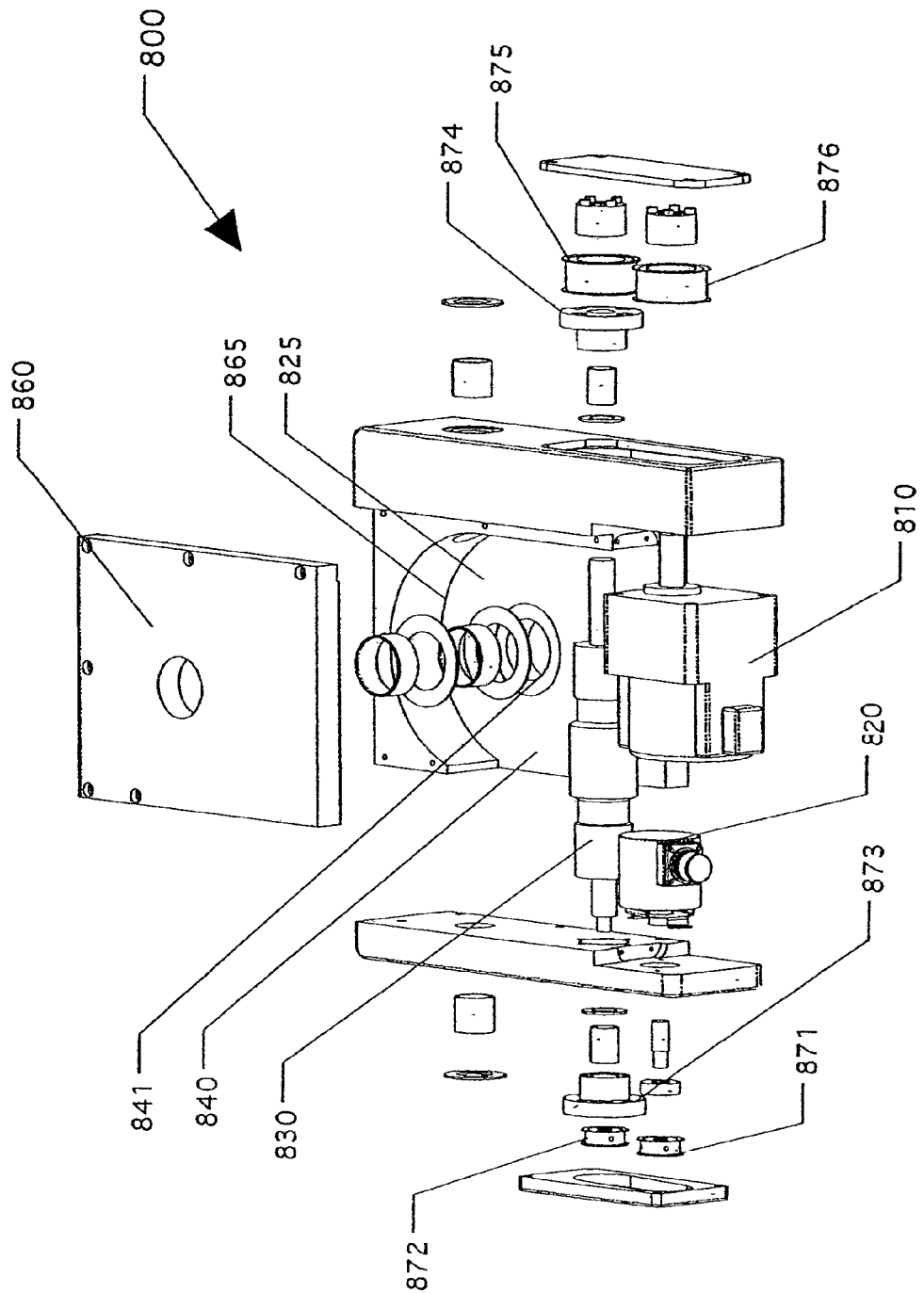
FIG. 17 is an exploded view of the tumble drive unit of the exemplary positioner system.
Figure 18:
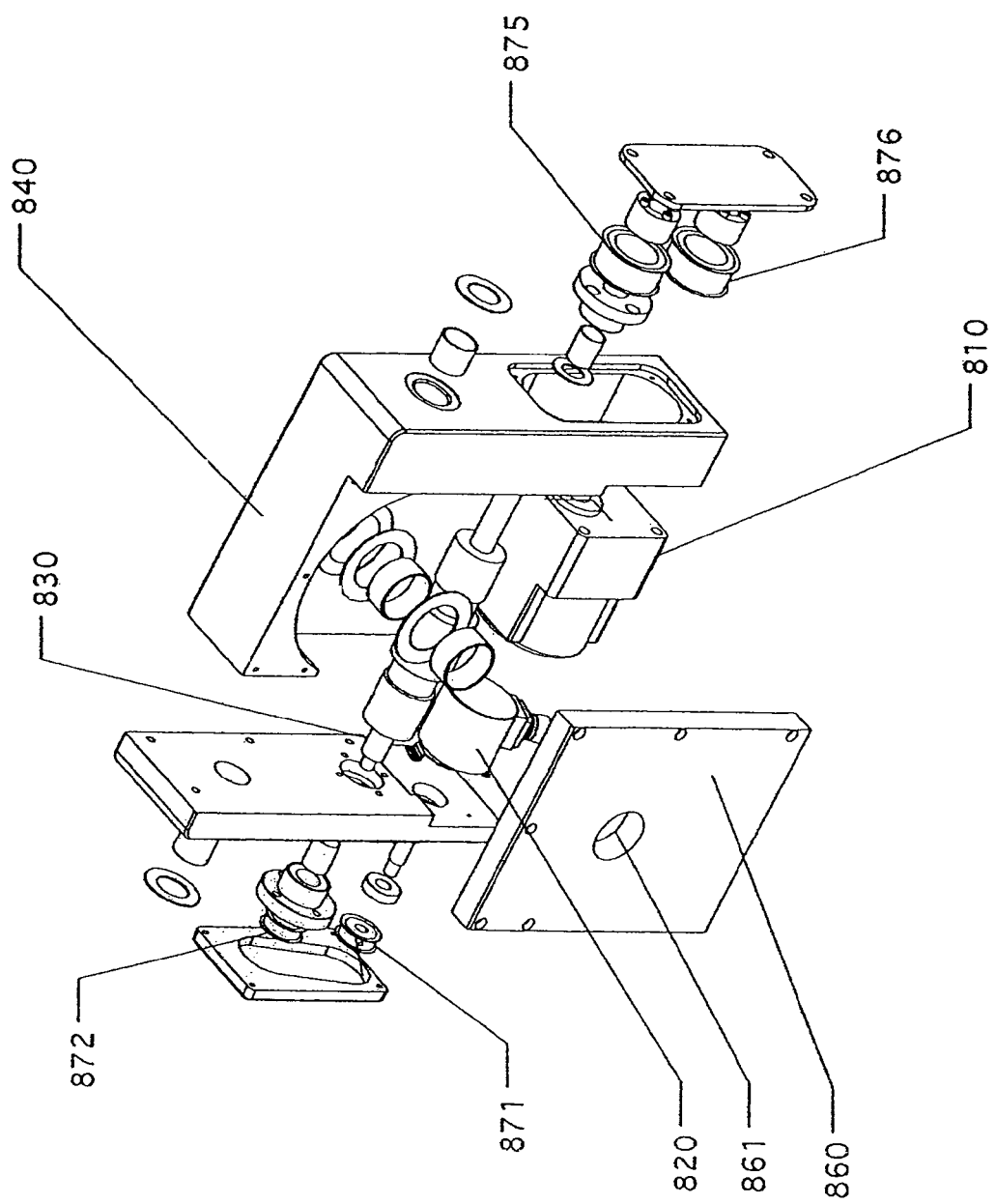
FIG. 18 is a further exploded view of the tumble drive unit, but from a different perspective than that shown in FIG. 17.
Figure 19:
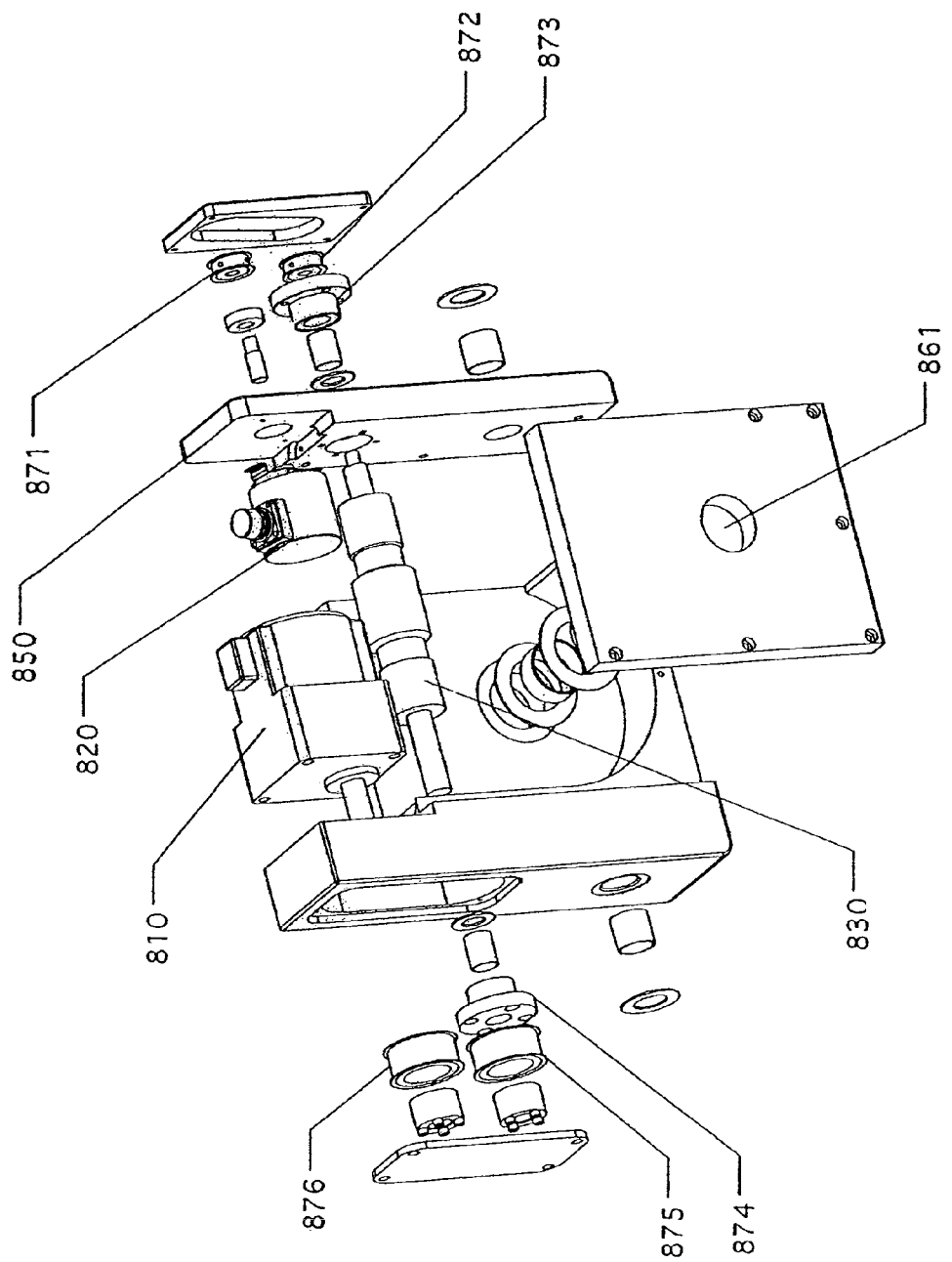
FIG. 19 is a further exploded view of the tumble drive unit, but from a different perspective than that shown in either of FIGS. 17 and 18.
Figure 20:
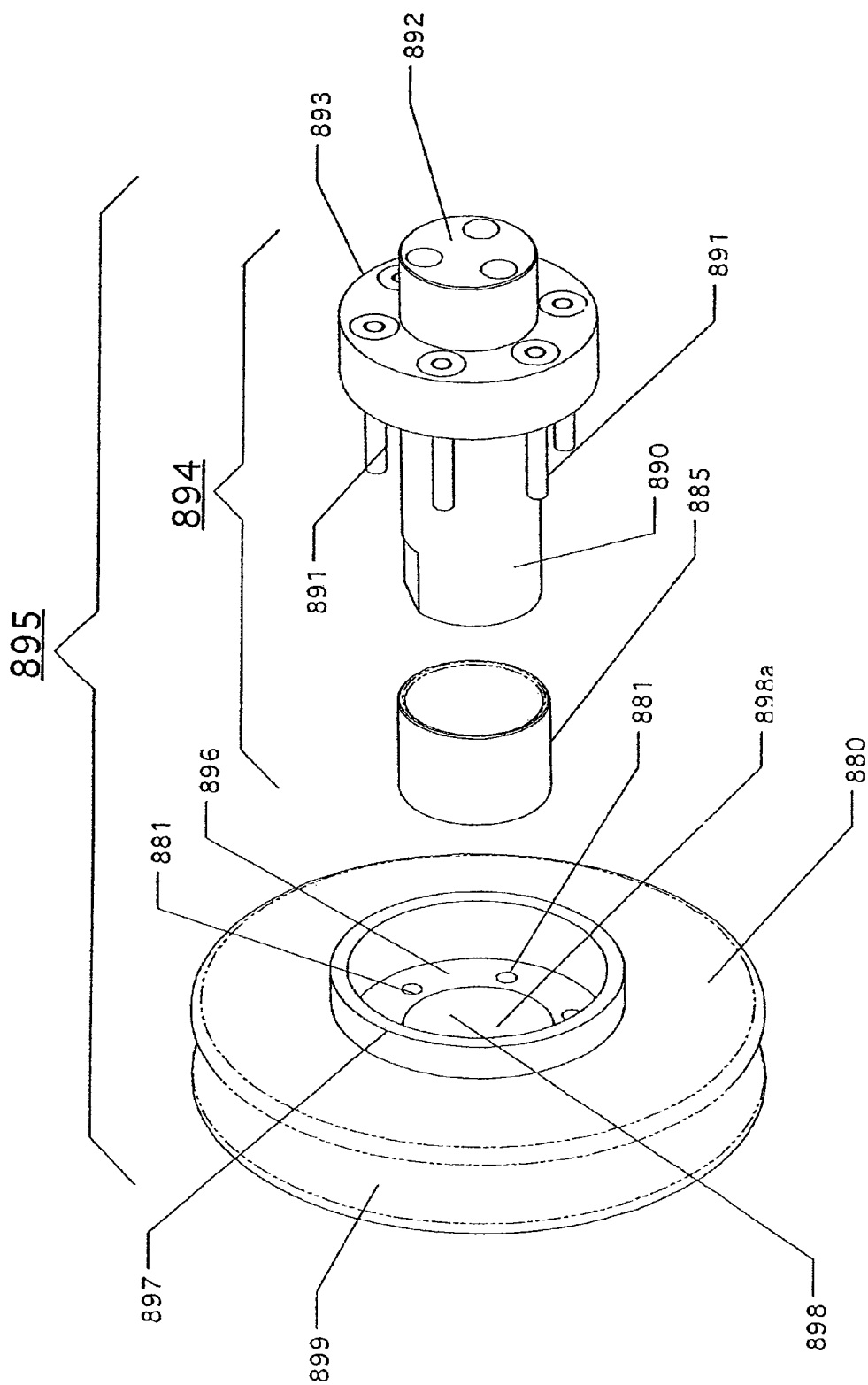
FIG. 20 is an exploded perspective view of a gear, bushing and axle which are used with the tumble drive unit shown in FIGS. 17, 18 and 19.

FIG. 20 shows an exploded view of drive gear and axle working assembly 895 (which is not included in FIGS. 17, 18, and 19 in order to allow other components to be visible). Drive gear 880 includes gear teeth (not shown) around its circumference 899, which engage drive shaft teeth 889. Drive gear 880 also includes a central circular opening 898. Surrounding opening 898 is an open cylinder 897. Circular flange 896 resides within opening 898 and has an annular opening 898*a*. Six holes 881 are uniformly dispersed around annular opening 898*a* in flange 896. Bearing 885 is fitted into annular opening 898*a*.

Axle subassembly 894 includes axle 890; axle ring 893 and attachment unit 892 are rigidly fixed to axle 890. Six vulcanized natural rubber pins 891 are fitted into six corresponding holes in axel ring 893, which are uniformly dispersed about axel 890. As is shown, the rubber pins extend parallel to axel 890. One side of the test head attaches to attachment unit 892 so that tumble rotation of the test head about the axis defined by the rotational center line of axle 890 is provided. (This is the previously described "tumble" axis.) To minimize the torque required to rotate the test head about this axis, the axis may be arranged to pass approximately through the center of gravity of the load.

Axle 890 fits within bearing 885 and each rubber pin 891 fits into a corresponding hole 881 in flange 896. Bearing 885 may be mounted so that it spaces axel ring 893 slightly apart from flange 896. Thus, axle 890, axle ring 893, and attachment unit 892 are flexibly coupled to drive gear 880. The rubber pins 891 are stiff enough so that if drive gear 880 is rotated, axle subassembly 894 rotates with it, provided any rotational load coupled to attachment unit 892 is not too great, as is the case when the rotation axis passes through the approximate center of gravity of the load. However, if drive gear 880 is rigidly held in a fixed position, the rubber pins are flexible enough to allow a load coupled to attachment unit 892 to be rotated plus or minus a few degrees by a reasonably small external force. Spacing axle ring 892 apart from flange 896 reduces the possibility of shearing rubber pins 891. Also, the relative stiffness of the assembly may be adjusted by varying this spacing. Thus, the assembly provides a compliant rotational drive mechanism. In a manipulator system, this provides a desirable component of compliant motion of the test head when docking with a peripheral. Thus, attachment unit 892 is capable of a limited amount of rotational movement with respect to drive gear 880 even when drive gear 880 is stationary. This is due to the flexibility of the rubber pins 891 which couple axle unit 893 to gear 880.

Figure 21:
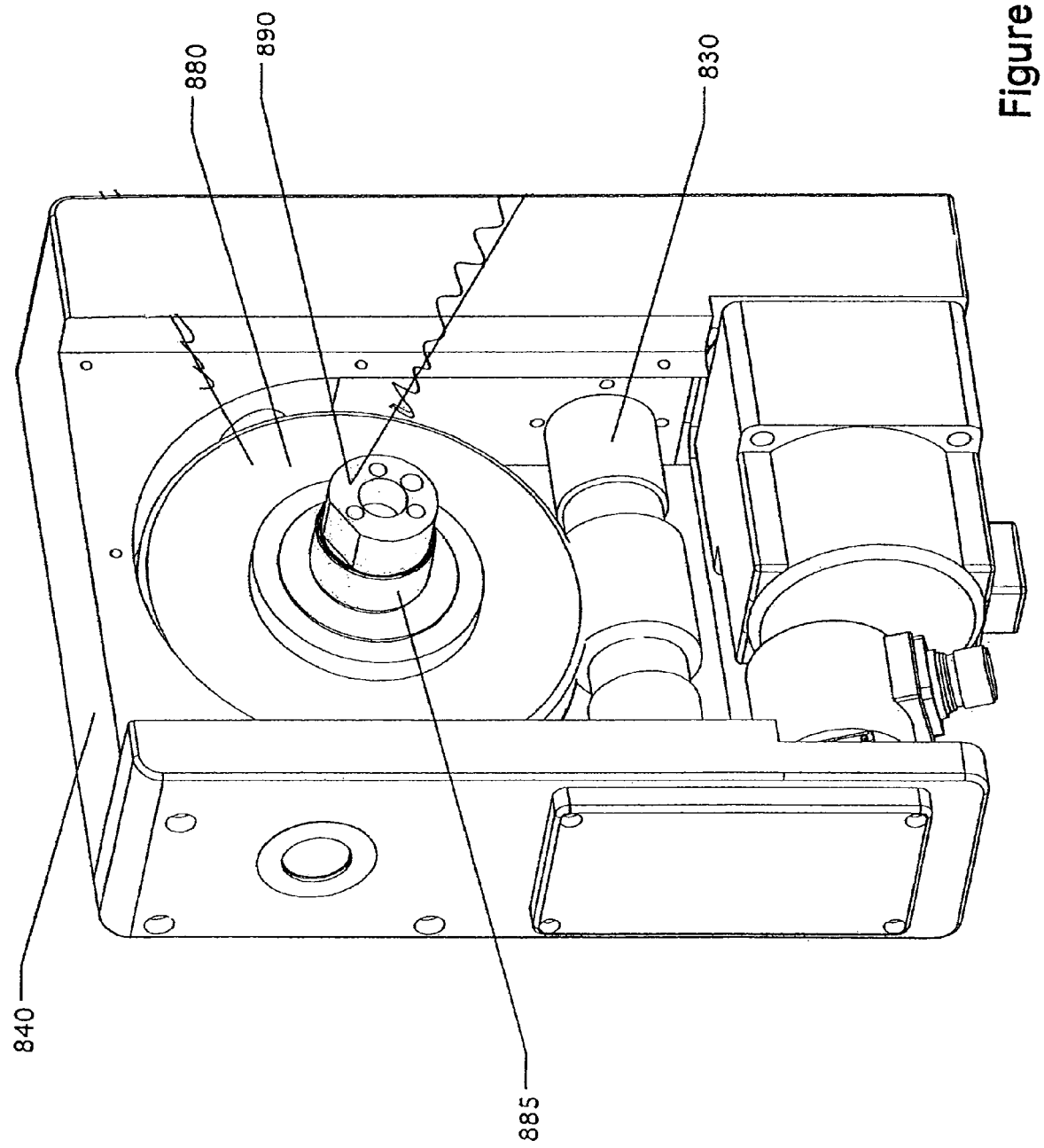
FIG. 21 is perspective view of the tumble drive unit of FIGS. 17, 18 and 19 with the drive gear, bushing and axle installed.

As shown in FIG. 21, drive gear and axle assembly 895 reside within well 855 of tumble drive unit 800. Axle 890 is perpendicular to drive shaft 830. The gear teeth on the circumference 899 on drive gear 880 engage corresponding gears 889 (not shown) on drive shaft 830 so that rotation of drive shaft 830 causes rotation of gear 880 and, accordingly, drive gear and axel assembly 895 and the load attached to it. Appropriate gear arrangements such as worm gears or spiral gears may be used so that drive gear 880 rotates about an axis that is orthogonal to the axis of rotation of drive shaft 830.

Tumble drive housing 840 includes hole 841 (see FIG. 17) through which axle 890 passes. Cover 860 includes hole 861 (see FIGS. 17, 18 and 19) through which attachment unit 892 protrudes. Bearing members 865 are included to provide a precise, low-friction fit.

Figure 22A:
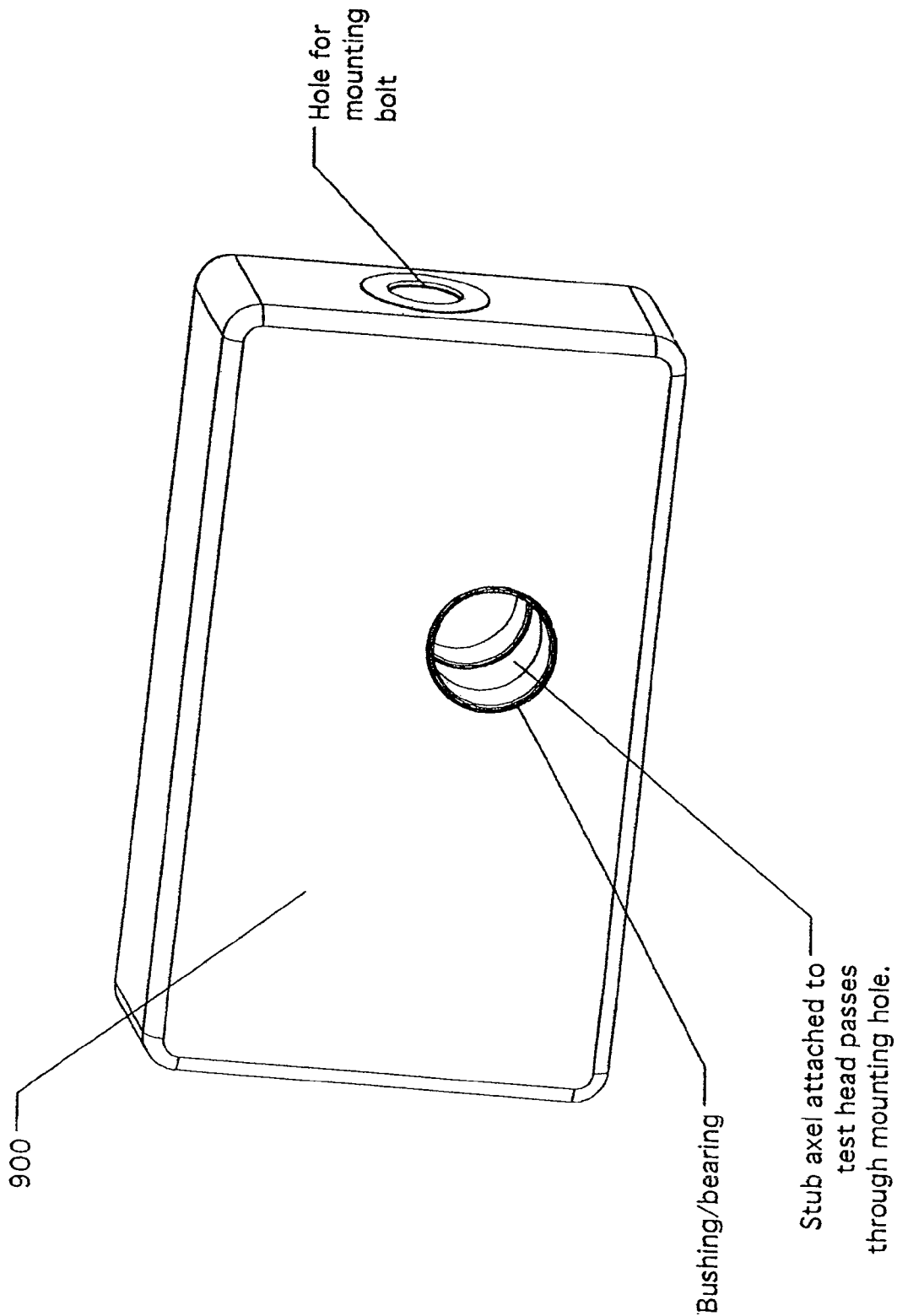
FIGS. 22a and b are perspective views of a tumble pivot unit of the exemplary positioner system.
Figure 22B:
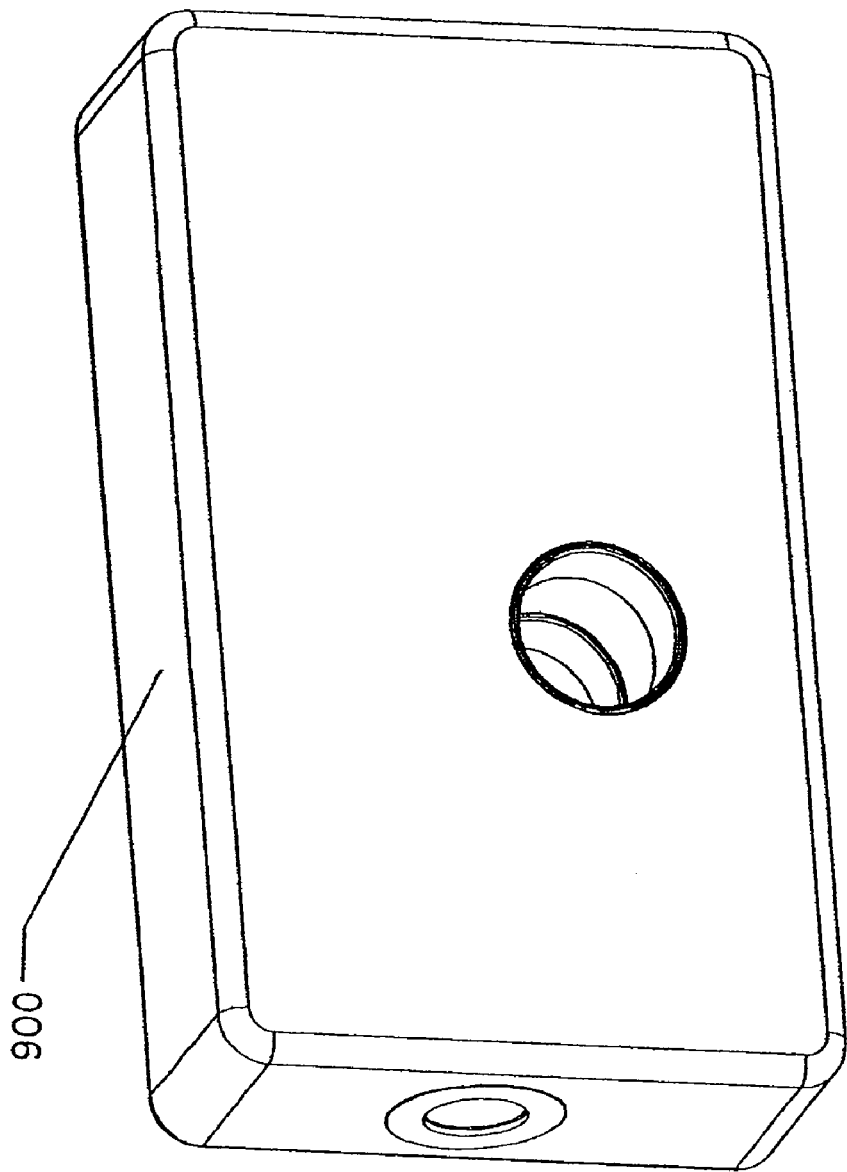

Tumble pivot unit 900, shown in FIGS. 22a and b, is a non-powered attachment unit that is attached to the other side of the test head. Tumble pivot unit 900 is attached to vernier arm 600. As previously discussed, vernier arm 600 moves upwards and downwards along linear guide rail 570. Tumble pivot unit is essentially a rectangular box that provides a means of coupling to a pivotable test head mounting device. In an exemplary embodiment, this amounts to a hole 901 through the pivot unit. A stub axle (not shown), which passes through this hole 901 may be mounted to the test head. Appropriate bearings may be utilized to provide low friction. Tumble pivot unit 900 and tumble drive unit 800 ("tumble units") are attached to their respective vertical vernier arms 600, 700 by means of attachment screws (not shown) which engage attachment holes. This allows for simplified installation or change over of the test head. For example, to install a test head, one first removes tumble pivot and drive units 900, 800 from the manipulator. These may now be attached to the test head. Then the assembly of test head and tumble pivot and drive units may be conveniently attached to the test head.

Figure 23:
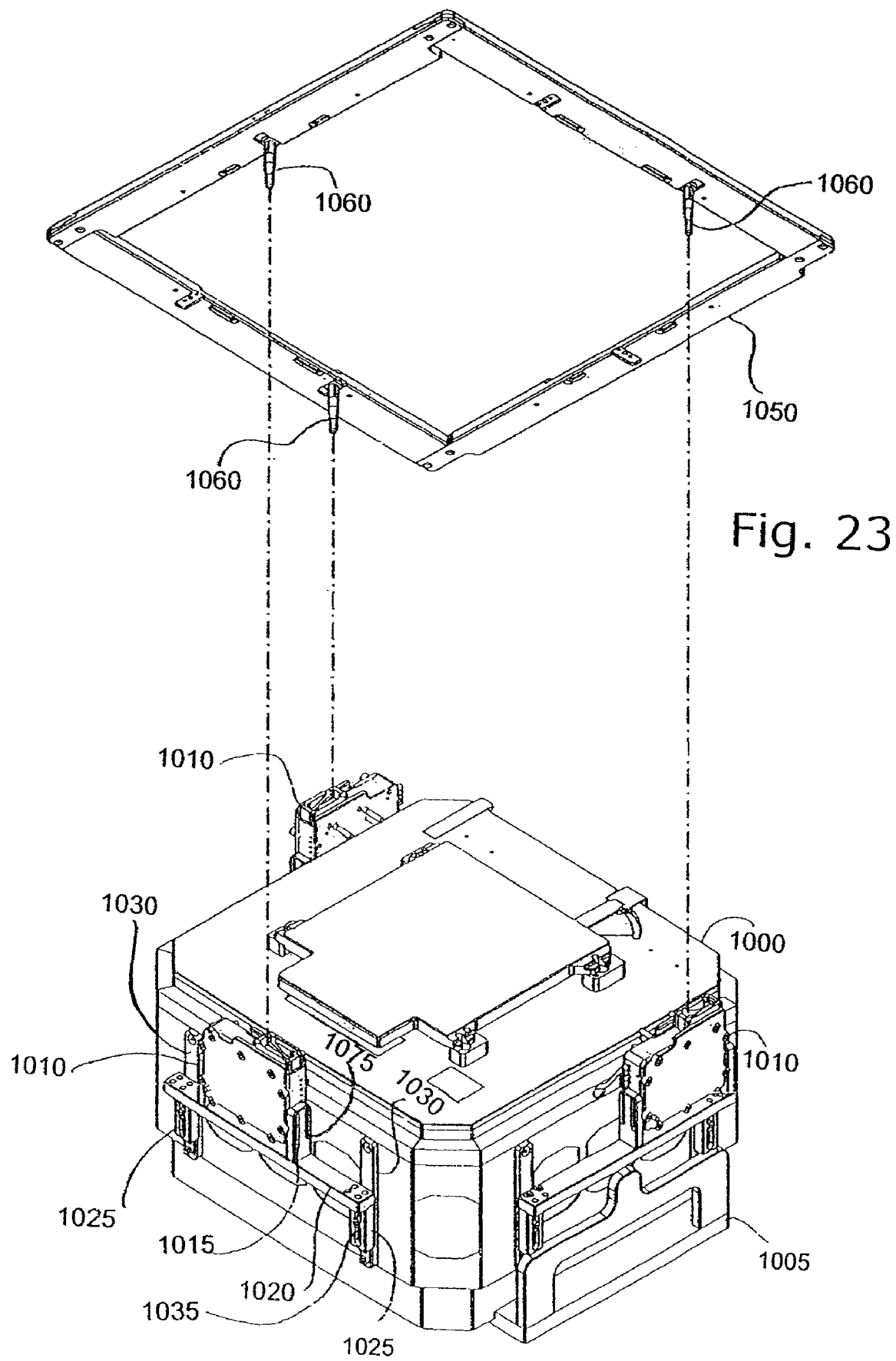
FIG. 23 is a perspective drawing illustrating the application of docking module mechanisms in accordance with an exemplary embodiment of the present invention.

FIG. 23 is a perspective view of a docking mechanism in accordance with an exemplary embodiment of the present invention. Exemplary test head 1000 is included in FIG. 23. Test head 1000 is coupled to bracket 1005. Bracket 1005, in turn, is coupled to tumble drive unit 800 and tumble pivot unit 900. A plurality of docking mechanisms 1010 are attached to the sides of test head 1000. In this exemplary embodiment, three docking mechanisms 1010 are shown. Each docking mechanism 1010 is situated on bottom support 1020. Docking mechanism 1010 is attached to side calibration bars 1015 via appropriate bolts or adjustment screws 1075. Side calibration bars 1015 are used for fixing docking mechanism 1010 to bottom support 1020. Bottom support 1020, in turn, is attached to bottom calibration bars 1025. Bottom calibration bars 1025 are attached to bottom calibration platform 1030 via appropriate bolts or adjustment screws 1035. Thus, docking mechanism 1010 can be moved in an appropriate position by changing the position of docking mechanism 1010 relative to side calibration bars 1015 and by changing the position of bottom support 1020 relative to bottom calibration platform 1030. Docking frame 1050 is also shown. Docking frame 1050 is affixed to the peripheral device (that is, a device or package handler, a wafer prober, or other test apparatus.). Affixed to docking frame 1050 are a plurality of docking pins 1060. Docking pins 1060 and docking mechanism 1010 are positioned so that docking pins 1060 are aligned with and mate relative to respective docking mechanisms 1010.

Figure 24:
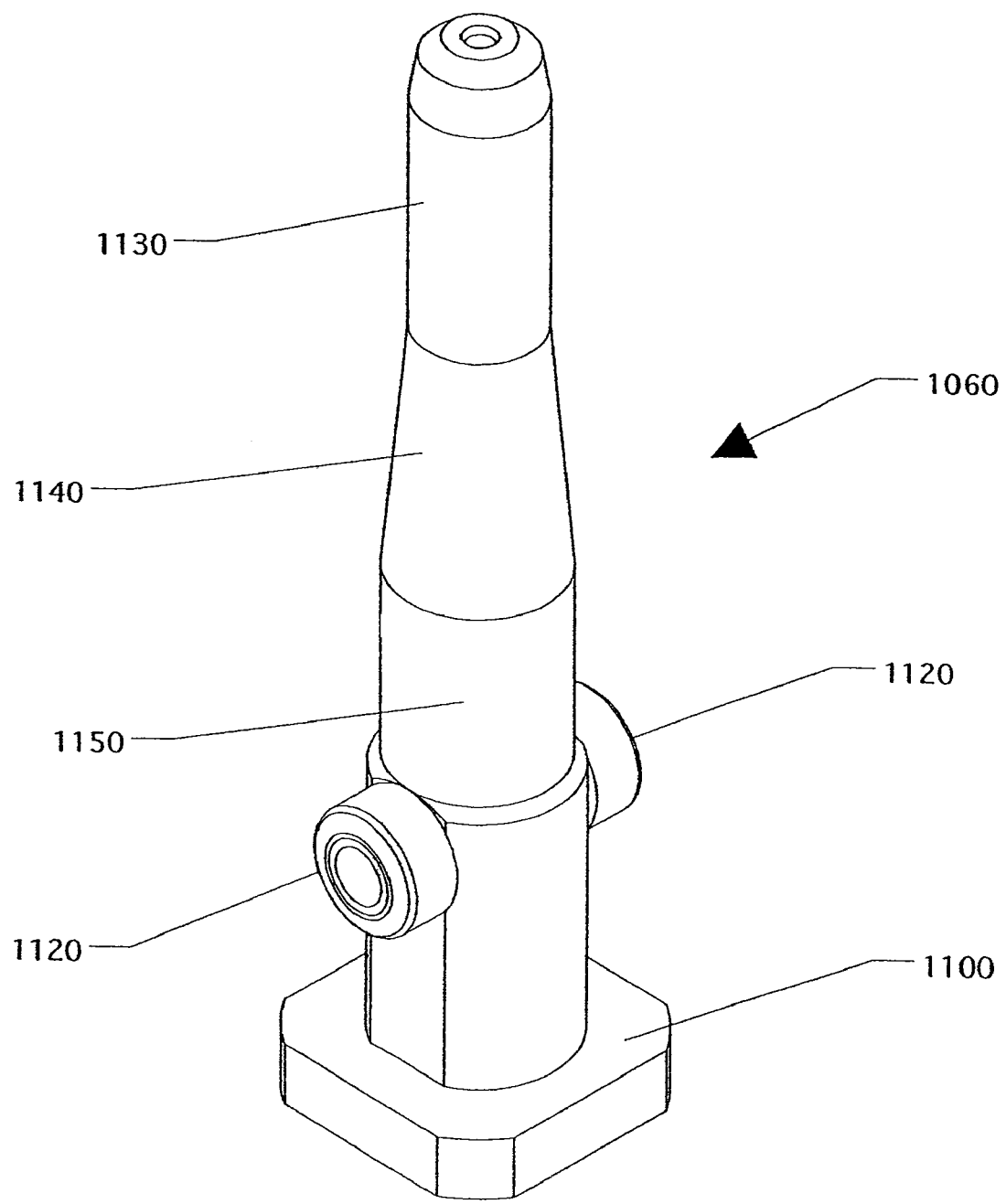
FIG. 24 is a perspective drawing of a docking pin in accordance with an exemplary embodiment of the present invention.

FIG. 24 is a perspective view of docking pin 1060 shown in FIG. 23. Docking pin 1060 includes docking pin base 1100 with pin sections 1150, 1140 and 1130 extending there from. As shown, pin section diameters may become increasingly narrow approaching the tip of docking pin 1060. This is particularly useful when docking a test head with a peripheral device because the smaller diameter of pin section 1130 relative to the other pin sections allows for greater initial error when docking the test head with the peripheral device. By giving the positioner system sufficient compliance (i.e., minor unpowered movement) it is possible to correct for minor misalignment between the test head and device handler when the docking operation occurs. Also shown in FIG. 24 are cam followers 1120 which extend from the sides of docking pin 1060. Cam followers 1120 engage appropriate slots which are formed in docking mechanism 1010 and which will be described later.

Figure 25A:
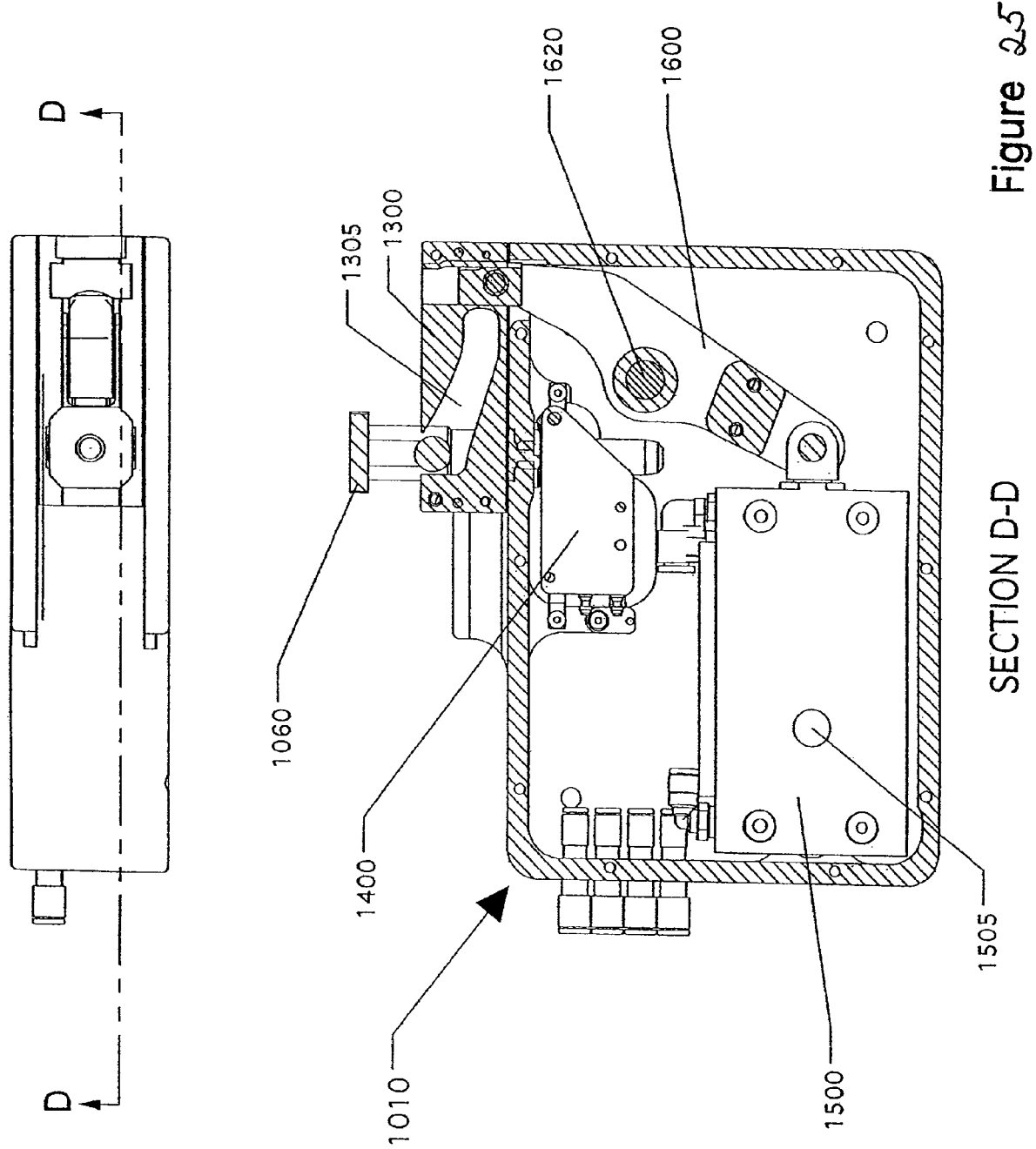
FIGS. 25a and b are cut-away side views of a docking module mechanism.
Figure 25B:
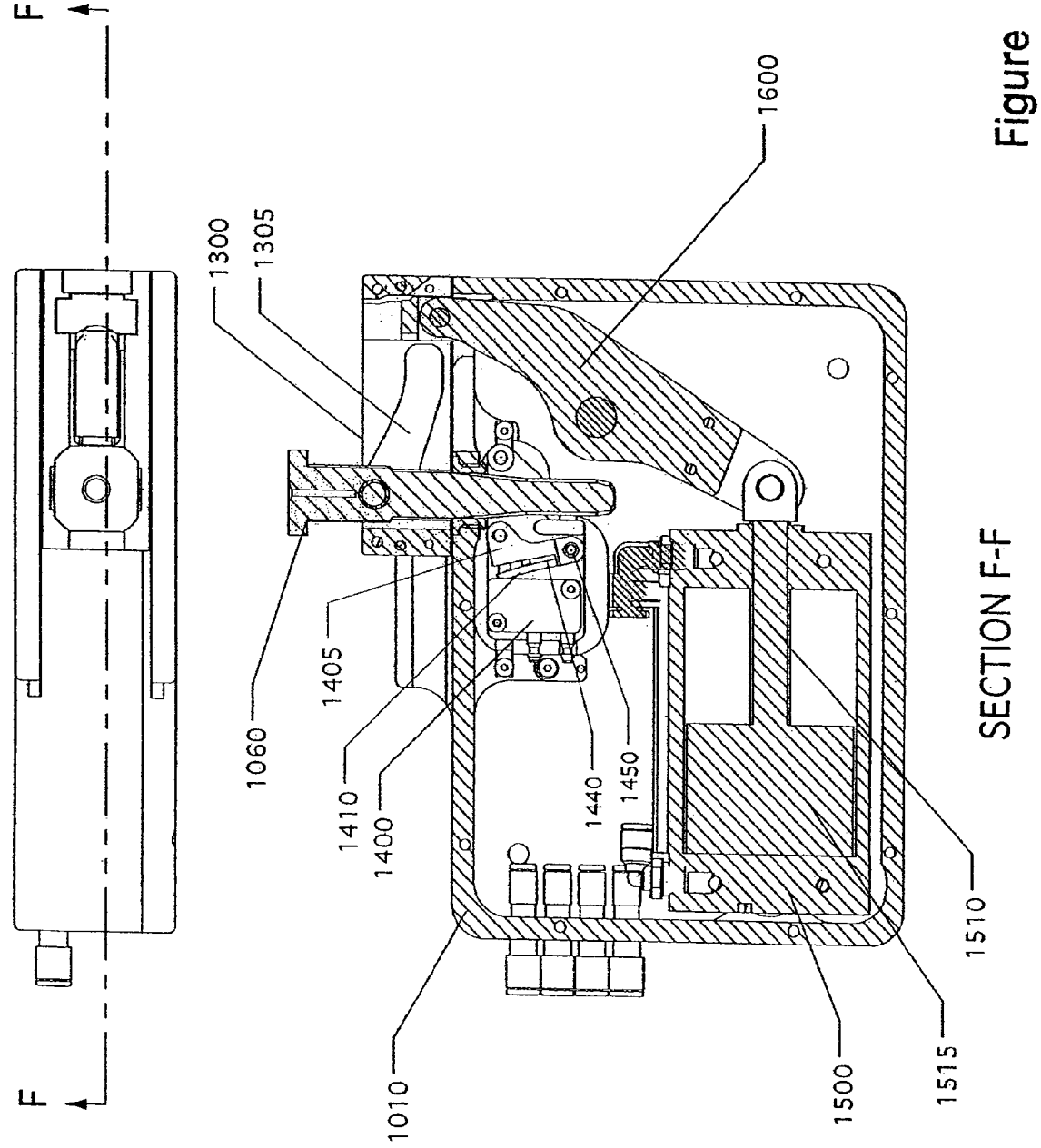
Figure 26:
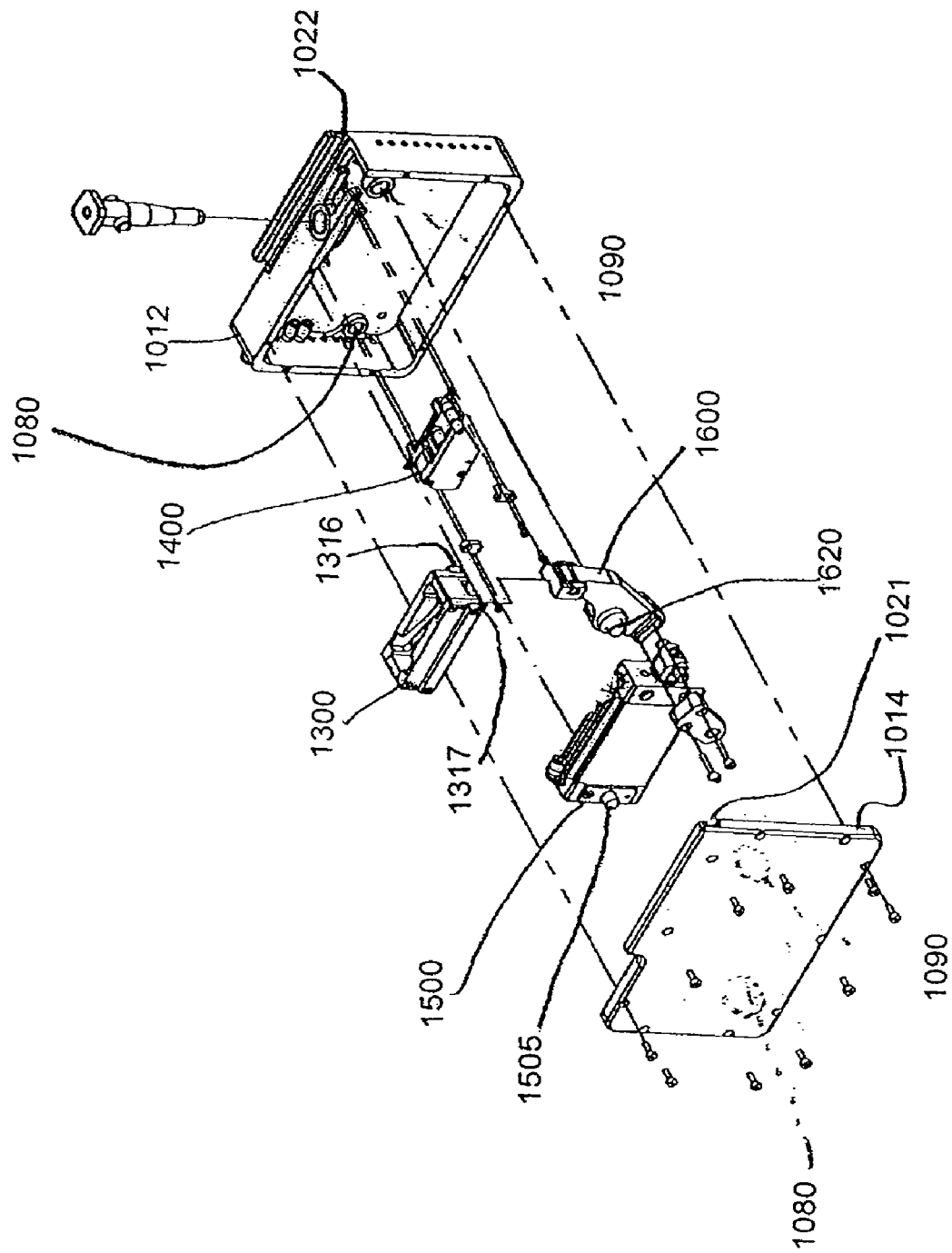
FIG. 26 is an exploded perspective view of a docking module mechanism in accordance with an exemplary embodiment of the present invention.

A cut-away side view of an exemplary embodiment of the present invention is shown with reference to FIGS. 25 a and b. Also, an exploded perspective is shown in FIG. 26. In FIGS. 25 a and b, docking pin 1060 is shown after initial insertion into pin receptacle 1300. Docking pin 1060, in FIGS. 25 a and b, is shown as already penetrating pin detector 1400. Pin receptacle 1300 is coupled to arm 1600. Arm 1600 is moved as a result of a piston included in piston unit 1500. Piston unit 1500 includes piston 1515 and piston shaft 1510. Piston unit 1500 also includes pivot points 1505 on opposite sides thereof (only one side is shown in the figures). Pivot points 1505 enable piston unit 1500 to have a small amount of pivotal motion. In an exemplary embodiment piston unit is a pneumatic unit; however, other types could be used such as hydraulic or electromechanical units. Pivot points 1505 enable piston unit 1500 to pivot about pivot guides 1080 which are situated on the sides of enclosure 1012 and cover 1014 which face inward within docking mechanism 1010. Arm unit 1600 includes pivot points 1620. By engaging pivot guides 1090 (again situated on the sides of enclosure 1012 and cover 1014 which face inward within docking mechanism 1010), Pivot points 1620 enable arm 1600 to have pivotal motion.

In FIG. 25, the piston 1515 within piston unit 1500 is more clearly shown. The operation of the various features of pin receptacle 1300 is described below.

FIG. 26 is an exploded perspective view of docking mechanism 1010. In this figure, it is possible to see docking mechanism enclosure 1012 as well as docking mechanism cover 1014. Also there is shown pin receptacle 1300, pin detector 1400, arm 1600 and piston unit 1500.

Figure 27:
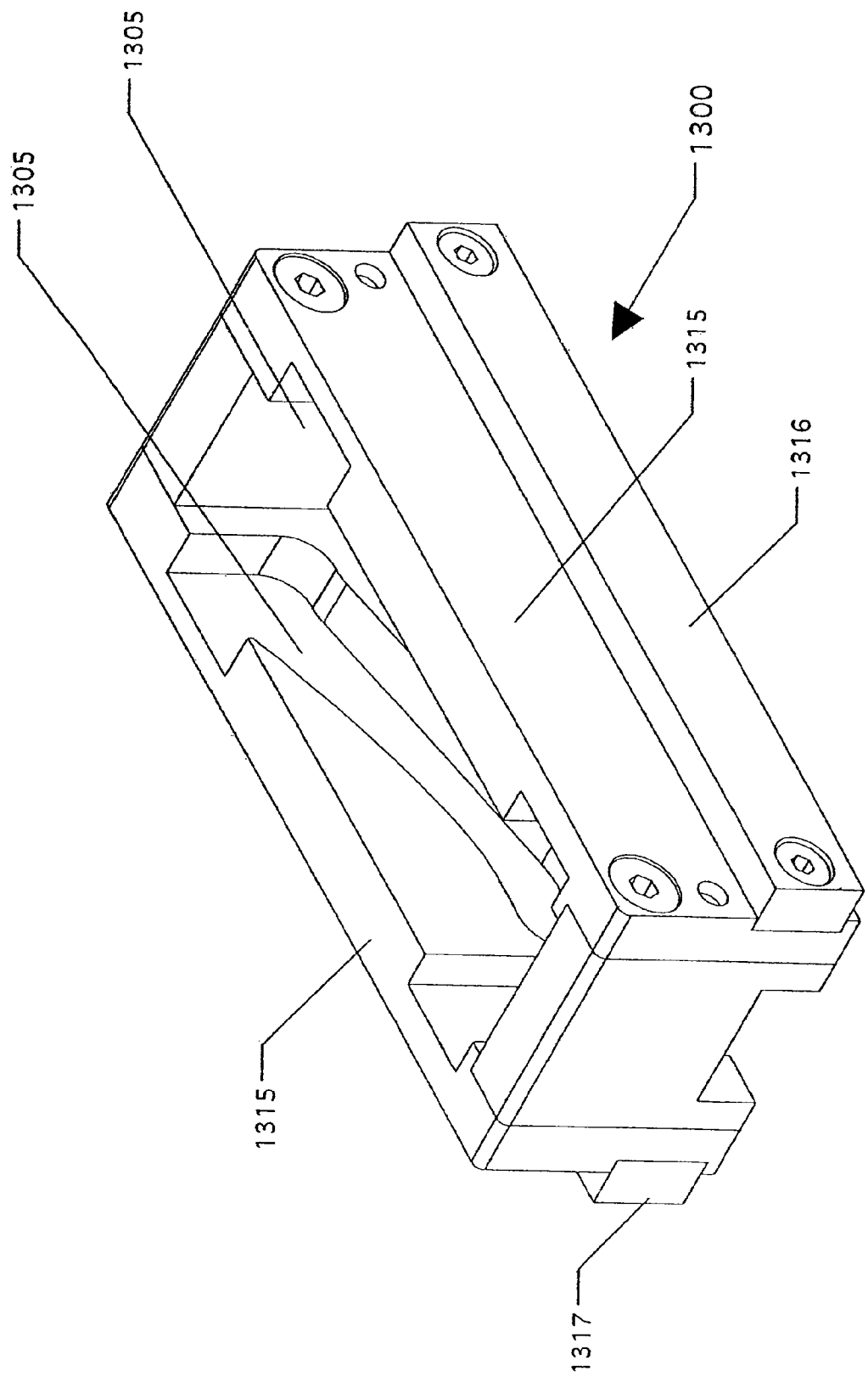
FIG. 27 is a perspective view of a pin receptacle in accordance with an exemplary embodiment of the present invention.

In FIG. 27, there is shown a perspective view of pin receptacle 1300. Pin receptacle 1300 includes cam grooves 1305. There is one cam groove 1305 milled in each side piece 1315 of pin receptacle 1300. Cam followers 1120 which are shown extending from the sides of docking pin 1060 in FIG. 24 engage grooves 1305. Pin receptacle 1300 is slidingly attached to enclosure 1012 and cover 1014. In particular bar 1316 engages slot 1022 in enclosure 1012, and bar 1317 engages slot 1021 in cover 1014. As will be further described, motion of piston 1515 and piston shaft 1510 is coupled to pin receptacle 1300 by means of pivoting arm 1600. Thus, motion of piston 1515 causes pin receptacle 1300 to slide left and right. In the figures, pin receptacle 1300 will be in its rightmost position when piston 1515 is furthest to the left so that piston shaft 1510 is retracted. Similarly, pin receptacle 1300 will be in its leftmost position when piston 1515 is furthest to the right so that piston shaft 1510 is extended.

Figure 28:
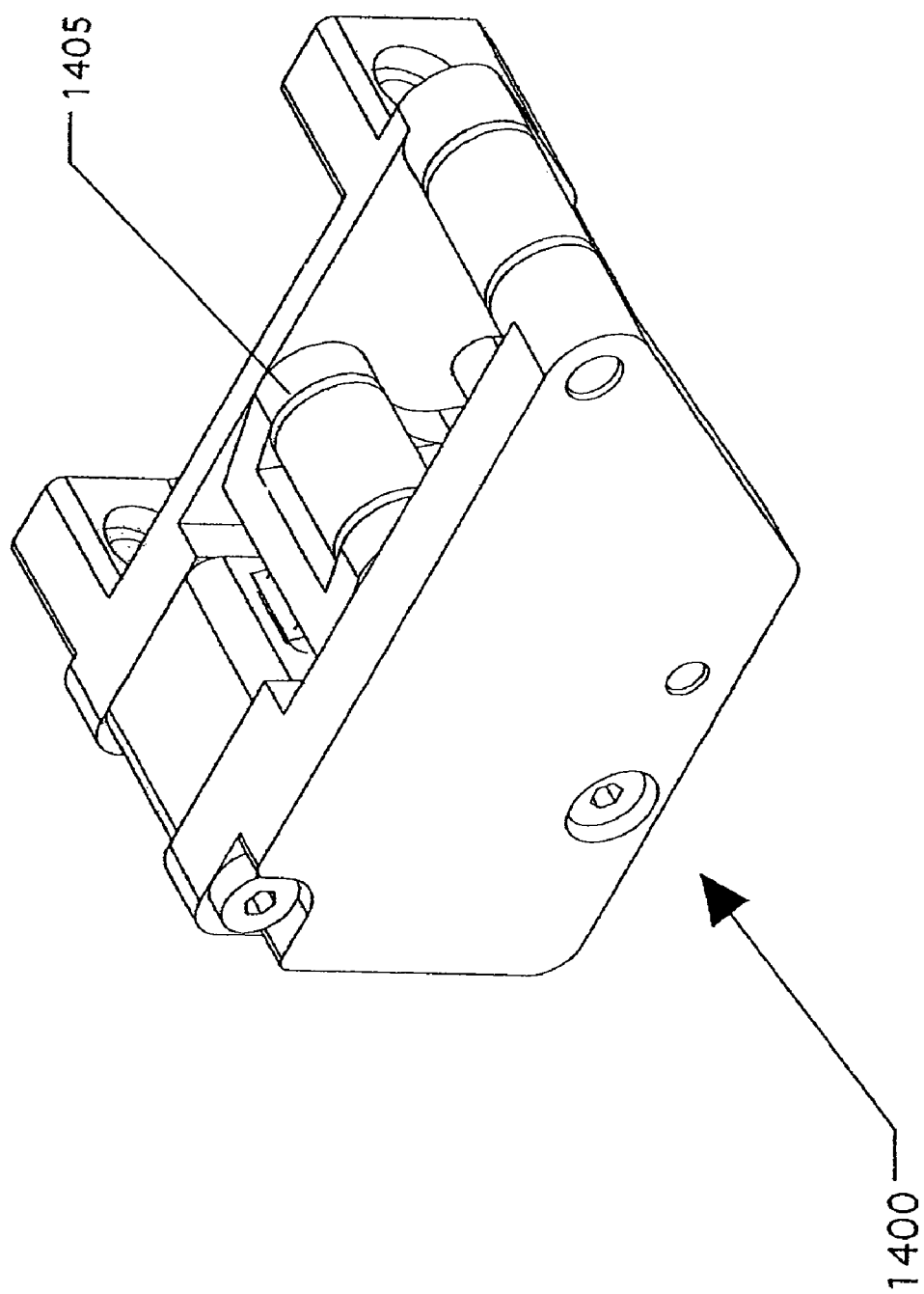
FIG. 28 is a perspective view of a pin detector in accordance with an exemplary embodiment of the present invention.
Figure 29:
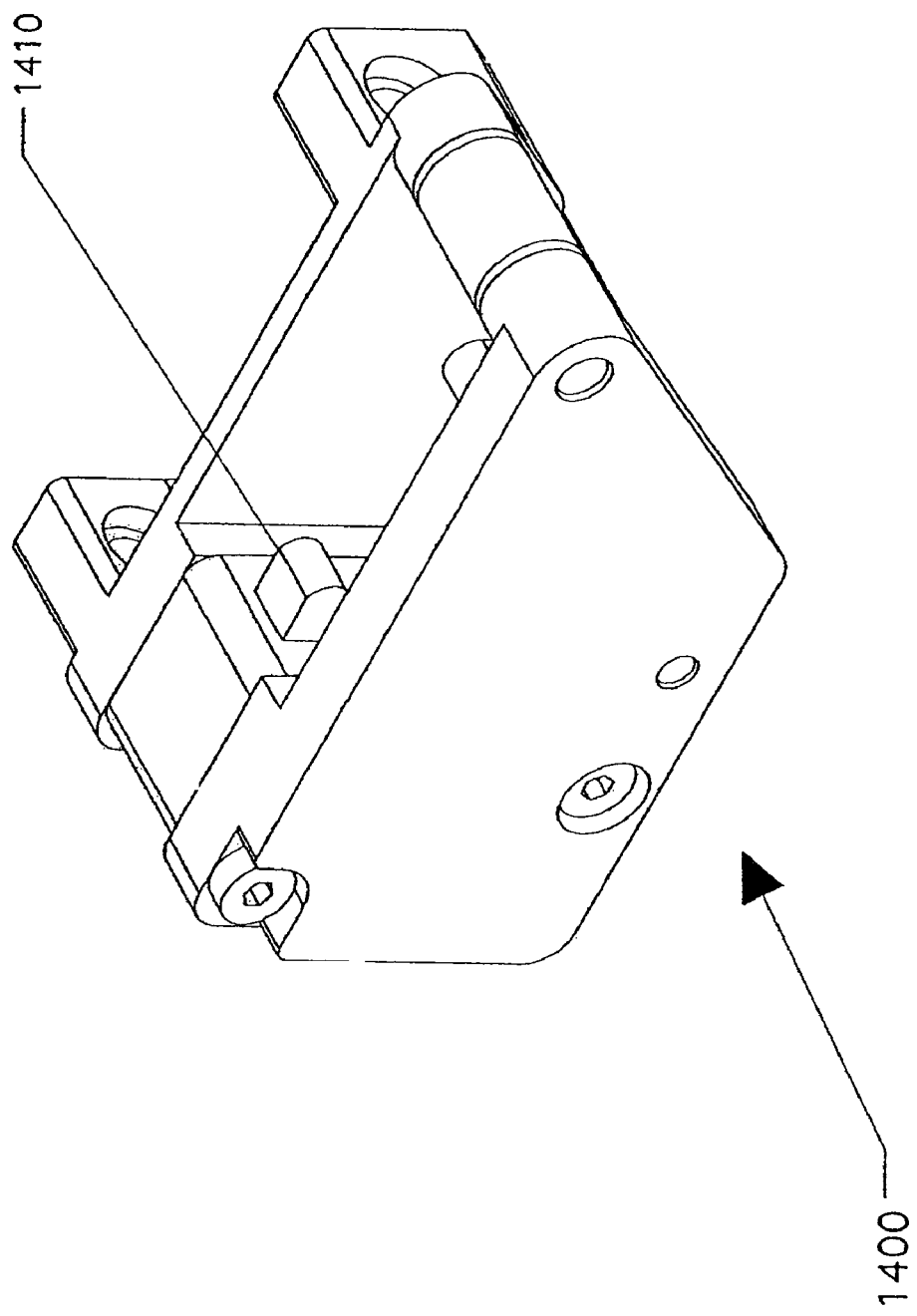
FIG. 29 is a perspective view of a pin detector with the detector tab removed in accordance with an exemplary embodiment of the present invention.

FIG. 28 is a perspective view of pin detector 1400. As shown, pin detector 1400 includes detector tab 1405. FIG. 29 shows pin detector 1400 with detector tab 1405 removed. Detector switch 1410 is visible in FIG. 29.

Figure 30:
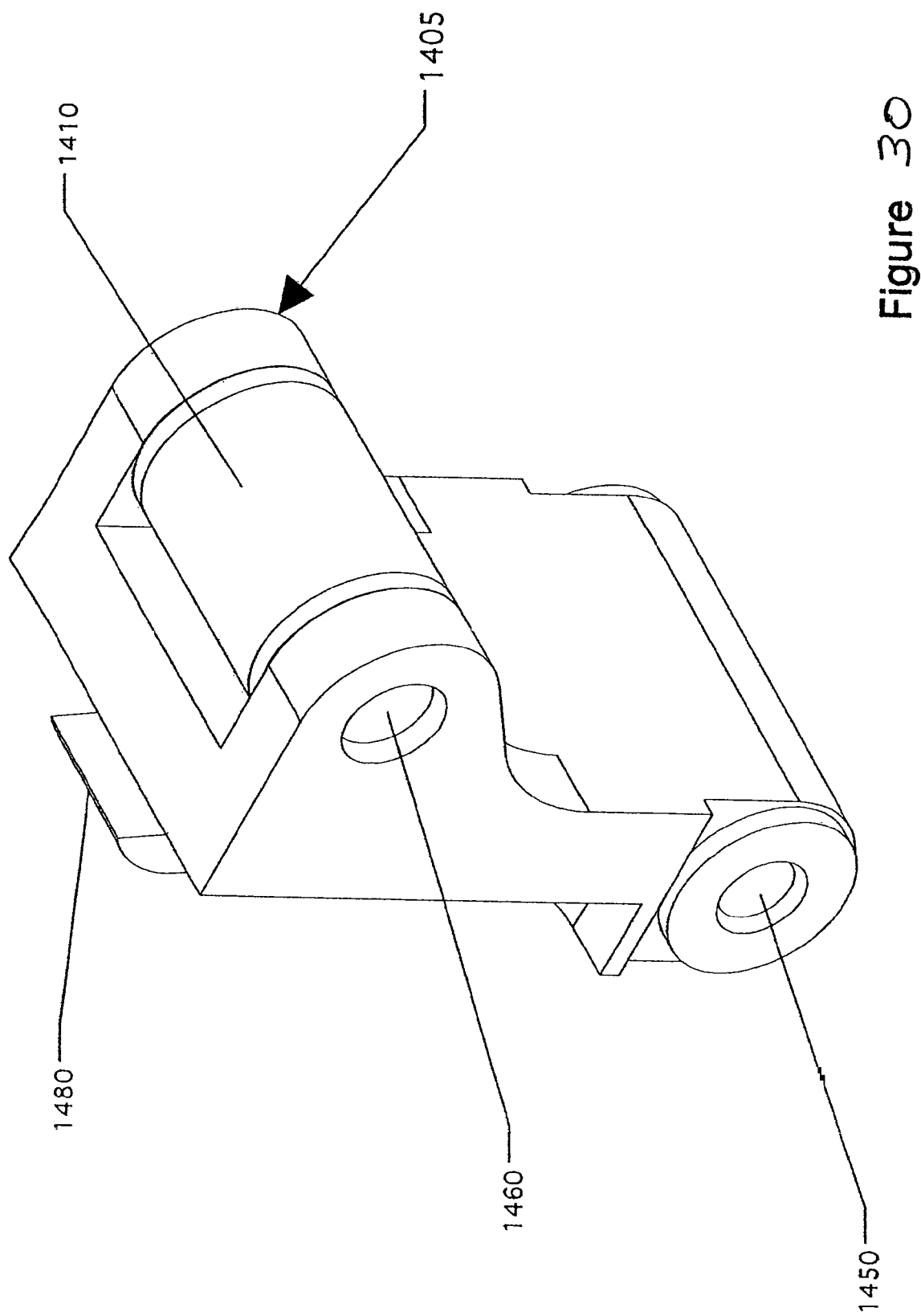
FIG. 30 is a perspective view of a detector tab in accordance with an exemplary embodiment of the present invention.

FIG. 30 is a perspective view of detector tab 1405. Detector tab 1405 includes tab opening 1450 about which detector tab 1405 is able to pivot. Detector tab 1405 includes roller mechanism 1470 which is held in place via an axel inserted through roller opening 1460. Detector tab 1405 includes rear member 1480.

Operation of pin detector 1400 is shown more clearly with reference to FIG. 103*b*. Specifically, as docking pin 1060 enters pin detector 1400, detector tab 1405 is pushed backwards as it pivots about tab opening 1450. As a result of pivoting backwards, rear member 1480 pushes against detector switch 1410. In this way, pin detector 1400 signals that docking pin 1060 has entered pin detector 1400. Detector switch 1410 may be an electrical switch in an electrically controlled system, air valve in an all pneumatic system, or, more generally a valve in any fluid based system.

Figure 31:
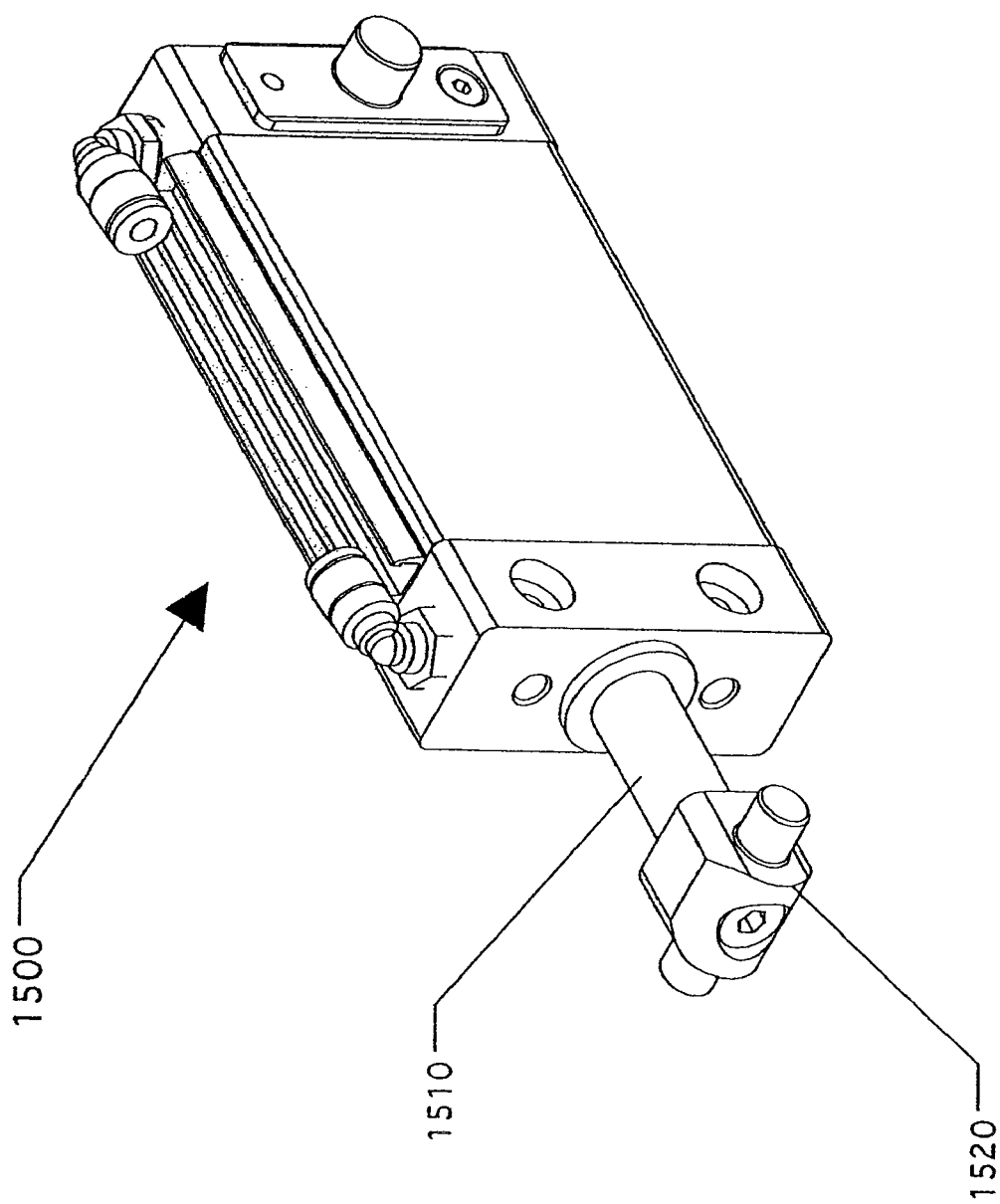
FIG. 31 is a perspective view of a piston unit in accordance with an exemplary embodiment of the present invention.

FIG. 31 is a perspective view of piston unit 1500. Piston unit 1500 includes piston 1515 (not visible), piston shaft 1510, and arm mount 1520.

Figure 32:
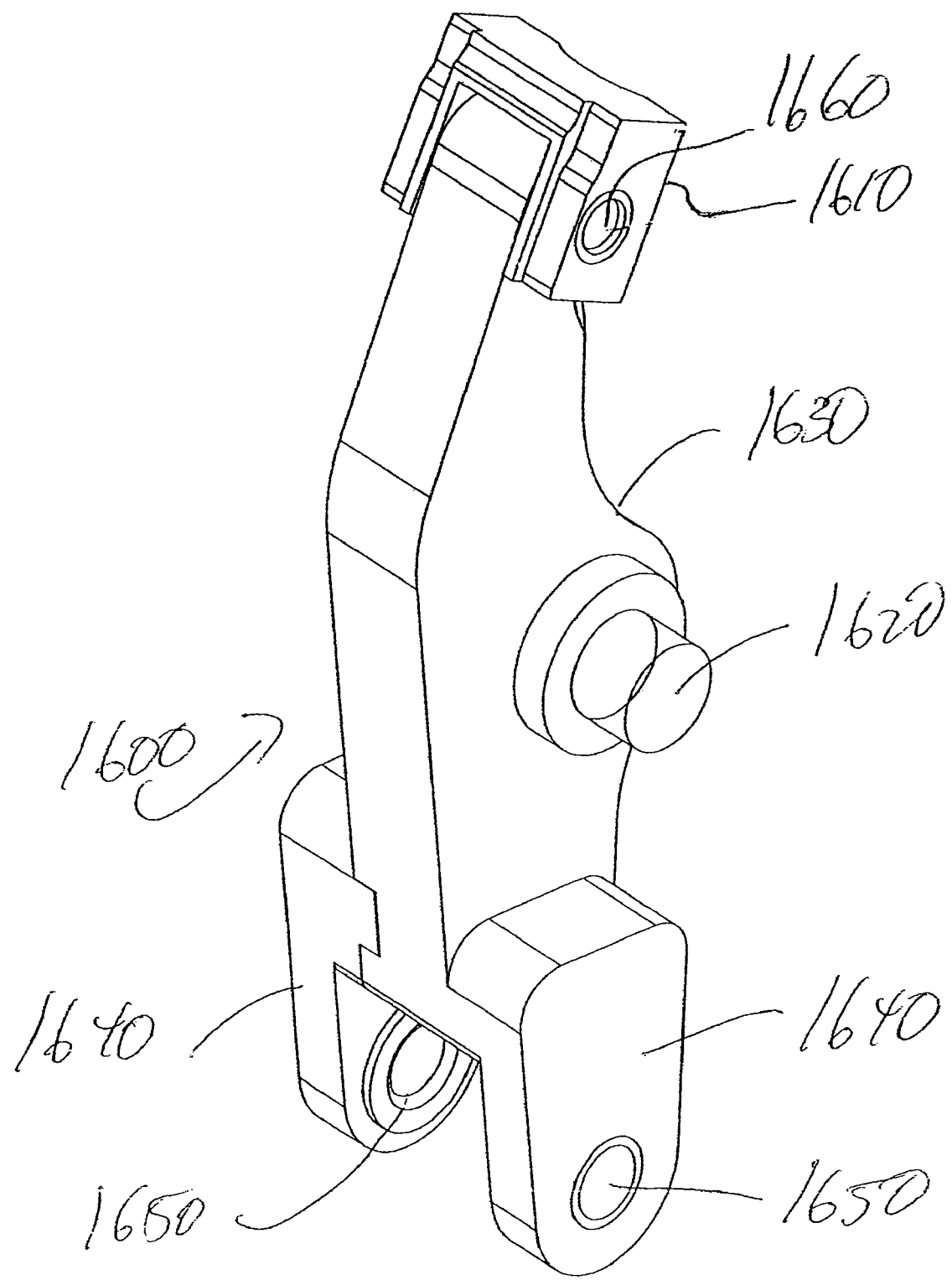
FIG. 32 is a perspective view of an arm in accordance with an exemplary embodiment of the present invention.

FIG. 32 is a perspective view of arm 1600. Arm 1600 includes arm body 1630. Arm head 1610 is attached to one end of arm body 1630 via head pivot 1660. This allows head 1610 to have pivotal movement. Extensions 1640 are attached to the opposite end of arm 1630. Extensions 1640 include extension openings 1650, respectively. Arm pivot 1620 is also included.

Figure 33:
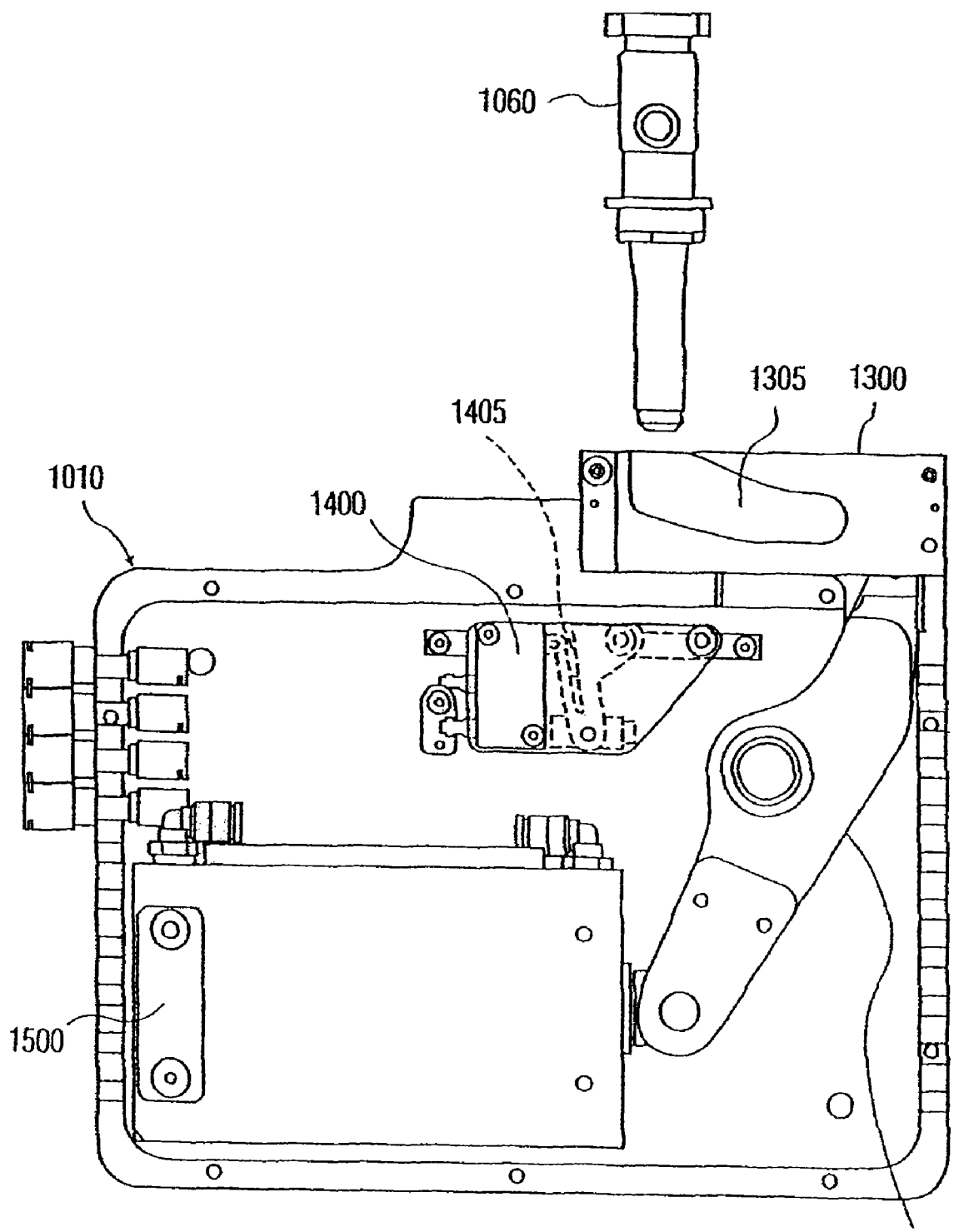
FIGS. 33 through 36 is a sequence of side views of the docking module mechanism which shows a method of docking in accordance with an exemplary embodiment of the present invention.

As shown in FIG. 33, docking pin 1060 is in position relative to docking mechanism 1010 so that docking may be accomplished. At this stage of docking, docking pin 1060 is situated above the opening to cam grooves 1305 in pin receptacle 1300, which is in its rightmost position. Also, as there is nothing that is pushing detector tab 1405 toward detector switch 1410, pin detector 1400 is indicating that pin 1060 has not been inserted. More generally, the test head has been maneuvered to a position by a positioner, such as positioner 10, such that, firstly, all docking pins 1060 are aligned as indicated by FIG. 33 with respect to their respective docking mechanisms 1010 and, secondly, the docking surface of test head 10 and the surface defined by docking plate 1050 attached to the device peripheral are approximately parallel. The test head is then said to be in a "ready-to-dock" position. The encoders incorporated in positioner 10 enable this position for a specific peripheral device to be recorded by the system controller. Thus, the system controller may automatically position the test head to a ready-to-dock position that it has previously learned.

Figure 34:
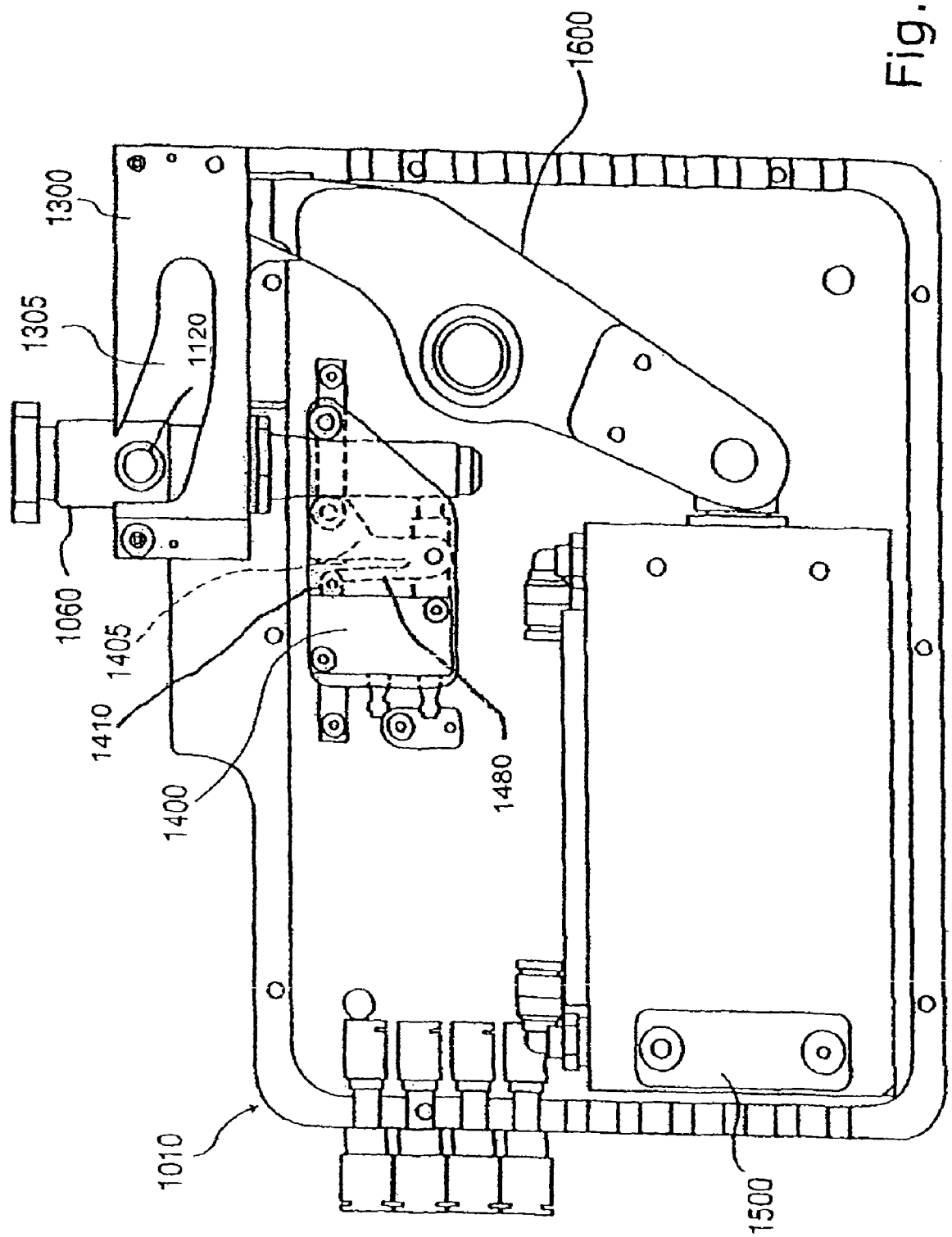

As shown in FIG. 34, docking pin 1060 has now been moved into docking mechanism 1010 to a "ready-to-actuate" position. In particular, cam followers 1120 have entered cam grooves 1305 to a position where they may be captured by the downward sloping region of cam groove 1305 should pin receptacle 1300 be slid to the left. Also, docking pin 1060 is far enough into docking mechanism 1010 so that docking pin 1060 is now pushing against detector tab 1405. The components are arranged so that when docking pin 1060 has reached this position, it will push against detector tab 1405 sufficiently to enable rear member 1480 to push against and activate switch 1410. Once switch 1410 has been thus pushed inward, docking mechanism 1010 may be actuated. More specifically, the components are arranged so that switch 1410 becomes activated when the ready-to-actuate position is achieved.

More generally, during docking, the test head is urged from a ready-to-dock position to a ready-to-actuate position where all docking pins 1060 are in the ready-to-actuate position with respect to their respective docking mechanisms 1010. Thus, when all detector switches 1410 have been activated, all docking mechanisms 1010 are simultaneously actuated. Preferably, none of the docking mechanisms 1010 are actuated until all detector switches 1410 have been activated.

In moving between the ready-to-dock and ready-to-actuate positions the test head, as is well known, is preferably moved along a straight path that is orthogonal to the plane of docking or docking frame 1050 in order to protect the delicate electrical contacts that are to be engaged. In an automated positioner system such as described herein, the system controller has the responsibility to provide such controlled motion. The system controller may record the ready-to-actuate position for the specific peripheral device from the encoders and use that information to control this action.

In an exemplary system, the ready-to-dock and ready-to-actuate positions, as well as other positions, may be input to the system controller by a teaching procedure. In the teaching procedure, the test head is put into the various positions by an operator manually operating the positioner. At each position, the system is commanded to read the encoders and record the coordinate values. A series of such "learned" positions may later be used by the system to describe a path to be followed. Thus, the system controller may automatically move the test head along a path from a service position (i.e. a position at which the test head is serviced), away from the peripheral device, to a ready-to-dock position, and then to a ready-to-actuate position.

It is important to note at the stage of the docking process, where the test head is in the ready-to-actuate position, that power to the positioner system drive motors is suspended. However, pressure to the pneumatic cylinders 440, 540 and any other powered devices included to provide compliant motion must be maintained. More specifically, as the positioner system moves the test head into various positions, the positioner system is aware of the location of the test head by virtue of a number of position encoders, which have been previously described. Thus, when the position encoders in the positioner system indicate that the ready-to-actuate position has been achieved, the various motors included with the positioner system now stop all further powered movement. Further motion of the test head will be provided by docking mechanisms 1010. If any of the manipulator motors are equipped with brakes, they are released in order to allow compliant motion of the test head. Now that the position shown in FIG. 34 has been achieved, docking mechanism 1010 is now in a "ready to actuate" mode. In this mode, instead of the positioner system continuing to push the test head toward the peripheral device, docking mechanisms 1010 will now pull the test head towards the peripheral device. In an exemplary embodiment of the present invention, docking mechanism 1010 is actuated by air pressure and may begin this pulling sequence just prior to the positioner system releasing its motors. Thus, control signals between the docking system and the positioner system are not needed to coordinate this phase of docking.

Figure 35:
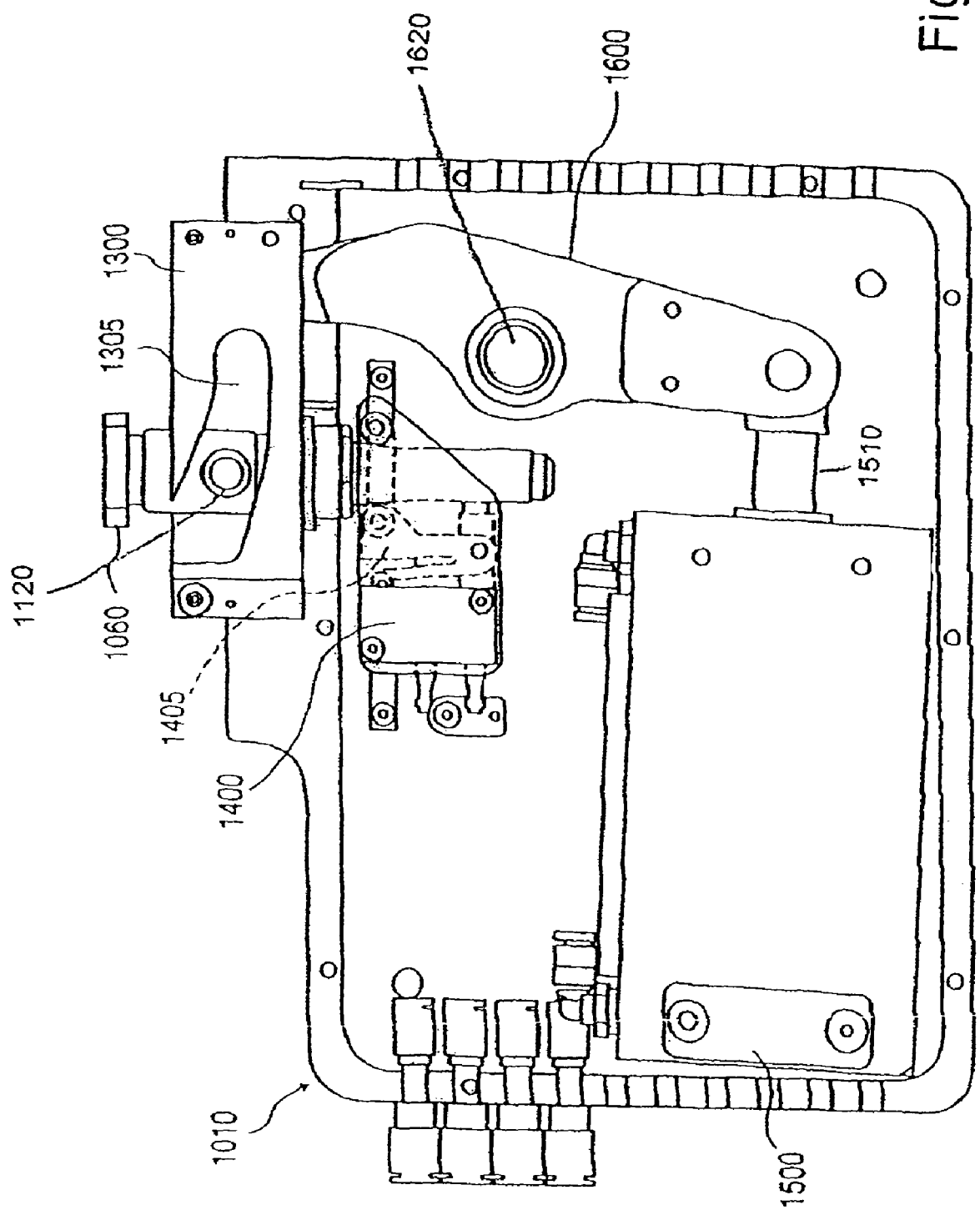

FIG. 35 illustrates docking mechanism 1010 after the actuation process has started. In other words, when docking mechanism 1010 is in the state shown in FIG. 35, docking mechanism 1010 is now in the process of pulling the test head towards the device handler. More specifically, the following events occur. As all detector switches 1410 have now been depressed, piston unit 1500 is activated, and piston shaft 1510 within piston unit 1500 now begins to extend. In an exemplary system, piston unit 1500 is pneumatic and is activated by applying air pressure. As piston shaft 1510 extends, arm 1600 now begins to rotate about arm pivot 1620. As arm 1600 rotates about arm pivot 1620, head 1610 pushes pin receptacle 1300 so that pin receptacle 1300 now begins to slide. Because arm 1600 is pivoting, head 1610 will move in an arc as it pushes pin receptacle 1300. Thus, head 1610 rotates slightly relative to arm 1600 as arm 1600 pivots. Space is provided for the vertical component of the arc motion of head 1610. In FIG. 35, it is seen that pin receptacle 1300 has slid towards the left relative to its position in FIG. 34. As pin receptacle 1300 slides, cam groove 1305 slides relative to cam follower 1120. As is noted in FIG. 35, cam groove 1305 has increasing depth from its opening to its end. Thus, as pin receptacle 1300 is moving, pin 1060 is pulled downwards as a result of the sliding motion of pin receptacle 1300.

Figure 36:
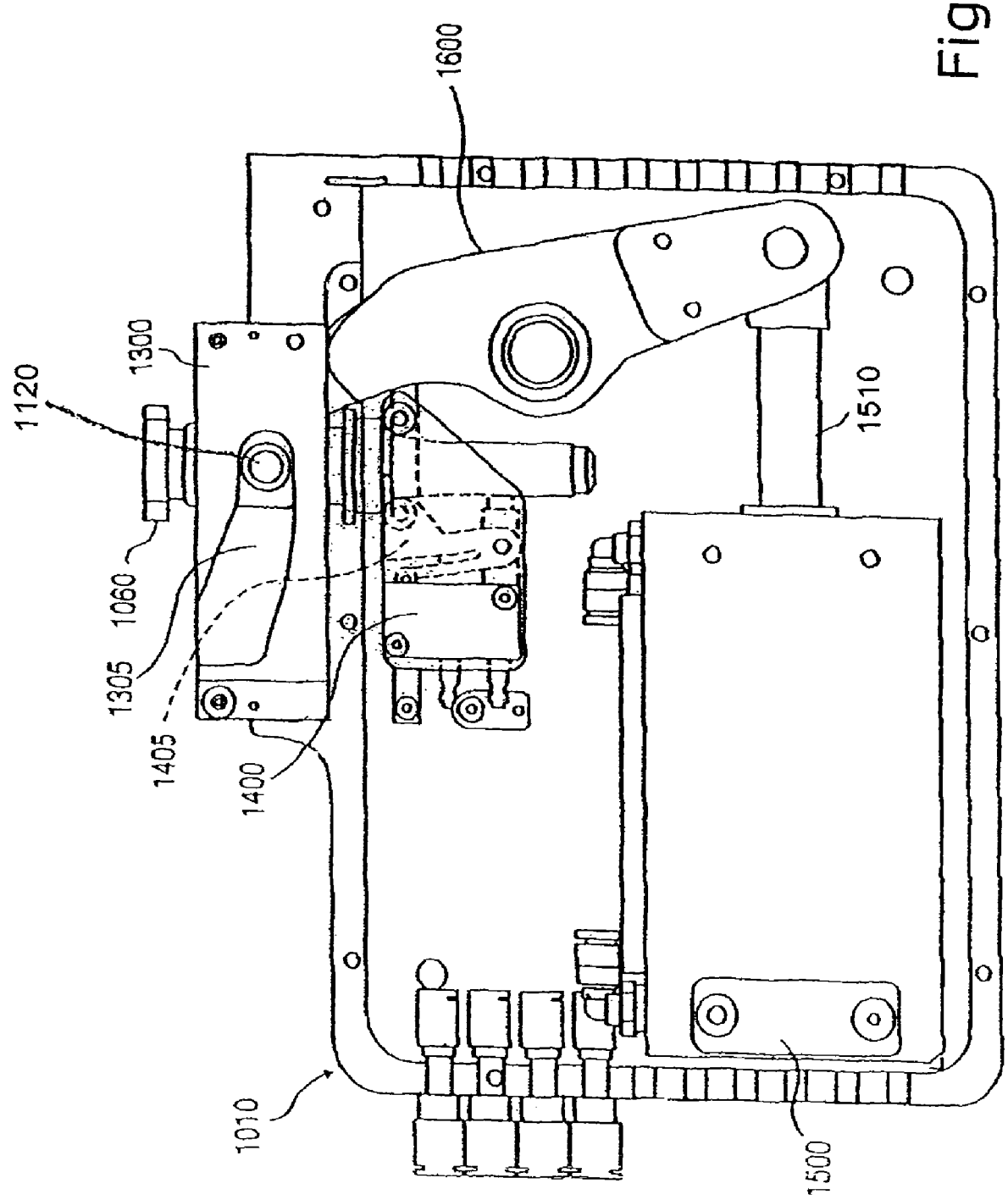

FIG. 36 illustrates docking mechanism 1010 in the fully docked position. In this position, piston shaft 1510 has extended enough, and arm 1600 has pivoted enough, so that pin 1060 has been pulled sufficiently downward so that the test head and peripheral device are now docked.

As the test head is pulled from the ready-to-actuate position to the fully docked position, relatively small motions in all six degrees of spatial freedom are made as the docking pins pull it into precise alignment with the peripheral device. Thus, the positioner system preferably allows compliant motion in its motion axes. In positioner system 10 this is provided by de-energizing and releasing brakes on all motors except the vertical drive motor 330. This action combined with the compliant effects derived from pneumatic cylinders 440 and 540 and tumble drive unit 800 provides the desired compliance. Alternatively, should these means not be sufficient, other known and previously disclosed approaches may be readily incorporated.

When it is time for the test head to be undocked relative to the device handler, piston 1510 can be signaled to retract so that arm 1600 pivots clockwise and groove member 1120 is situated at the opening of groove 1305. When this has been achieved, further separation of the test head from the device handler may be accomplished by energizing the motors within the test head positioner system.

Figure 37:
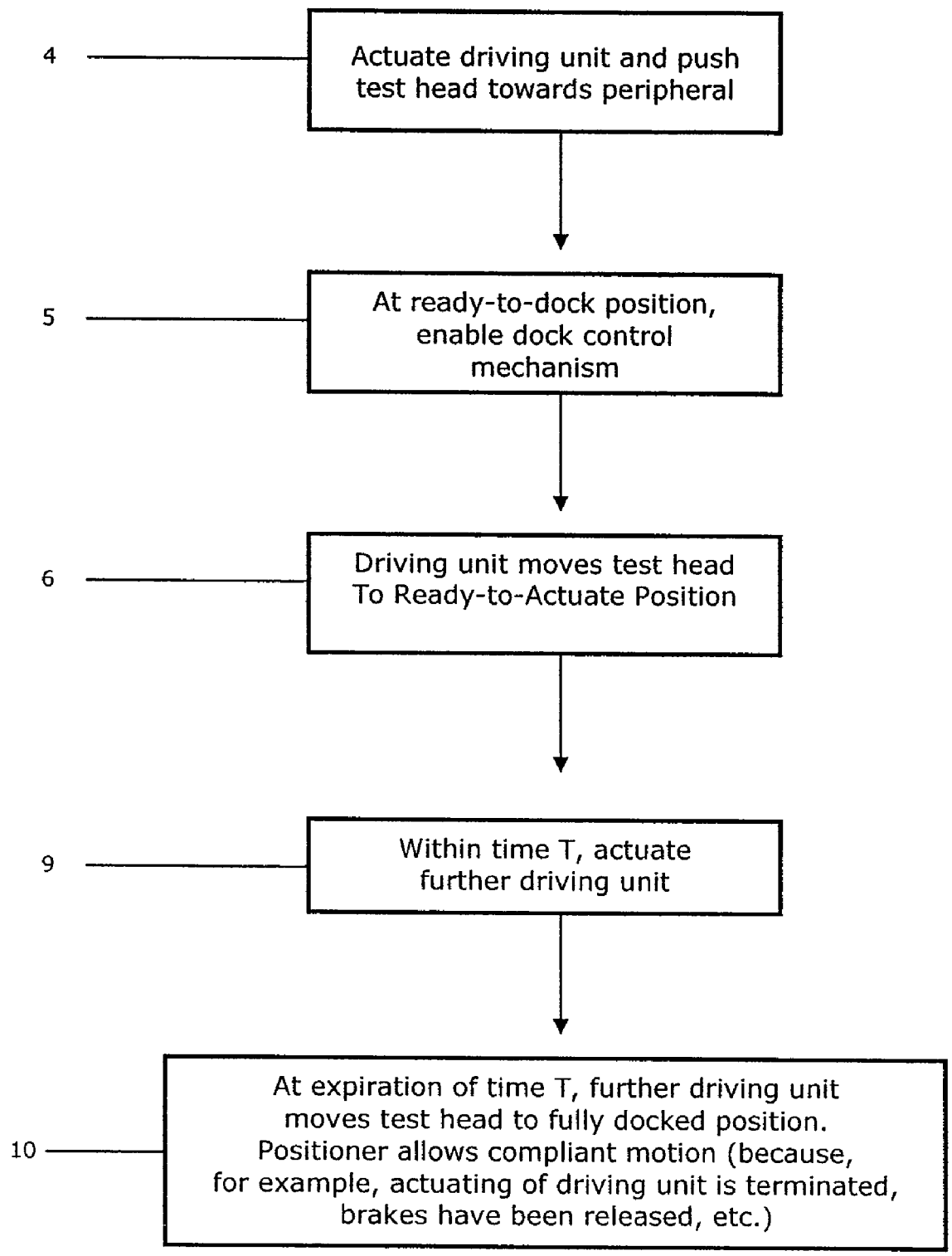
FIG. 37 is a flow chart diagram which describes exemplary steps for docking a test head with a peripheral.
Figure 38A:
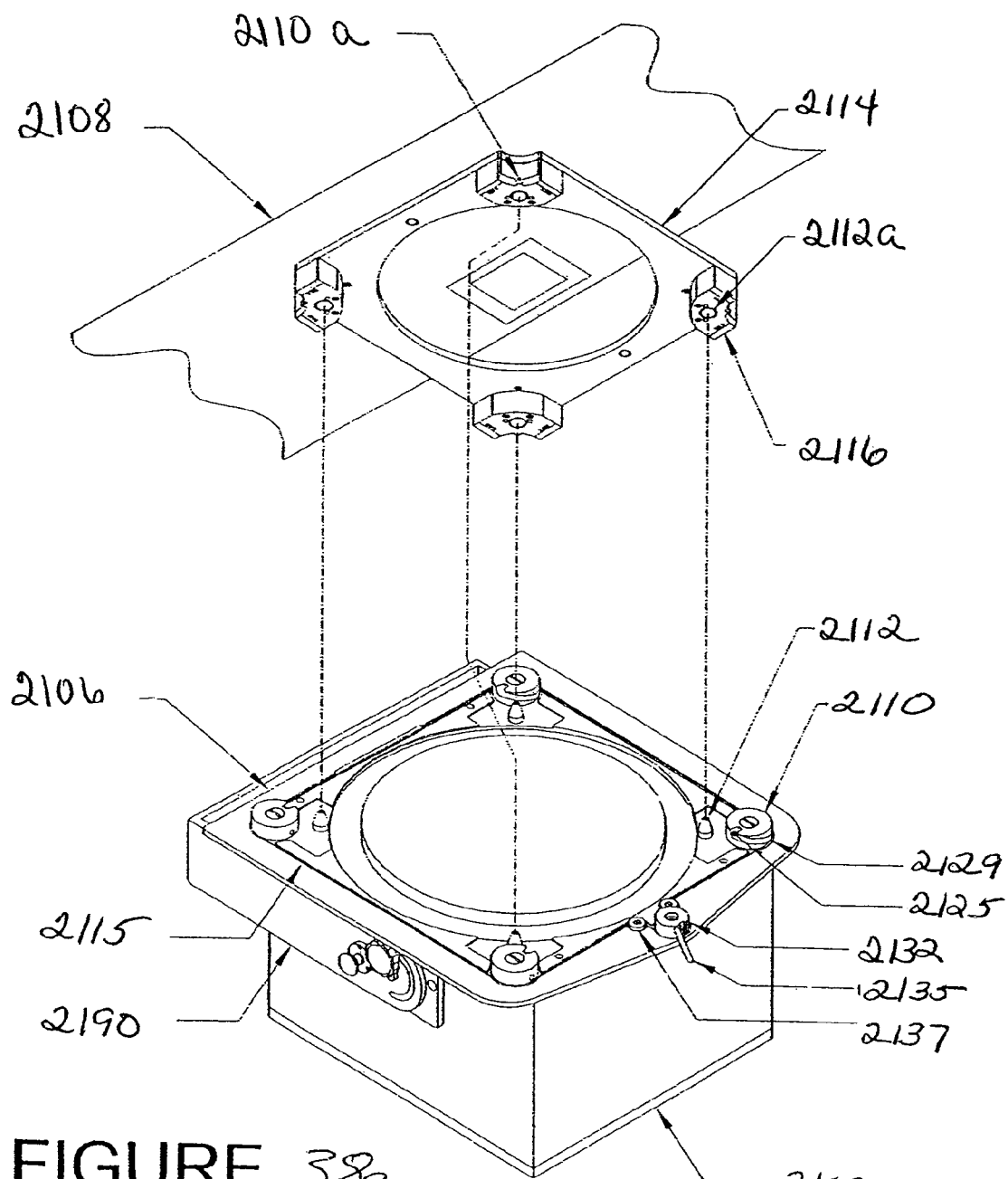
FIG. 38a is a perspective view of a prior art docking apparatus.
Figure 38B:
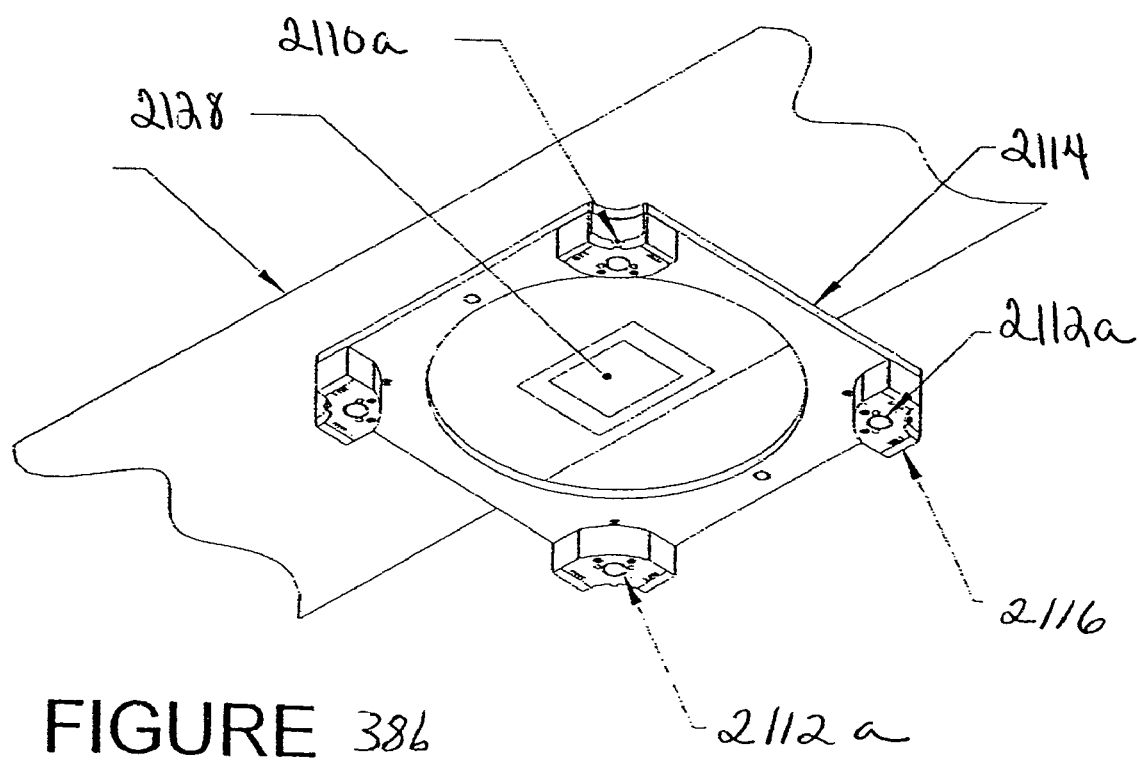
FIG. 38b is a perspective view of the portion of a prior art docking apparatus that is attached to a peripheral apparatus.
Figure 38C:
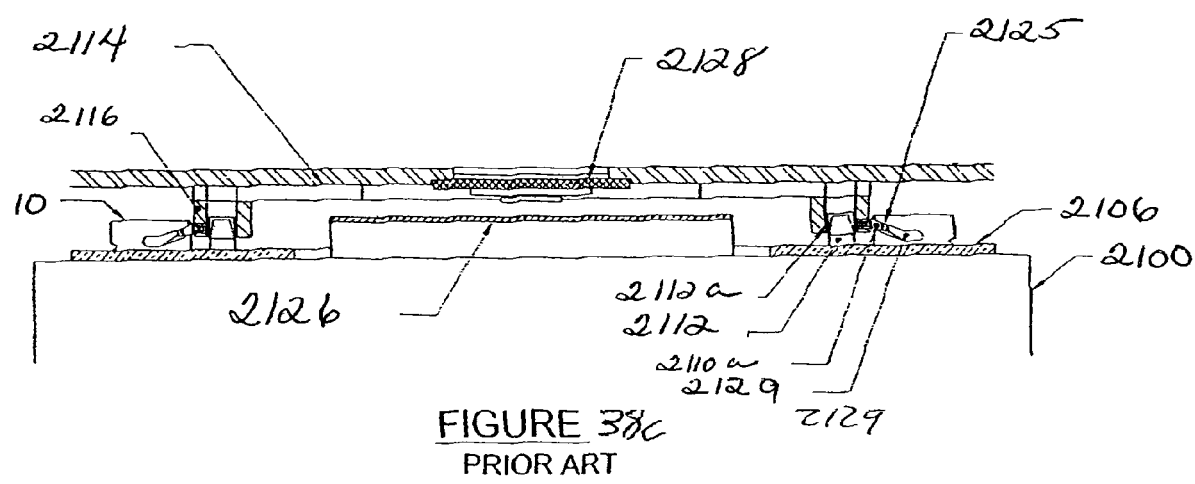
FIG. 38c is a sectional view of the prior art docking apparatus in the ready to actuate position.
Figure 38D:
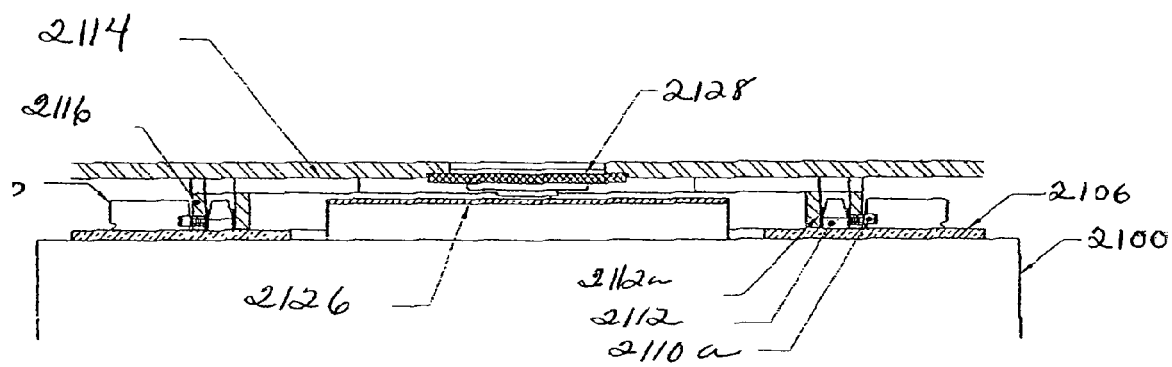
FIG. 38d is a sectional view of the prior art docking apparatus in the fully docked position.

A control system may be used to control the positioner system. This control system (hereafter, the "positioner's control system") may be a microprocessor based system to control the various components (e.g. motors, pneumatics, etc.) of the positioner system. An additional control system for docking mechanism 1010 (hereafter, the "dock's control system") may also be microprocessor based. An overall sequence of operations for docking an exemplary test head with an exemplary peripheral device is as follows:

1. An operator manually "teaches" the positioner's control system the locations of the ready-to-dock and ready-to-actuate positions for the particular peripheral device.
2. The operator also "teaches" the positioner's control system the service position and a sequence of any relevant points along the desired path between the service position and ready-to-dock position.
3. The test head is placed in the service position and prepared for testing.
4. On command the positioner's control system automatically causes the test head to be positioned to the ready-to-dock position as determined by its encoders.
5. On reaching the ready-to-dock position, the positioner's control system may provide a signal to "turn on" or enable a separate dock control mechanism, described further in steps 8 and 9 (see FIG. 37, Step 5).
6. The positioner's control system now carefully moves the test head along a straight line path orthogonal to the docking plane to the ready-to-actuate position as determined by its encoders (See FIG. 37, Step 6). Brakes for motion not related to the straight line path maybe applied.
7. After a time T, the positioner's control system de-energizes its drive motors and releases the brakes (if they were applied) on any motor so equipped, except for the vertical drive motor.
8. Within time T, the dock's control system recognizes that a test head is in the ready to actuate position by noting that all switches 1410 have been activated.
9. Following step 8 and still within time T, the dock's control system actuates all piston units (further driving unit) 1010 (see FIG. 37, Step 9).
10. When time T expires, the test head is moved under the control of the dock control system to the fully docked position while the positioner allows compliant motion in all of its axes (see FIG. 37, Step 10).
11. Now that respective electrical contacts on the test head and the peripheral are mated, testing between the test head and the peripheral may take place. At the user's preference the motor brakes may be energized to lock the positioner in place, or they may be left unlocked to allow vibrations to be absorbed.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. Apparatus for supporting a load, comprising:
    a plurality of pneumatic units;
    a plurality of couplers coupled to opposite sides of said load, said couplers moving to different locations in order to move said load parallel to a first axis responsive to actuation of said plurality of pneumatic units, at least one of said couplers rotating said load about a second axis orthogonal to said first axis by moving one of said couplers to a different location, said load compliant along said first axis and about said second axis, at least one of said pneumatic units provides compliance along said first axis and about said second axis.

2. Apparatus for supporting a load according to claim 1, further comprising a swing plate for moving said load about said first axis.

3. Apparatus for supporting a load according to claim 1, wherein when said load moves about said second axis, said one of said couplers moves in one direction while either:
    a) another of said couplers moves in an opposite direction; or
    b) said another of said couplers remains stationary.

4. Apparatus for supporting a load according to claim 1, further comprising an in-out plate, for moving said load parallel to said second axis.

5. Apparatus for supporting a load according to claim 1, further comprising a side to side plate for moving said load along a third axis orthogonal to both said first axis and said second axis.

6. Apparatus for supporting a load according to claim 1, wherein said couplers rotate said load about a third axis orthogonal to said second axis.

7. Apparatus for supporting a load according to claim 1, wherein said load is compliant about said second axis independent of whether said second axis is at a center of gravity of said load.

8. Apparatus for supporting a load according to claim 1, wherein each of said pneumatic units are individually regulated.

9. Apparatus for supporting a load according to claim 1, further comprising a plurality of actuators for moving said pneumatic units to respective first positions, said pneumatic units facilitate movement of said load to a final position.

10. Apparatus for supporting a load, comprising:
a plurality of pneumatic units;
a plurality of couplers coupling said pneumatic units to said load at opposite sides thereof, said couplers moving to different locations in order to move said load parallel to a first axis, at least one of said couplers rotating said load about a second axis orthogonal to said first axis by moving one of said couplers to a different location, said pneumatic units providing compliance in at least two degrees of freedom.

11. Apparatus for supporting a load according to claim 10, further comprising a plurality of actuators for moving said load along said first axis, at least one of said couplers moving said load about said second axis responsive to actuation of at least one of said actuators, said pneumatic units causing said load to be compliant along said first axis and about said second axis.

12. Apparatus for supporting a load according to claim 11, further comprising a swing plate for moving said load about said first axis.

13. Apparatus for supporting a load according to claim 11, wherein when said load moves about said second axis, said one of said couplers moves in one direction while either:
a) another of said couplers moves in an opposite direction; or
b) another of said couplers remains stationary.

14. Apparatus for supporting a load according to claim 11, further comprising an in-out plate, for moving said load parallel to said second axis.

15. Apparatus for supporting a load according to claim 11, further comprising a side to side plate for moving said load along a third axis orthogonal to said second axis.

16. Apparatus for supporting a load according to claim 11, wherein said couplers rotate said load about a third axis orthogonal to said first and second axis.

17. Apparatus for supporting a load, comprising:
a plurality of couplers coupled to said load at opposite sides thereof, at least one of said couplers power driven for rotating said load about a rotation axis, said at least one couplers including an attachment unit having a flexible element for providing compliance about said rotation axis, said couplers moving to different locations in order to move said load parallel to a first axis, at least one of said couplers rotating said load about a second axis orthogonal to said first axis by moving one of said couplers to a different location.

18. Apparatus for supporting a load according to claim 17, wherein said couplers move said load along said first axis orthogonal to said rotation axis and about said second axis orthogonal to both said first axis and said rotation axis.

19. Apparatus for supporting a load according to claim 18, wherein said load is compliant along said first axis and about said second axis.

20. Apparatus for supporting a load according to claim 18, wherein when said load moves about said second axis, said one of said couplers moves in one direction while either:
a) another of said couplers moves in an opposite direction; or
b) another of said couplers remains stationary.

21. Apparatus for supporting a load according to claim 18, further comprising an in-out plate, for moving said load along said second axis.

22. Apparatus for supporting a load according to claim 18, further comprising a side to side plate for moving said load along said rotating axis which is orthogonal to said second axis.

23. Apparatus for supporting a load according to claim 17, wherein said flexible element comprises rubber.

24. Apparatus for supporting a load according to claim 17, wherein said flexible element is coupled to a power driven gear.

25. Apparatus for supporting a load according to claim 17, wherein said one of said coupler is power driven from a source selected from the group consisting of electricity and pneumatic.

26. A method of supporting a load, comprising:
actuating a plurality of spaced apart actuators so that couplers move to different locations in order to move said load parallel to a first axis,
rotating said load about a second axis orthogonal to said first axis by actuating one of said actuators in order to move one of said couplers to a different location,
providing compliant freedom along said first axis; and
providing compliant freedom about said second axis orthogonal to the first axis.

27. A method of supporting a load according to claim 26, wherein when said load moves about said second axis, one of said actuators moves in one direction while either:
a) another one of said actuators moves in an opposite direction, or
b) said another one of said actuators remains stationary.

28. A method of supporting a load according to claim 26, further comprising the step of moving said load parallel to said second axis.

29. A method of supporting a load according to claim 26, further comprising the step of moving said load along a third axis orthogonal to both said first axis and said second axis.

30. A method of supporting a load according to claim 26, further comprising the step of rotating said load about a third axis orthogonal to said second axis.

31. A method of supporting a load according to claim 26, further comprising the step of regulating at least one pneumatic unit to provide compliant freedom.

32. A method of supporting a load according to claim 31 wherein said one pneumatic unit is one of a plurality of pneumatic units that are individually regulated to provide said compliant freedom.

33. A method of supporting a load according to claim 31, wherein said actuators move said at least one pneumatic unit to a first position, and said pneumatic unit facilitates movement of said load to a final position.

* * * * *